(12) United States Patent
Valcore, Jr.

(10) Patent No.: US 10,950,421 B2
(45) Date of Patent: Mar. 16, 2021

(54) USING MODELING FOR IDENTIFYING A LOCATION OF A FAULT IN AN RF TRANSMISSION SYSTEM FOR A PLASMA SYSTEM

(71) Applicant: Lam Research Corporation, Fremont, CA (US)

(72) Inventor: John C. Valcore, Jr., Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 904 days.

(21) Appl. No.: 14/257,926

(22) Filed: Apr. 21, 2014

(65) Prior Publication Data

US 2015/0301100 A1 Oct. 22, 2015

(51) Int. Cl.
 *H01J 37/32* (2006.01)

(52) U.S. Cl.
 CPC .. *H01J 37/32926* (2013.01); *H01J 37/32174* (2013.01); *H01J 37/32183* (2013.01)

(58) Field of Classification Search
 None
 See application file for complete search history.

(56) References Cited

U.S. PATENT DOCUMENTS

| | | | |
|---|---|---|---|
| 4,314,879 A | 2/1982 | Hartman et al. | |
| 4,353,777 A | 10/1982 | Jacob | |
| 4,377,961 A | 3/1983 | Bode | |
| 4,420,790 A | 12/1983 | Golke et al. | |
| 4,454,001 A | 6/1984 | Sternheim et al. | |
| 4,457,820 A | 7/1984 | Bergeron et al. | |
| 4,500,563 A | 2/1985 | Ellenberger et al. | |
| 4,504,799 A | 3/1985 | Elnais et al. | |
| 4,852,093 A * | 7/1989 | Koeppe | G06F 11/261 |
| | | | 714/33 |
| 4,855,897 A | 8/1989 | Shinskey | |
| 5,053,725 A | 10/1991 | Gesche et al. | |
| 5,084,239 A | 1/1992 | Moulton et al. | |
| 5,202,623 A | 4/1993 | LePage | |
| 5,244,629 A | 9/1993 | Caputo et al. | |

(Continued)

FOREIGN PATENT DOCUMENTS

| | | | | |
|---|---|---|---|---|
| CA | 2550072 C | * | 4/2011 | ............ H01M 10/48 |
| CN | 101110347 A | | 1/2008 | |

(Continued)

OTHER PUBLICATIONS

Machine Translation for CN104051214 (Year: 2014).*

(Continued)

*Primary Examiner* — Alexander Satanovsky
*Assistant Examiner* — Leonard S Liang
(74) *Attorney, Agent, or Firm* — Penilla IP, APC

(57) ABSTRACT

Systems and methods for identifying a location of a fault in an RF transmission system includes characterizing the RF transmission system and selecting one of the stage in the RF transmission system as an initial selected stage. An output of the initial selected stage can be measured in the characterized RF transmission system. The measured output of the initial selected stage is propagated through a baseline RF model and a point of deflection is identified in a resulting RF model of the RF transmission system.

21 Claims, 38 Drawing Sheets

(56) References Cited

U.S. PATENT DOCUMENTS

| | | | |
|---|---|---|---|
| 5,303,139 A | 4/1994 | Mark | |
| 5,474,648 A | 12/1995 | Patrick et al. | |
| 5,479,340 A | 12/1995 | Fox et al. | |
| 5,556,549 A | 9/1996 | Patrick et al. | |
| 5,571,366 A | 11/1996 | Ishii et al. | |
| 5,580,420 A * | 12/1996 | Watanabe | H01J 37/32192 156/345.41 |
| 5,643,364 A * | 7/1997 | Zhao | H01J 37/32082 118/723 E |
| 5,645,796 A | 7/1997 | Caputo et al. | |
| 5,654,043 A | 8/1997 | Shao et al. | |
| 5,689,215 A | 11/1997 | Richardson et al. | |
| 5,694,207 A | 12/1997 | Hung et al. | |
| 5,737,177 A | 4/1998 | Mett et al. | |
| 5,759,424 A * | 6/1998 | Imatake | H01J 37/3299 216/60 |
| 5,764,471 A | 6/1998 | Burkhart | |
| 5,788,801 A | 8/1998 | Barbee et al. | |
| 5,810,963 A | 9/1998 | Tomioka | |
| 5,812,361 A | 9/1998 | Jones et al. | |
| 5,866,985 A | 2/1999 | Coultas et al. | |
| 5,889,252 A | 3/1999 | Williams et al. | |
| 5,892,198 A | 4/1999 | Barnes et al. | |
| 5,894,400 A | 4/1999 | Graven et al. | |
| 5,917,286 A | 6/1999 | Scholl et al. | |
| 5,980,767 A | 11/1999 | Koshimizu et al. | |
| 5,989,999 A | 11/1999 | Levine et al. | |
| 6,020,794 A | 2/2000 | Wilbur | |
| 6,021,672 A | 2/2000 | Lee | |
| 6,042,686 A | 3/2000 | Dible et al. | |
| 6,048,435 A | 4/2000 | DeOrnellas et al. | |
| 6,110,214 A | 8/2000 | Klimasauskas | |
| 6,157,867 A | 12/2000 | Hwang et al. | |
| 6,197,116 B1 * | 3/2001 | Kosugi | C23C 16/50 118/712 |
| 6,198,616 B1 | 3/2001 | Dahimene et al. | |
| 6,222,321 B1 | 4/2001 | Scholl et al. | |
| 6,246,972 B1 | 6/2001 | Klimasauskas | |
| 6,287,980 B1 | 9/2001 | Hanazaki et al. | |
| 6,351,683 B1 | 2/2002 | Johnson et al. | |
| 6,383,635 B1 | 5/2002 | King et al. | |
| 6,431,112 B1 | 8/2002 | Sill et al. | |
| 6,441,555 B1 | 8/2002 | Howald et al. | |
| 6,441,620 B1 * | 8/2002 | Scanlan | H01J 37/32174 315/111.21 |
| 6,472,822 B1 | 10/2002 | Chen et al. | |
| 6,522,121 B2 | 2/2003 | Coumou | |
| 6,535,785 B2 | 3/2003 | Johnson et al. | |
| 6,597,002 B1 | 7/2003 | Kondo | |
| 6,669,783 B2 | 12/2003 | Sexton et al. | |
| 6,677,246 B2 | 1/2004 | Scanlan et al. | |
| 6,750,711 B2 | 6/2004 | Chawla et al. | |
| 6,781,317 B1 | 8/2004 | Goodman | |
| 6,823,815 B2 | 11/2004 | Han et al. | |
| 6,862,557 B2 | 3/2005 | Jones et al. | |
| 6,873,114 B2 * | 3/2005 | Avoyan | H01J 37/32935 118/50.1 |
| 6,929,712 B2 * | 8/2005 | Hanazaki | H01J 37/32082 118/712 |
| 6,952,657 B2 * | 10/2005 | Jahns | G05B 23/0254 702/182 |
| 6,972,524 B1 | 12/2005 | Marakhtanov et al. | |
| 6,983,215 B2 | 1/2006 | Coumou et al. | |
| 7,042,311 B1 | 5/2006 | Hilliker et al. | |
| 7,122,965 B2 | 10/2006 | Goodman | |
| 7,169,625 B2 * | 1/2007 | Davis | G01N 21/73 257/E21.528 |
| 7,323,116 B2 | 1/2008 | Guiney et al. | |
| 7,359,177 B2 | 4/2008 | Yang et al. | |
| 7,361,287 B2 | 4/2008 | Laermer | |
| 7,366,622 B1 * | 4/2008 | Nemir | G01R 31/1272 361/2 |
| 7,375,038 B2 | 5/2008 | Kumar | |
| 7,435,926 B2 | 10/2008 | Jafarian-Tehrani | 219/121.59 |
| 7,459,100 B2 | 12/2008 | Kiemasz et al. | |
| 7,480,571 B2 | 1/2009 | Howald et al. | |
| 7,505,879 B2 | 3/2009 | Tomoyasu et al. | |
| 7,586,100 B2 | 9/2009 | Raj et al. | |
| 7,589,473 B2 | 9/2009 | Suslov | |
| 7,718,538 B2 | 5/2010 | Kim et al. | |
| 7,728,602 B2 | 6/2010 | Valcore et al. | |
| 7,737,042 B2 | 6/2010 | Kim et al. | |
| 7,764,140 B2 | 7/2010 | Nagarkatti et al. | |
| 7,768,269 B2 | 8/2010 | Piptone et al. | |
| 7,771,606 B2 | 8/2010 | Kim et al. | |
| 7,829,468 B2 * | 11/2010 | Keil | C23C 16/509 216/59 |
| 7,844,559 B2 | 11/2010 | Lam et al. | 706/45 |
| 7,858,898 B2 | 12/2010 | Bailey, III et al. | |
| 7,967,944 B2 | 6/2011 | Shannon et al. | |
| 8,030,849 B2 | 10/2011 | Suslov | |
| 8,040,068 B2 | 10/2011 | Coumou et al. | |
| 8,053,991 B2 | 11/2011 | Kim et al. | |
| 8,080,168 B2 | 12/2011 | Cirigliano | |
| 8,080,760 B2 | 12/2011 | Dhindsa et al. | |
| 8,103,492 B2 | 1/2012 | Brcka | |
| 8,264,238 B1 | 9/2012 | El-Chouelry | |
| 8,271,121 B2 | 9/2012 | Venugopal et al. | |
| 8,293,023 B2 * | 10/2012 | Valcore | H01L 21/67051 134/18 |
| 8,297,540 B1 | 10/2012 | Vijay | |
| 8,368,308 B2 * | 2/2013 | Banna | H01J 37/321 315/111.71 |
| 8,404,598 B2 | 3/2013 | Liao et al. | |
| 8,471,484 B2 | 6/2013 | Watanabe et al. | |
| 8,501,631 B2 | 8/2013 | Valcore et al. | |
| 8,609,546 B2 | 12/2013 | Lee et al. | |
| 8,679,358 B2 | 3/2014 | Nakagawa | |
| 8,791,714 B2 * | 7/2014 | Hansen | G05B 23/0229 324/555 |
| 8,797,705 B2 * | 8/2014 | Valcore, Jr. | H01L 21/6831 361/234 |
| 8,808,561 B2 | 8/2014 | Kanarik | |
| 8,872,429 B2 | 10/2014 | Rosener | |
| 8,883,028 B2 | 11/2014 | Kanarik | |
| 8,901,004 B2 | 12/2014 | Kamp et al. | |
| 8,901,935 B2 | 12/2014 | Valcore et al. | |
| 8,906,196 B2 | 12/2014 | Nishio | |
| 9,076,646 B2 | 7/2015 | Sims et al. | |
| 9,508,529 B2 * | 11/2016 | Valcore, Jr. | H01J 37/32926 |
| 9,620,337 B2 * | 4/2017 | Valcore, Jr. | H01J 37/3299 |
| 9,685,297 B2 * | 6/2017 | Carter | H01J 37/32944 |
| 9,842,725 B2 * | 12/2017 | Valcore, Jr. | H01J 37/32926 |
| 10,008,371 B2 * | 6/2018 | Valcore, Jr. | G06F 30/367 |
| 10,276,350 B2 * | 4/2019 | Howald | G06F 30/36 |
| 2002/0038631 A1 * | 4/2002 | Sumiya | C23C 16/507 118/723 E |
| 2002/0096257 A1 | 7/2002 | Wang et al. | |
| 2002/0132380 A1 * | 9/2002 | Nakano | C23C 16/505 438/14 |
| 2002/0157608 A1 * | 10/2002 | Nakano | C23C 16/52 118/723 MW |
| 2003/0082835 A1 | 5/2003 | McChesney et al. | |
| 2003/0103793 A1 | 6/2003 | Murakoshi et al. | |
| 2003/0119308 A1 | 6/2003 | Geefay et al. | |
| 2003/0151372 A1 * | 8/2003 | Tsuchiya | C23C 16/505 315/111.81 |
| 2003/0153989 A1 * | 8/2003 | Scanlan | G05B 23/0281 700/32 |
| 2003/0173028 A1 * | 9/2003 | Ikuhara | G01N 21/71 156/345.24 |
| 2003/0215373 A1 * | 11/2003 | Reyzelman | H01J 37/32082 422/186.29 |
| 2004/0004708 A1 * | 1/2004 | Willis | H01J 37/32082 356/72 |
| 2004/0028837 A1 | 2/2004 | Fink | |
| 2004/0045506 A1 | 3/2004 | Chen et al. | |
| 2004/0055868 A1 * | 3/2004 | O'Leary | H01J 37/32935 204/157.15 |
| 2004/0060660 A1 | 4/2004 | Klimechy et al. | |
| 2004/0061448 A1 | 4/2004 | Avoyan et al. | |
| 2004/0087047 A1 | 5/2004 | Jaiswal et al. | |

(56) References Cited

U.S. PATENT DOCUMENTS

| | | | |
|---|---|---|---|
| 2004/0107906 A1 | 6/2004 | Collins et al. | |
| 2004/0124077 A1 | 7/2004 | Christie | |
| 2004/0135590 A1 | 7/2004 | Quon | |
| 2004/0154540 A1 | 8/2004 | Hayami et al. | |
| 2004/0222184 A1* | 11/2004 | Hayami | H01J 37/32082 216/16 |
| 2004/0226657 A1 | 11/2004 | Hoffman | |
| 2004/0259276 A1* | 12/2004 | Yue | H01J 37/32935 438/5 |
| 2005/0034811 A1 | 2/2005 | Mahoney et al. | |
| 2005/0039682 A1 | 2/2005 | Dhindsa et al. | |
| 2005/0057165 A1 | 3/2005 | Goodman | |
| 2005/0067102 A1* | 3/2005 | Baldwin | H01J 37/32935 156/345.24 |
| 2005/0067386 A1* | 3/2005 | Mitrovic | H01J 37/32082 219/121.43 |
| 2005/0069651 A1* | 3/2005 | Miyoshi | H01J 37/321 427/452 |
| 2005/0090118 A1 | 4/2005 | Shannon et al. | |
| 2005/0133163 A1* | 6/2005 | Shannon | H01J 37/32183 156/345.44 |
| 2005/0134186 A1 | 6/2005 | Brouk et al. | |
| 2005/0151479 A1* | 7/2005 | Avoyan | H01J 37/32935 315/111.71 |
| 2005/0205208 A1 | 9/2005 | Sagae et al. | |
| 2005/0205532 A1 | 9/2005 | Patrick et al. | |
| 2005/0212450 A1* | 9/2005 | Martinez | H01J 37/32935 315/169.4 |
| 2005/0217797 A1* | 10/2005 | Jafarian-Tehrani | H01J 37/32082 156/345.28 |
| 2005/0234574 A1* | 10/2005 | Lam | G05B 19/41865 700/96 |
| 2005/0241762 A1 | 11/2005 | Paterson et al. | |
| 2005/0252884 A1* | 11/2005 | Lam | G05B 23/0254 216/59 |
| 2005/0283321 A1* | 12/2005 | Yue | H01J 37/32935 702/30 |
| 2006/0005928 A1 | 1/2006 | Howald et al. | |
| 2006/0054596 A1 | 3/2006 | Howard | |
| 2006/0065623 A1 | 3/2006 | Guiney et al. | |
| 2006/0065631 A1* | 3/2006 | Cheng | H01J 37/32082 216/86 |
| 2006/0065632 A1 | 3/2006 | Cheng et al. | |
| 2006/0066248 A1 | 3/2006 | Chistyakov | |
| 2006/0081558 A1 | 4/2006 | Collins et al. | |
| 2006/0081564 A1 | 4/2006 | Moroz et al. | |
| 2006/0088655 A1* | 4/2006 | Collins | C23C 14/48 427/8 |
| 2006/0100824 A1 | 5/2006 | Moriya | |
| 2006/0169582 A1 | 8/2006 | Brown et al. | |
| 2006/0180570 A1* | 8/2006 | Mahoney | H01J 37/32935 216/59 |
| 2006/0231526 A1 | 10/2006 | Donohue | |
| 2006/0232471 A1* | 10/2006 | Coumou | H01J 37/32082 342/450 |
| 2006/0267504 A1 | 11/2006 | VanDrie et al. | |
| 2006/0278608 A1 | 12/2006 | Hoffman | |
| 2007/0000843 A1* | 1/2007 | Kimball | H01J 37/32431 210/745 |
| 2007/0021935 A1 | 1/2007 | Larson et al. | |
| 2007/0065594 A1 | 3/2007 | Chiang et al. | |
| 2007/0095788 A1 | 5/2007 | Hoffman et al. | |
| 2007/0127188 A1 | 6/2007 | Yang et al. | |
| 2007/0210248 A1* | 9/2007 | Koo | H01J 37/32935 250/287 |
| 2007/0247074 A1 | 10/2007 | Paterson et al. | |
| 2007/0252580 A1 | 11/2007 | Dine et al. | |
| 2007/0262723 A1 | 11/2007 | Ikenouchi | |
| 2007/0284246 A1* | 12/2007 | Keil | C23C 16/509 204/298.36 |
| 2008/0029385 A1 | 2/2008 | Koshimizu et al. | |
| 2008/0050537 A1 | 2/2008 | Godyak | |
| 2008/0074255 A1 | 3/2008 | Park et al. | |
| 2008/0237031 A1* | 10/2008 | Sato | H01J 37/32082 204/164 |
| 2008/0241016 A1 | 10/2008 | Kato et al. | |
| 2009/0099991 A1 | 4/2009 | Lam et al. | 706/46 |
| 2009/0105980 A1 | 4/2009 | Tetsuka et al. | |
| 2009/0151871 A1* | 6/2009 | Pease | C23F 4/00 156/345.28 |
| 2009/0210181 A1* | 8/2009 | Swank | G01R 21/133 702/66 |
| 2009/0255800 A1 | 10/2009 | Koshimizu | |
| 2009/0284156 A1 | 11/2009 | Banna et al. | |
| 2009/0294061 A1* | 12/2009 | Shannon | H01J 37/32091 156/345.24 |
| 2009/0294414 A1 | 12/2009 | Shannon et al. | |
| 2009/0295296 A1* | 12/2009 | Shannon | H01J 37/32082 315/111.21 |
| 2009/0308734 A1* | 12/2009 | Krauss | H01J 37/32935 204/192.13 |
| 2010/0007359 A1* | 1/2010 | Booth | H01J 37/32935 324/658 |
| 2010/0033195 A1* | 2/2010 | Booth | H01J 37/32935 324/663 |
| 2010/0039747 A1 | 2/2010 | Sansoni et al. | |
| 2010/0099266 A1 | 4/2010 | Oswald et al. | |
| 2010/0136793 A1 | 6/2010 | Chen et al. | |
| 2010/0248488 A1 | 9/2010 | Agarwal et al. | |
| 2010/0258246 A1 | 10/2010 | Iwakoshi et al. | |
| 2010/0270141 A1 | 10/2010 | Carter et al. | |
| 2010/0283482 A1* | 11/2010 | Valcore | G01N 29/075 324/620 |
| 2010/0314048 A1 | 12/2010 | Long et al. | |
| 2010/0332201 A1 | 12/2010 | Albarede et al. | |
| 2011/0031216 A1 | 2/2011 | Liao et al. | |
| 2011/0060442 A1* | 3/2011 | Valcore, Jr. | H01L 21/67253 700/103 |
| 2011/0062014 A1 | 3/2011 | Gutsol et al. | |
| 2011/0097901 A1 | 4/2011 | Banna et al. | |
| 2011/0115492 A1 | 5/2011 | Valcore, Jr. et al. | |
| 2011/0118863 A1 | 5/2011 | Valcore, Jr. | |
| 2011/0137446 A1 | 6/2011 | Valcore, Jr. et al. | |
| 2011/0139748 A1 | 6/2011 | Donnelly et al. | |
| 2012/0000887 A1 | 1/2012 | Eto et al. | |
| 2012/0000888 A1* | 1/2012 | Kawasaki | H01J 37/32082 216/67 |
| 2012/0052689 A1 | 3/2012 | Tokashiki | |
| 2012/0073754 A1 | 3/2012 | De la Llera et al. | |
| 2012/0160806 A1 | 6/2012 | Godyak et al. | |
| 2012/0187844 A1 | 7/2012 | Hoffman et al. | |
| 2012/0227484 A1 | 9/2012 | Chen et al. | |
| 2012/0252219 A1* | 10/2012 | Morimoto | H01J 37/32146 438/710 |
| 2012/0262064 A1 | 10/2012 | Nagarkatti et al. | |
| 2013/0119018 A1 | 5/2013 | Kanarik et al. | |
| 2013/0122711 A1 | 5/2013 | Marakbtanov et al. | |
| 2013/0168354 A1 | 7/2013 | Kanarik | |
| 2013/0180951 A1 | 7/2013 | Indrakanti et al. | |
| 2014/0062303 A1 | 3/2014 | Hoffman et al. | |
| 2014/0066838 A1 | 3/2014 | Hancock | |
| 2014/0076713 A1 | 3/2014 | Valcore, Jr. et al. | |
| 2014/0167613 A1* | 6/2014 | Fong | H01J 37/32091 315/111.21 |
| 2014/0172335 A1* | 6/2014 | Valcore, Jr. | H05H 1/46 702/65 |
| 2014/0214351 A1* | 7/2014 | Valcore, Jr. | H01J 37/32183 702/65 |
| 2014/0305589 A1 | 10/2014 | Valcore, Jr. | |
| 2015/0002018 A1 | 1/2015 | Lill et al. | |
| 2015/0020971 A1 | 1/2015 | Kanarik | |
| 2015/0069912 A1* | 3/2015 | Valcore, Jr. | H01J 37/32183 315/111.21 |

FOREIGN PATENT DOCUMENTS

| | | |
|---|---|---|
| CN | 101295345 A | 10/2008 |
| CN | 104051214 A * | 9/2014 |
| EP | 0474137 A2 | 3/1992 |

(56) References Cited

FOREIGN PATENT DOCUMENTS

| EP | 0474137 A3 | 3/1992 | |
|---|---|---|---|
| EP | 0838840 A2 | 4/1998 | |
| EP | 0838840 A3 | 6/1999 | |
| EP | 2405721 A2 | 1/2012 | |
| JP | 2001-127045 A | 5/2001 | |
| JP | 2002203835 A * | 7/2002 | ........ H01J 37/32082 |
| JP | 2003-282545 | 10/2003 | |
| JP | 2004239211 A | 8/2004 | |
| JP | 2004-335594 A | 11/2004 | |
| JP | 2005130198 | 5/2005 | |
| JP | 2005284046 A | 10/2005 | |
| JP | 2010504614 A | 2/2010 | |
| JP | 2013153432 A * | 8/2013 | ............ H03F 3/191 |
| KR | 10-2005-0088438 A | 9/2005 | |
| KR | 10-2005-0089995 A | 9/2005 | |
| KR | 10-2007-0031915 A | 3/2007 | |
| KR | 20090029740 A * | 3/2009 | ............ H01J 37/304 |
| TW | 201038143 A | 10/2010 | |
| WO | WO 1999014699 A1 | 3/1999 | |
| WO | WO 199145 A1 | 12/2001 | |
| WO | 2002-063999 | 2/2002 | |
| WO | WO-2004077022 A2 * | 9/2004 | ........ H01J 37/32082 |
| WO | WO 2006135515 A1 | 12/2006 | |
| WO | WO 2008002938 A2 | 1/2008 | |
| WO | WO 2008036210 A2 | 3/2008 | |
| WO | WO 2012054306 A2 | 4/2012 | |
| WO | WO 2013072834 A1 | 5/2013 | |
| WO | WO 2014070838 A1 | 5/2014 | |

OTHER PUBLICATIONS

Machine Translation for JP2002203835 (Year: 2002).*
Machine Translation for JP2013153432 (Year: 2013).*
Machine Translation for KR20090029740 (Year: 2009).*
Thorsten, Lill et al, "Controlling ION Energy Within a Plasma Chamber", U.S. Appl. No. 13/930,138, filed Jun. 28, 2013.
"Electromagnetic Waves and Antennas", Sophocles J. Orfanidis, Rutgers University, Aug. 25, 2013, Chapter 10.10.
Damon et al. (Synchronous Pulsed Plasma for Silicon Etch Applications, ECS Transactions, 27 (1) pp. 717-723 (2010), Publication by: The Electrochemical Society) Used Only as Evidence.
Christoph, Lars, Comparison of Applied Materials DPS Chambers used for poly-Si Etch process by Plasma Parameters, Dec. 6, 2000, 2nd workshop on self excited electron plasma resonance spectroscopy, Dresden, Germany.
Dobbyn, Kieran, "Design and Application of a Plasma Impedance Monitor for RF Plasma Diagnostics", a thesis for the degree of M.Sc., Jun. 2000, 84 pages, Dublin City University.
Han et al., "Power Accuracy and Source-Pull Effect for a High-Power RF Generator", Abstract, Jun. 16, 2006, 67th ARFTG Conference, San Francisco, CA, 2 pages.
Han et al., "Power Accuracy and Source-Pull Effect for a High-Power RF Generator", Jun. 16, 2006, 67th ARFTG Conference, San Francisco, CA, pp. 81-92.
Steuer, Christoph, Tool Comparison at GC Stack Etch in LAM TCP Using Plasma Parameters (SEERS), Dec. 12, 2000, 2nd workshop on self excited electron plasma resonance spectroscopy, Dresden, Germany.
Yang et al., "Real-Time Fault Classification for Plasma Processes", Jul. 6, 2011, Sensors 2011, 11(7), pp. 7037-7054 (18 pages).
PCT/IB2013/051010 International Search Report and Written Opinion, dated Jul. 3, 2013 (13 pages).
PCT/US2010/057450 International Search Report and Written Opinion, dated Jul. 18. 2011 (9 pages).
PCT/US2010/057478 International Search Report and Written Opinion, dated Jul. 26, 2011 (6 pages).
PCT/US2011/063422 International Search Report and Written Opinion, dated Mar. 28, 2012 (9 pages).
201510198711.9 Chinese Office Action, dated Jun. 27, 2017.

* cited by examiner

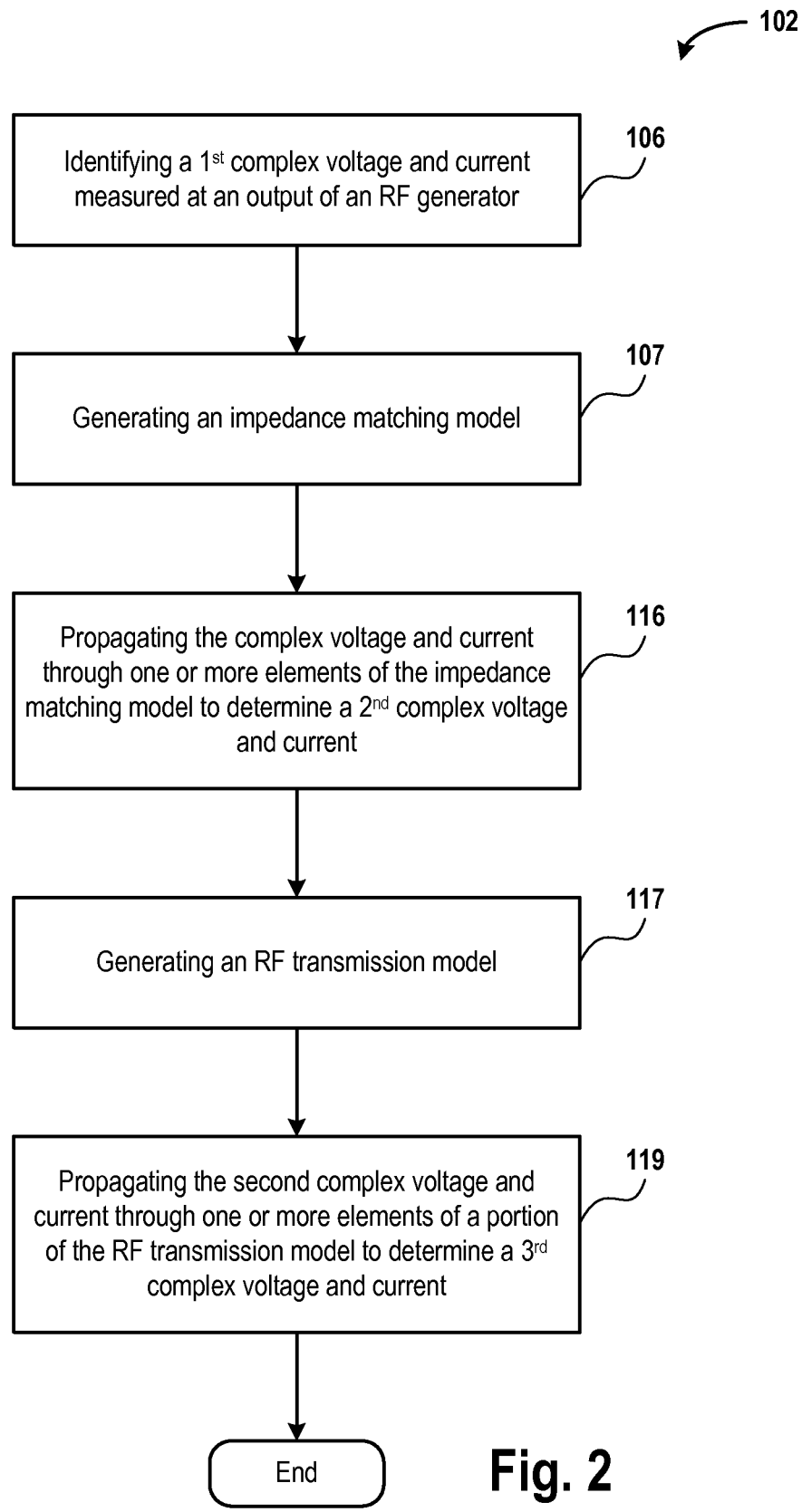

Compare Model Vpeak vs Vprobe for ALL 2MHz Combinations Pwr/Pres/Gap/Match/Filter Scans
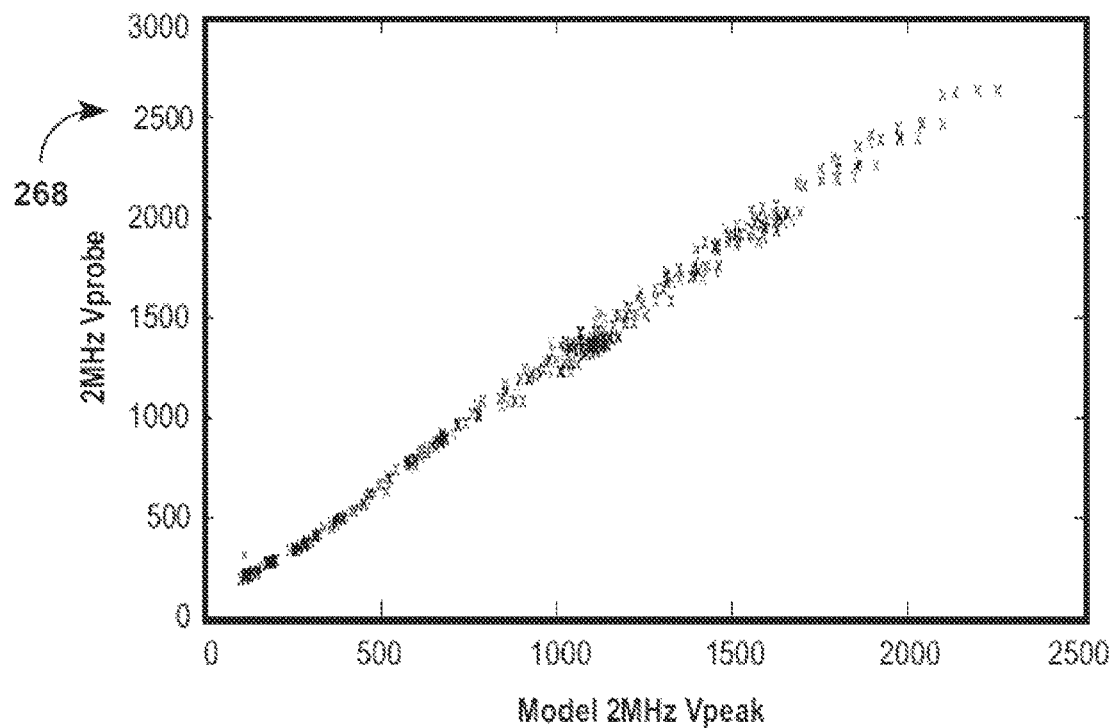
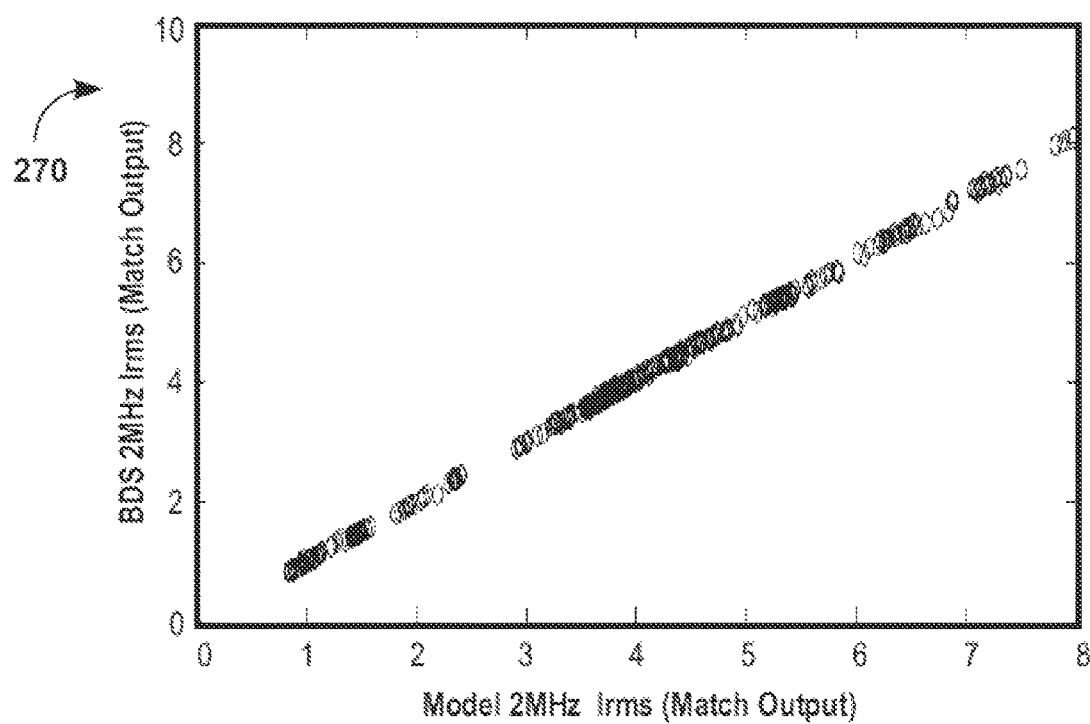
Fig. 12A

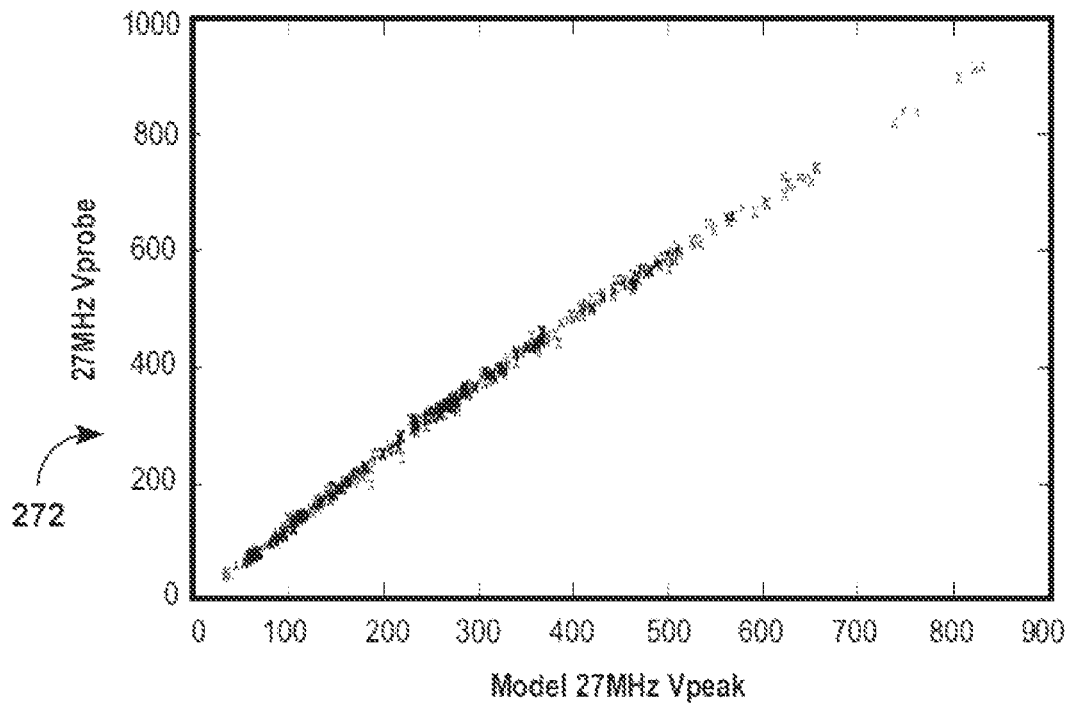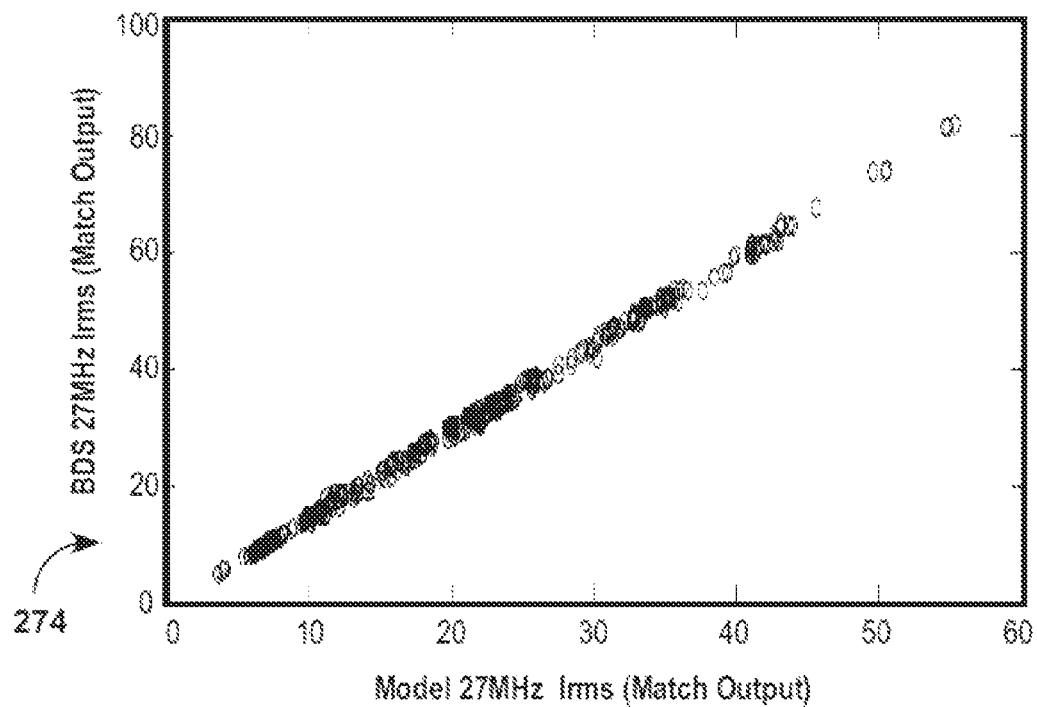
Fig. 12B

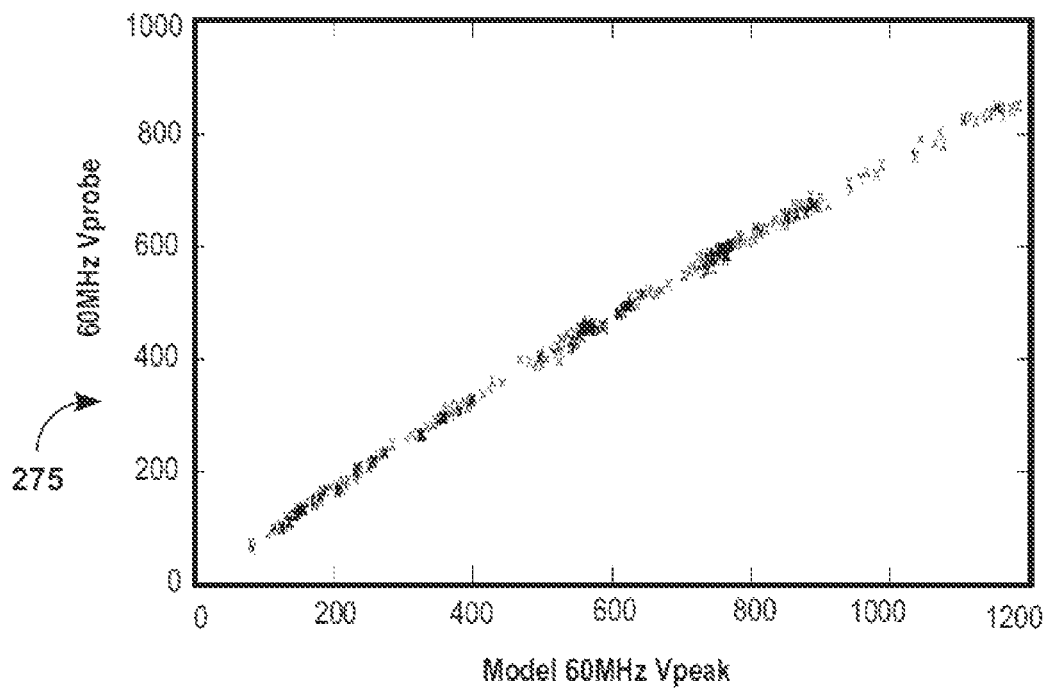
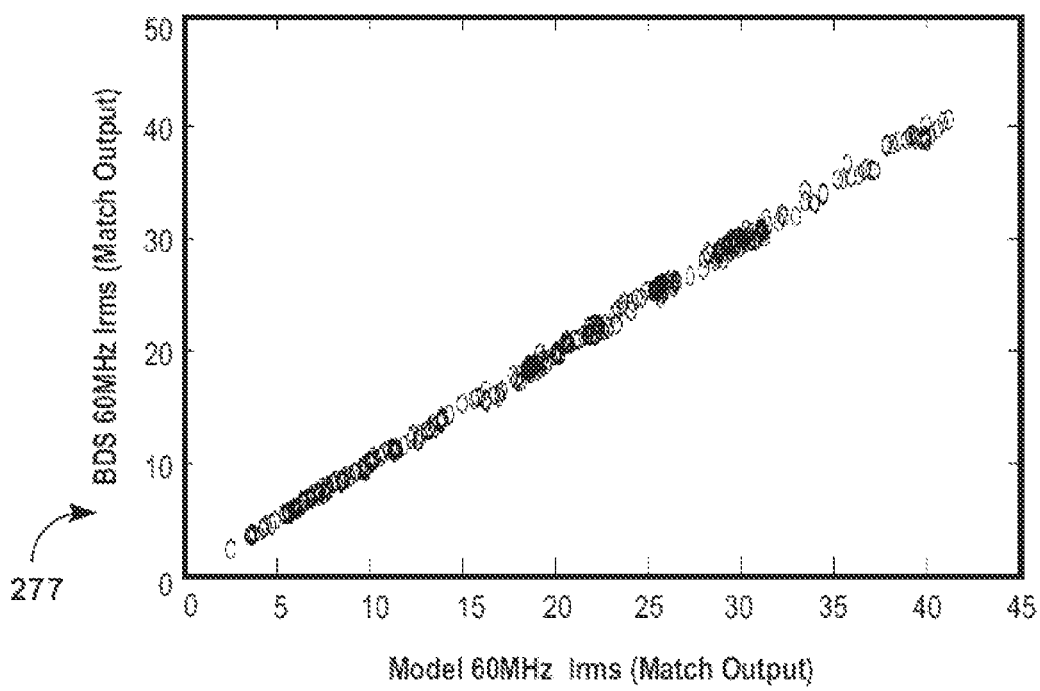
Fig. 12C

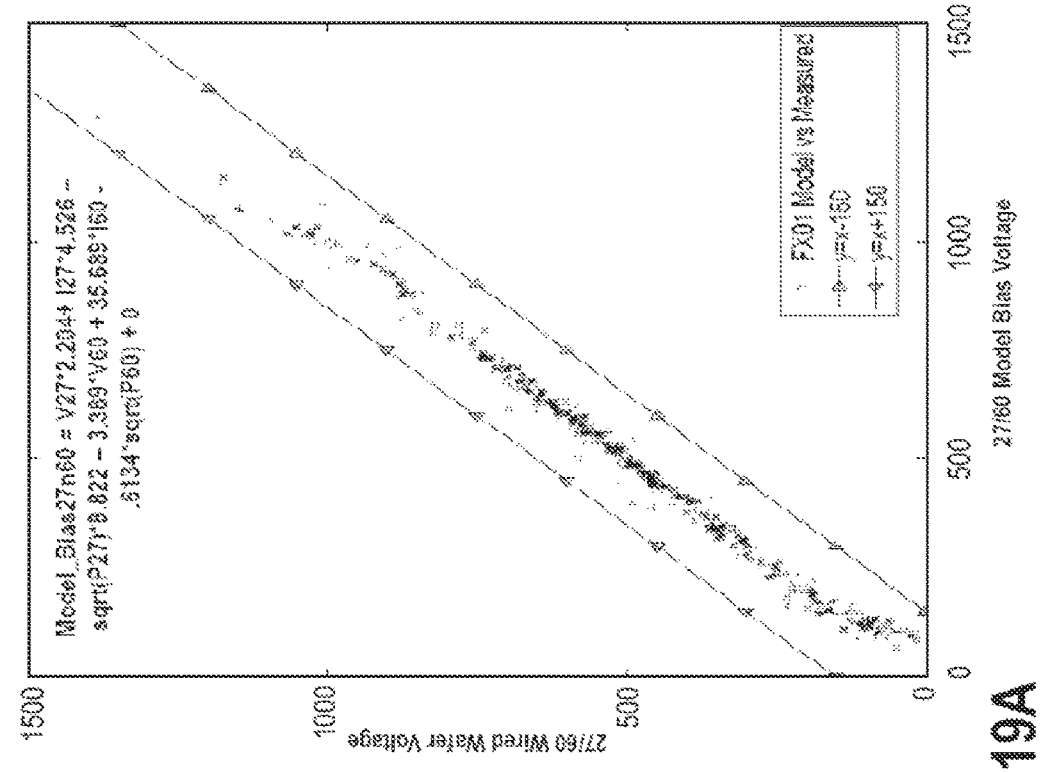
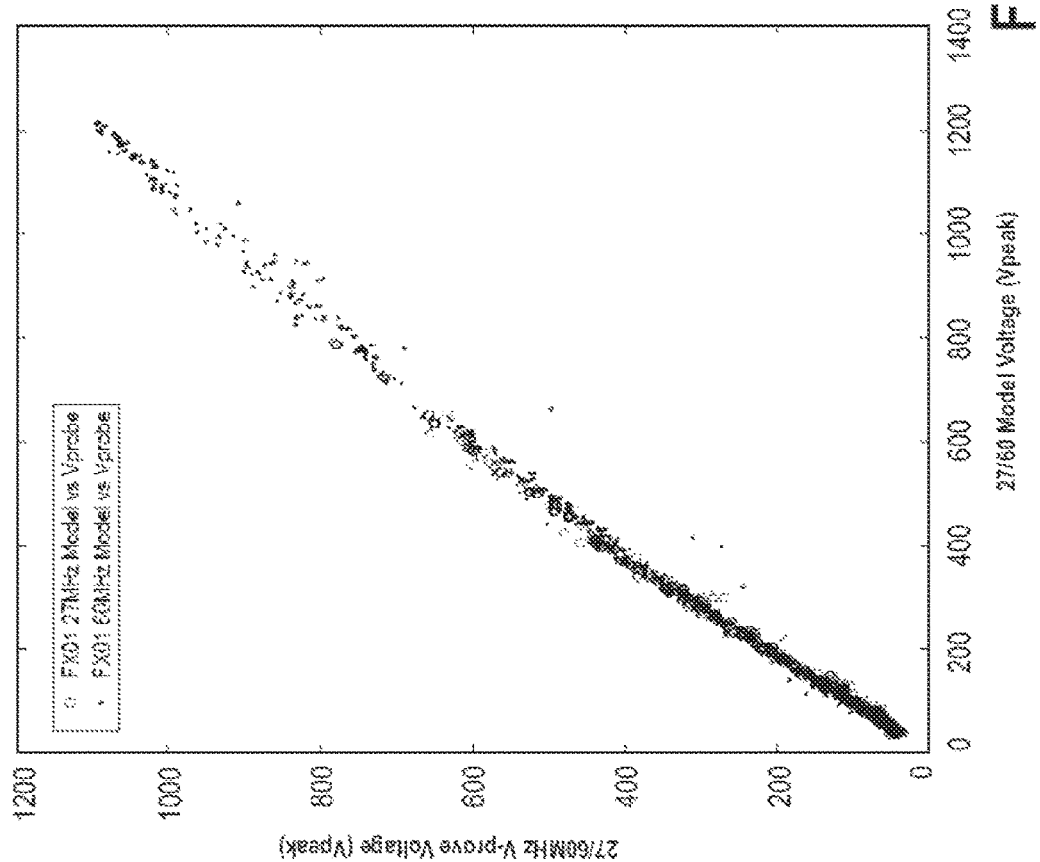
Fig. 19A

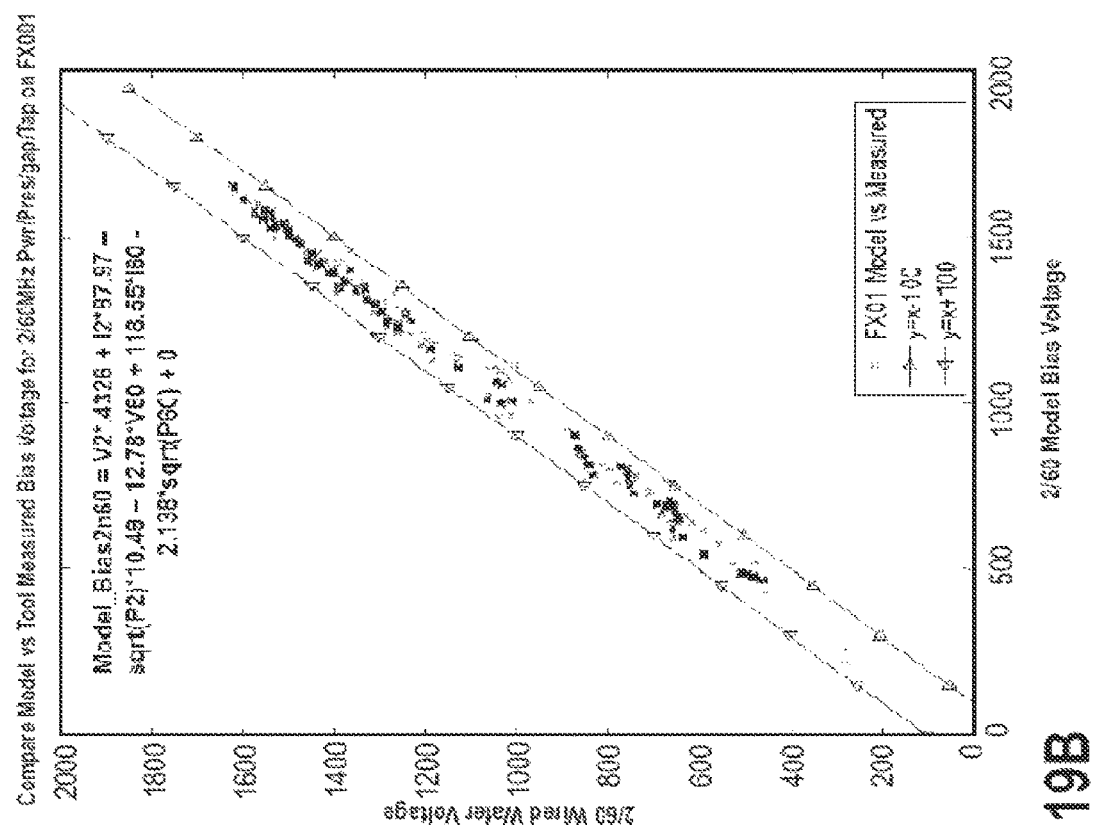
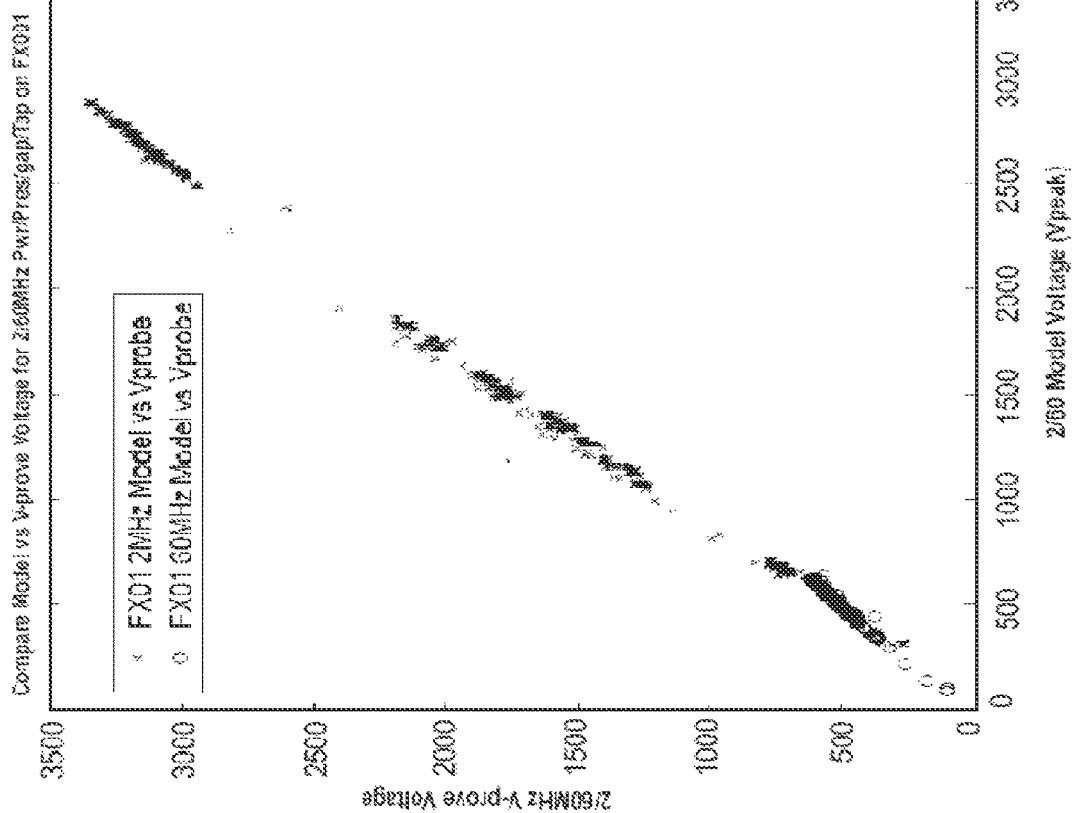
Fig. 19B

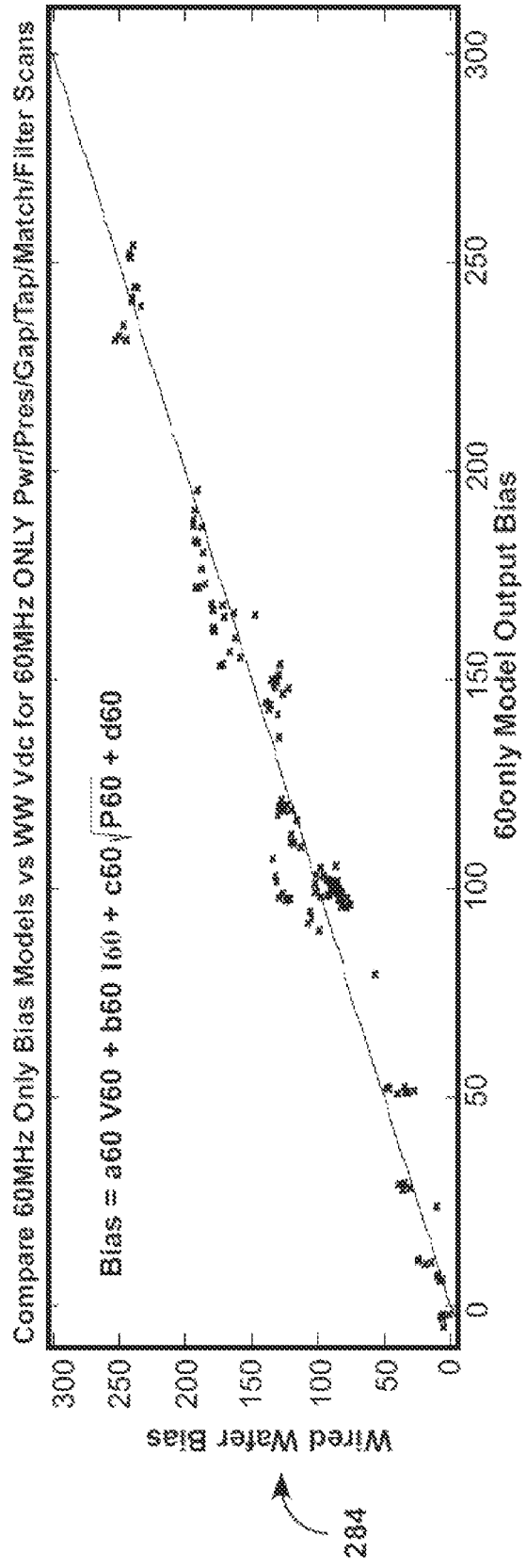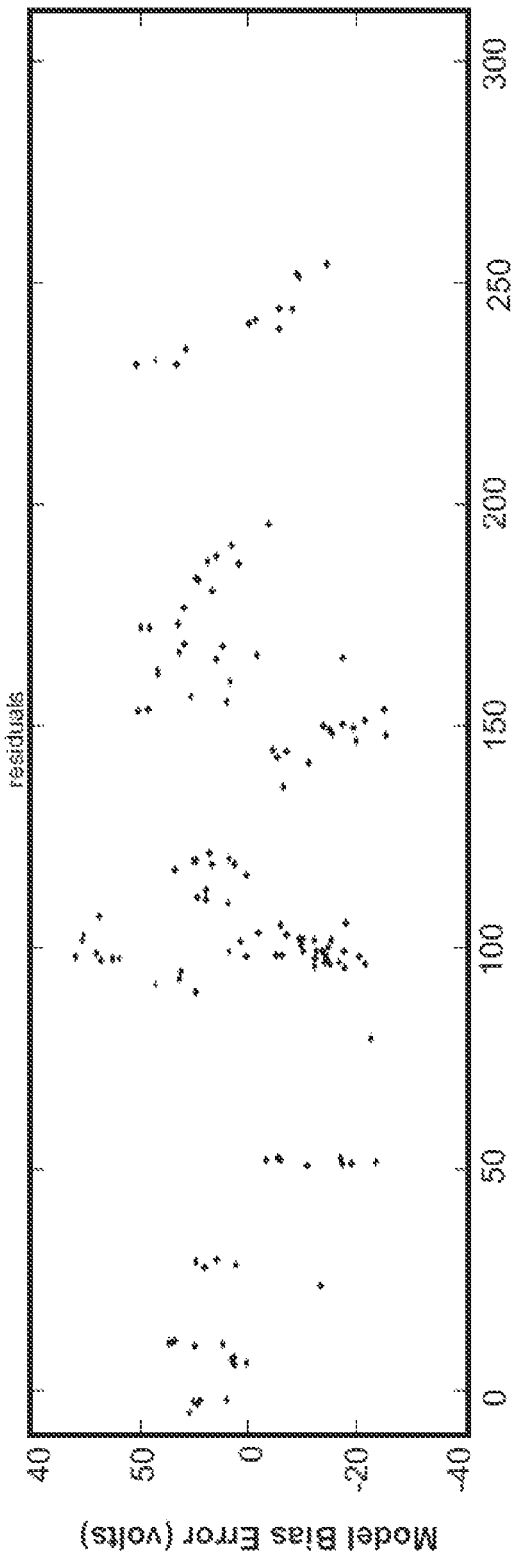
Fig. 20C

USING MODELING FOR IDENTIFYING A LOCATION OF A FAULT IN AN RF TRANSMISSION SYSTEM FOR A PLASMA SYSTEM

FIELD

The present embodiments relate to using RF transmission system modeling to locate faults in the RF transmission system in a plasma system.

BACKGROUND

In a plasma-based system, plasma is generated within a plasma chamber to perform various operations, e.g., etching, cleaning, depositing, etc., on a wafer. The plasma is monitored and controlled to control performance of the various operations. For example, the plasma is monitored by monitoring a voltage of the plasma and is controlled by controlling an amount of radio frequency (RF) power supplied to the plasma chamber.

However, the use of voltage to monitor and control the performance of the operations may not provide satisfactory results. Moreover, the monitoring of voltage may be an expensive and time consuming operation.

It is in this context that embodiments described in the present disclosure arise.

SUMMARY

Embodiments of the disclosure provide apparatus, methods and computer programs for using modeling to identify locations of faults within an RF transmission system in a plasma system. It should be appreciated that the present embodiments can be implemented in numerous ways, e.g., a process, an apparatus, a system, a piece of hardware, or a method on a computer-readable medium. Several embodiments are described below.

One embodiment provides a method for locating a fault in an RF transmission system including characterizing the RF transmission system and selecting one of the stage in the RF transmission system as an initial selected stage. An output of the initial selected stage can be measured in the characterized RF transmission system. The measured output of the initial selected stage is propagated through a baseline RF model and a point of deflection is identified in a resulting RF model of the RF transmission system.

A fault can be identified as being located in a stage corresponding to the point of deflection. The baseline RF model can be based on circuit components defined in the RF transmission line, the baseline RF model having an input and an output. Alternatively, the baseline RF model can be based on electrical components defined in the RF transmission line, the baseline RF model having an input and an output. The electrical components of RF transmission line can include capacitors, inductors, or a combination thereof, the RF model including one or more elements, wherein the elements of the RF model have similar characteristics as that of the electrical components of the RF transmission line.

The method of claim 1, wherein the base line RF model can include a model of an RF transmission line, a model of impedance matching circuit, the RF transmission line coupled between an output of an RF generator and an input of the impedance matching circuit, a model of an RF tunnel coupled to the output of the impedance matching circuit, a model of an RF strap, the RF tunnel model coupled with the RF strap model and a model of an electrostatic chuck having an input coupled to the RF strap. The electrostatic chuck can be included in a plasma processing chamber. The RF transmission system is included in a plasma processing system.

Characterizing the RF transmission system can include applying a characterization recipe to a set of wafers processed within the processing chamber and measuring at least one parameter of at least one output of the stages in the RF transmission system during the processing of the plurality of wafers.

The baseline RF model can be an ideal RF model of an ideal RF transmission system. Alternatively, the baseline RF model can be a RF model of the RF transmission system generated when the RF transmission system was known to be functioning properly. Generating the baseline RF model of the RF transmission system can include applying a characterization recipe to a second plurality of wafers processed within the processing chamber, measuring at least one parameter of an output of a selected at least one of the stages, during the processing of the second set of wafers and comparing the measured output of the selected at least one of the plurality of stages to a predicted value of the selected at least one of the plurality of stages in the baseline RF model.

Another embodiment provides a plasma system including a plasma processing chamber, an RF transmission system coupled to an RF input of the plasma processing chamber, an RF generator having an output coupled to the RF transmission system and a controller coupled to the RF generator and the plasma processing chamber. The controller includes logic on computer readable media being executable for identifying a fault in the RF transmission system by selecting one of the stages and propagating a measured output of the selected stage through a baseline RF model of the RF transmission system.

Yet another embodiment provides a method for locating a fault in an RF transmission system including generating a baseline RF model of the RF transmission system including applying a characterization recipe to a first set of wafers processed within the processing chamber, measuring at least one parameter of an output of a selected at least one of the stages in the RF transmission system, during the processing of the first set of wafers and comparing the measured output of the selected at least one of the plurality of stages to a predicted value of the selected at least one of the stages in the baseline RF model. The malfunctioning RF transmission system is characterized a second time. A stage is selected as an initial selected stage and an output of the initial selected stage is measured in the characterized malfunctioning RF transmission system. The measured output of the initial selected stage is propagated through the baseline RF model to identify a point of deflection in a resulting RF model of the RF transmission system and indicate a fault a stage corresponding to the point of deflection.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 is a flowchart of a method for determining a complex voltage and current at the output of the RF transmission model portion, in accordance with an embodiment described in the present disclosure.

FIG. 12A is a diagram of a graph that illustrates a correlation between a variable that is measured at a node within the system of FIG. 1 by using a probe and a variable that is determined using the method of FIG. 2 when an x MHz RF generator is on, in accordance with an embodiment described in the present disclosure.

FIG. 12B is a diagram of a graph that illustrates a correlation between a variable that is measured at a node within the system of FIG. 1 by using a probe and a variable that is determined using the method of FIG. 2 when a y MHz RF generator is on, in accordance with an embodiment described in the present disclosure.

FIG. 12C is a diagram of a graph that illustrates a correlation between a variable that is measured at a node within the system of FIG. 1 by using a probe and a variable that is determined using the method of FIG. 2 when a z MHz RF generator is on, in accordance with one embodiment described in the present disclosure.

FIG. 19A show embodiments of graphs to illustrate a correlation between a variable that is measured at a node of the plasma system of FIG. 1 by using a voltage probe and a variable at a corresponding model node output determined using the method of FIG. 2, 13, 15, or 17 when the y and z MHz RF generators are on, in accordance with an embodiment described in the present disclosure.

FIG. 19B show embodiments of graphs to illustrate a correlation between a variable that is measured at a node of the plasma system of FIG. 1 by using a voltage probe and a variable at a corresponding model node output determined using the method of FIG. 2, 13, 15, or 17 when the x and z MHz RF generators are on, in accordance with an embodiment described in the present disclosure.

FIG. 20C is a diagram of embodiments of graphs used to illustrate a correlation between a wired wafer bias measured using a sensor tool, a model bias that is determined using the method of FIG. 13, 15, or 17 and an error in the model bias when the z MHz RF generator is on, in accordance with one embodiment described in the present disclosure.

DETAILED DESCRIPTION

The following embodiments describe systems and methods for using a model to with a location of a fault within an RF transmission system in a plasma system. It will be apparent that the present embodiments may be practiced without some or all of these specific details. In other instances, well known process operations have not been described in detail in order not to unnecessarily obscure the present embodiments.

Figure 1:
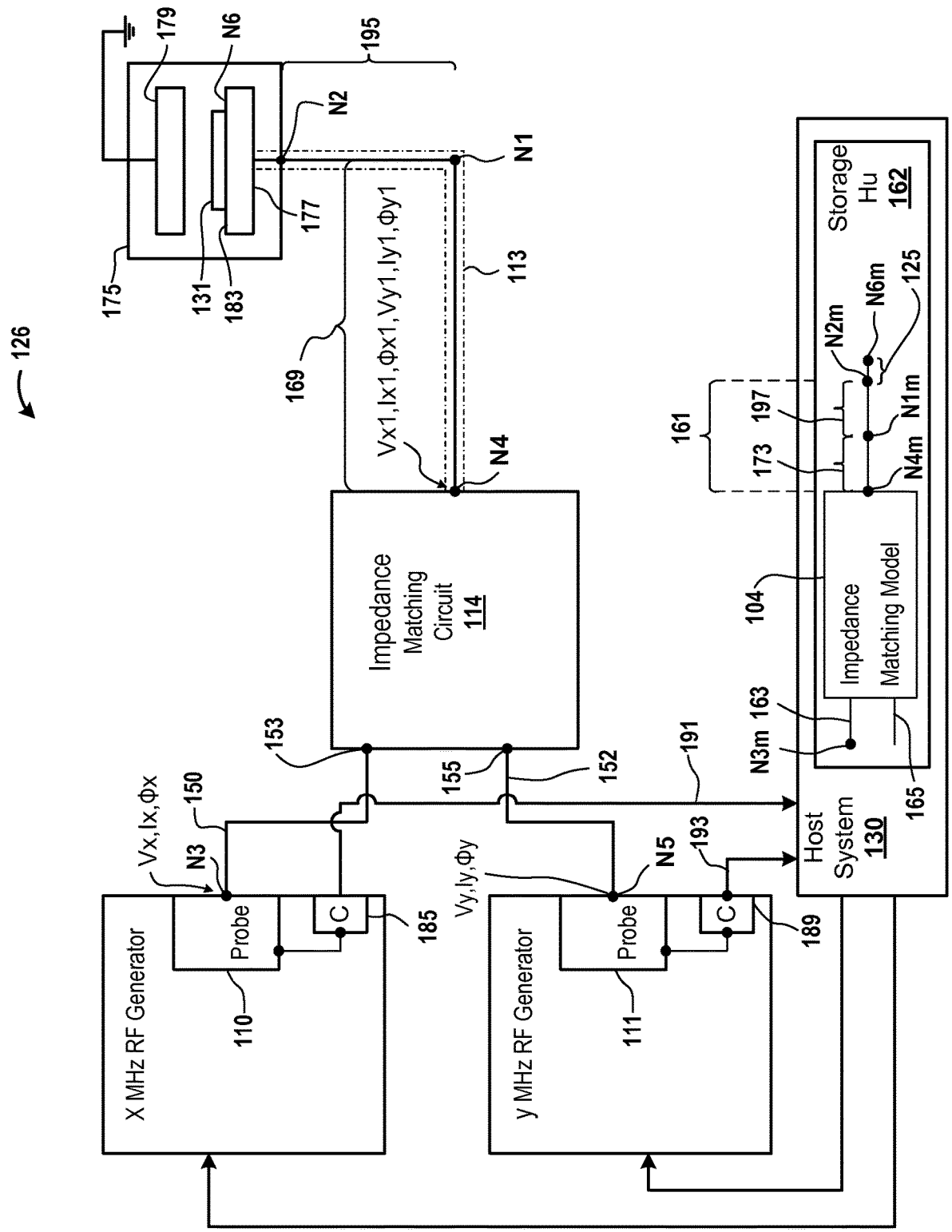
FIG. 1 is a block diagram of a system for determining a variable at an output of an impedance matching model, at an output of a portion of a radio frequency (RF) transmission model, and at an output of an electrostatic chuck (ESC) model, in accordance with an embodiment described in the present disclosure.

FIG. 1 is a block diagram of an embodiment of a system 126 for determining a variable at an output of an impedance matching model 104, at an output, e.g., a model node N1$m$, of a portion 173 of an RF transmission model 161, which is a model of an RF transmission line 113, and at an output, e.g., a model node N6$m$, of an electrostatic chuck (ESC) model 125. Examples of a variable include complex voltage, complex current, complex voltage and current, complex power, wafer bias, etc. The RF transmission line 113 has an output, e.g., a node N2. A voltage and current (VI) probe 110 measures a complex voltage and current Vx, Ix, and φx, e.g., a first complex voltage and current, at an output, e.g., a node N3, of an x MHz RF generator. It should be noted that Vx represents a voltage magnitude, Ix represents a current magnitude, and φx represents a phase between Vx and Ix. The impedance matching model 104 has an output, e.g., a model node N4$m$.

Moreover, a voltage and current probe 111 measures a complex voltage and current Vy, Iy, and φy at an output, e.g., a node N5, of a y MHz RF generator. It should be noted that Vy represents a voltage magnitude, Iy represents a current magnitude, and φy represents a phase between Vy and Iy.

In some embodiments, a node is an input of a device, an output of a device, or a point within the device. A device, as used herein, is described below.

Examples of x MHz include 2 MHz, 27 MHz, and 60 MHz. Examples of y MHz include 2 MHz, 27 MHz, and 60 MHz. The x MHz is different than y MHz. For example, when x MHz is 2 MHz, y MHz is 27 MHz or 60 MHz. When x MHz is 27 MHz, y MHz is 60 MHz.

An example of each voltage and current probe 110 and 111 includes a voltage and current probe that complies with a pre-set formula. An example of the pre-set formula includes a standard that is followed by an Association, which develops standards for sensors. Another example of the pre-set formula includes a National Institute of Standards and Technology (NIST) standard. As an illustration, the voltage and current probe 110 or 111 is calibrated according to NIST standard. In this illustration, the voltage and current probe 110 or 111 is coupled with an open circuit, a short circuit, or a known load to calibrate the voltage and current probe 110 or 111 to comply with the NIST standard. The voltage and current probe 110 or 111 may first be coupled with the open circuit, then with the short circuit, and then with the known load to calibrate the voltage and current probe 110 based on NIST standard. The voltage and current probe 110 or 111 may be coupled to the known load, the open circuit, and the short circuit in any order to calibrate the voltage and current probe 110 or 111 according to NIST standard. Examples of a known load include a 50 ohm load, a 100 ohm load, a 200 ohm load, a static load, a direct current (DC) load, a resistor, etc. As an illustration, each voltage and current probe 110 and 111 is calibrated according NIST-traceable standards.

The voltage and current probe 110 is coupled to the output, e.g., the node N3, of the x MHz RF generator. The output, e.g., the node N3, of the x MHz RF generator is coupled to an input 153 of an impedance matching circuit 114 via a cable 150. Moreover, the voltage and current probe 111 is coupled to the output, e.g., the node N5, of the y MHz RF generator. The output, e.g., the node N5, of the y MHz RF generator is coupled to another input 155 of the impedance matching circuit 114 via a cable 152.

An output, e.g., a node N4, of the impedance matching circuit 114 is coupled to an input of the RF transmission line 113. The RF transmission line 113 includes a portion 169 and another portion 195. An input of the portion 169 is an input of the RF transmission line 113. An output, e.g., a node N1, of the portion 169 is coupled to an input of the portion 195. An output, e.g., the node N2, of the portion 195 is coupled to the plasma chamber 175. The output of the portion 195 is the output of the RF transmission line 113. An example of the portion 169 includes an RF cylinder and an RF strap. The RF cylinder is coupled to the RF strap. An example of the portion 195 includes an RF rod and/or a support, e.g., a cylinder, etc., for supporting the plasma chamber 175.

The plasma chamber 175 includes an electrostatic chuck (ESC) 177, an upper electrode 179, and other parts (not shown), e.g., an upper dielectric ring surrounding the upper electrode 179, an upper electrode extension surrounding the upper dielectric ring, a lower dielectric ring surrounding a lower electrode of the ESC 177, a lower electrode extension surrounding the lower dielectric ring, an upper plasma exclusion zone (PEZ) ring, a lower PEZ ring, etc. The upper electrode 179 is located opposite to and facing the ESC 177. A work piece 131, e.g., a semiconductor wafer, etc., is supported on an upper surface 183 of the ESC 177. The upper surface 183 includes an output N6 of the ESC 177. The work piece 131 is placed on the output N6. Various processes, e.g., chemical vapor deposition, cleaning, deposition, sputtering, etching, ion implantation, resist stripping, etc., are performed on the work piece 131 during production. Integrated circuits, e.g., application specific integrated circuit (ASIC), programmable logic device (PLD), etc. are developed on the work piece 131 and the integrated circuits are used in a variety of electronic items, e.g., cell phones, tablets, smart phones, computers, laptops, networking equipment, etc. Each of the lower electrode and the upper electrode 179 is made of a metal, e.g., aluminum, alloy of aluminum, copper, etc.

In one embodiment, the upper electrode 179 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 179 is grounded. The ESC 177 is coupled to the x MHz RF generator and the y MHz RF generator via the impedance matching circuit 114.

When the process gas is supplied between the upper electrode 179 and the ESC 177 and when the x MHz RF generator and/or the y MHz RF generator supplies RF signals via the impedance matching circuit 114 and the RF transmission line 113 to the ESC 177, the process gas is ignited to generate plasma within the plasma chamber 175.

When the x MHz RF generator generates and provides an RF signal via the node N3, the impedance matching circuit 114, and the RF transmission line 113 to the ESC 177 and when the y MHz generator generates and provides an RF signal via the node N5, the impedance matching circuit 114, and the RF transmission line 113 to the ESC 177, the voltage and current probe 110 measures the complex voltage and current at the node N3 and the voltage and current probe 111 measures the complex voltage and current at the node N5.

The complex voltages and currents measured by the voltage and current probes 110 and 111 are provided via corresponding communication devices 185 and 189 from the corresponding voltage and current probes 110 and 111 to a storage hardware unit (HU) 162 of a host system 130 for storage. For example, the complex voltage and current measured by the voltage and current probe 110 is provided via the communication device 185 and a cable 191 to the host system 130 and the complex voltage and current measured by the voltage and current probe 111 is provided via the communication device 189 and a cable 193 to the host system 130. Examples of a communication device include an Ethernet device that converts data into Ethernet packets and converts Ethernet packets into data, an Ethernet for Control Automation Technology (EtherCAT) device, a serial interface device that transfers data in series, a parallel interface device that transfers data in parallel, a Universal Serial Bus (USB) interface device, etc.

Examples of the host system 130 include a computer, e.g., a desktop, a laptop, a tablet, etc. As an illustration, the host system 130 includes a processor and the storage HU 162. As used herein, a processor may be a central processing unit (CPU), a microprocessor, an application specific integrated circuit (ASIC), a programmable logic device (PLD), etc. Examples of the storage HU include a read-only memory (ROM), a random access memory (RAM), or a combination thereof. The storage HU may be a flash memory, a redundant array of storage disks (RAID), a hard disk, etc.

The impedance matching model 104 is stored within the storage HU 162. The impedance matching model 104 has similar characteristics, e.g., capacitances, inductances, complex power, complex voltage and currents, etc., as that of the impedance matching circuit 114. For example, the impedance matching model 104 has the same number of capacitors and/or inductors as that within the impedance matching circuit 114, and the capacitors and/or inductors are connected with each other in the same manner, e.g., serial, parallel, etc. as that within the impedance matching circuit 114. To provide an illustration, when the impedance matching circuit 114 includes a capacitor coupled in series with an inductor, the impedance matching model 104 also includes the capacitor coupled in series with the inductor.

As an example, the impedance matching circuit 114 includes one or more electrical components and the impedance matching model 104 includes a design, e.g., a computer-generated model, of the impedance matching circuit 114. The computer-generated model may be generated by a processor based upon input signals received from a user via an input hardware unit. The input signals include signals regarding which electrical components, e.g., capacitors, inductors, etc., to include in a model and a manner, e.g., series, parallel, etc., of coupling the electrical components with each other. As another example, the impedance circuit 114 includes hardware electrical components and hardware connections between the electrical components and the impedance matching model 104 include software representations of the hardware electrical components and of the hardware connections. As yet another example, the impedance matching model 104 is designed using a software program and the impedance matching circuit 114 is made on a printed circuit board. As used herein, electrical components may include resistors, capacitors, inductors, connections between the resistors, connections between the inductors, connections between the capacitors, and/or connections between a combination of the resistors, inductors, and capacitors.

Similarly, a cable model 163 and the cable 150 have similar characteristics, and a cable model 165 and the cable 152 has similar characteristics. As an example, an inductance of the cable model 163 is the same as an inductance of the cable 150. As another example, the cable model 163 is a computer-generated model of the cable 150 and the cable model 165 is a computer-generated model of the cable 152.

Similarly, an RF transmission model 161 and the RF transmission line 113 have similar characteristics. For example, the RF transmission model 161 has the same number of resistors, capacitors and/or inductors as that within the RF transmission line 113, and the resistors, capacitors and/or inductors are connected with each other in the same manner, e.g., serial, parallel, etc. as that within the RF transmission line 113. To further illustrate, when the RF transmission line 113 includes a capacitor coupled in parallel with an inductor, the RF transmission model 161 also includes the capacitor coupled in parallel with the inductor. As yet another example, the RF transmission line 113 includes one or more electrical components and the RF transmission model 161 includes a design, e.g., a computer-generated model, of the RF transmission line 113.

In some embodiments, the RF transmission model 161 is a computer-generated impedance transformation involving computation of characteristics, e.g., capacitances, resistances, inductances, a combination thereof, etc., of elements, e.g., capacitors, inductors, resistors, a combination thereof, etc., and determination of connections, e.g., series, parallel, etc., between the elements.

Based on the complex voltage and current received from the voltage and current probe 110 via the cable 191 and characteristics, e.g., capacitances, inductances, etc., of elements, e.g., inductors, capacitors, etc., within the impedance matching model 104, the processor of the host system 130 calculates a complex voltage and current V, I, and φ, e.g., a second complex voltage and current, at the output, e.g., the model node N4m, of the impedance matching model 104. The complex voltage and current at the model node N4m is stored in the storage HU 162 and/or another storage HU, e.g., a compact disc, a flash memory, etc., of the host system 130. The complex V, I, and φ includes a voltage magnitude V, a current magnitude I, and a phase φ between the voltage and current.

The output of the impedance matching model 104 is coupled to an input of the RF transmission model 161, which is stored in the storage hardware unit 162. The impedance matching model 104 also has an input, e.g., a node N3m, which is used to receive the complex voltage and current measured at the node N3.

The RF transmission model 161 includes the portion 173, another portion 197, and an output N2m, which is coupled via the ESC model 125 to the model node N6m. The ESC model 125 is a model of the ESC 177. For example, the ESC model 125 has similar characteristics as that of the ESC 177. For example, the ESC model 125 has the same inductance, capacitance, resistance, or a combination thereof as that of the ESC 177.

An input of the portion 173 is the input of the RF transmission model 161. An output of the portion 173 is coupled to an input of the portion 197. The portion 173 has similar characteristics as that of the portion 169 and the portion 197 has similar characteristics as that of the portion 195.

Based on the complex voltage and current measured at the model node N4m, the processor of the host system 130 calculates a complex voltage and current V, I, and φ, e.g., a third complex voltage and current, at the output, e.g., the model node N1m, of the portion 173 of the RF transmission model 161. The complex voltage and current determined at the model node N1m is stored in the storage HU 162 and/or another storage HU, e.g., a compact disc, a flash memory, etc., of the host system 130.

In several embodiments, instead of or in addition to determining the third complex voltage and current, the processor of the host system 130 computes a complex voltage and current, e.g., an intermediate complex voltage and current V, I, and φ, at a point, e.g., a node, etc., within the portion 173 based on the complex voltage and current at the output of the impedance matching model 104 and characteristics of elements between the input of the RF transmission model 161 and the point within the portion 173.

In various embodiments, instead of or in addition to determining the third complex voltage and current, the processor of the host system 130 computes a complex voltage and current, e.g., an intermediate complex voltage and current V, I, and φ, at a point, e.g., a node, etc., within the portion 197 based on the complex voltage and current at the output of the impedance matching model 104 and characteristics of elements between the input of the RF transmission model 161 and the point within the portion 197.

It should be noted that in some embodiments, the complex voltage and current at the output of the impedance matching model 104 is calculated based on the complex voltage and current at the output of the x MHz RF generator, characteristics of elements the cable model 163, and characteristics of the impedance matching model 104.

It should further be noted that although two generators are shown coupled to the impedance matching circuit 114, in one embodiment, any number of RF generators, e.g., a single generator, three generators, etc., are coupled to the plasma chamber 175 via an impedance matching circuit. For example, a 2 MHz generator, a 27 MHz generator, and a 60 MHz generator may be coupled to the plasma chamber 175 via an impedance matching circuit. For example, although the above-described embodiments are described with respect to using complex voltage and current measured at the node N3, in various embodiments, the above-described embodiments may also use the complex voltage and current measured at the node N5.

FIG. 2 is a flowchart of an embodiment of a method 102 for determining the complex voltage and current at the output of the RF transmission model portion 173 (FIG. 1). The method 102 is executed by the processor of the host system 130 (FIG. 1). In an operation 106, the complex voltage and current, e.g., the first complex voltage and current, measured at the node N3 is identified from within the storage HU 162 (FIG. 1). For example, it is determined that the first complex voltage and current is received from the voltage and current probe 110 (FIG. 1). As another example, based on an identity, of the voltage and current probe 110, stored within the storage HU 162 (FIG. 1), it is determined that the first complex voltage and current is associated with the identity.

Furthermore, in an operation 107, the impedance matching model 104 (FIG. 1) is generated based on electrical components of the impedance matching circuit 114 (FIG. 1). For example, connections between electrical components of the impedance matching circuit 114 and characteristics of the electrical components are provided to the processor of the host system 130 by the user via an input hardware unit that is coupled with the host system 130. Upon receiving the connections and the characteristics, the processor generates elements that have the same characteristics as that of electrical components of the impedance matching circuit 114 and generates connections between the elements that have the same connections as that between the electrical components.

The input, e.g., the node N3m, of the impedance matching model 104 receives the first complex voltage and current. For example, the processor of the host system 130 accesses, e.g., reads, etc., from the storage HU 162 the first complex voltage and current and provides the first complex voltage and current to the input of the impedance matching model 104 to process the first complex voltage and current.

In an operation 116, the first complex voltage and current is propagated through one or more elements of the impedance matching model 104 (FIG. 1) from the input, e.g., the node N3m (FIG. 1), of the impedance matching model 104 to the output, e.g., the node N4m (FIG. 1), of the impedance matching model 104 to determine the second complex voltage and current, which is at the output of the impedance matching model 104. For example, with reference to FIG. 3B, when the 2 MHz RF generator is on, e.g., operational, powered on, coupled to the devices, such as, for example, the impedance matching model 104, of the plasma system 126, etc., a complex voltage and current Vx1, Ix1, and φx1, e.g., an intermediate complex voltage and current, which includes the voltage magnitude Vx1, the current magnitude Ix1, and the phase φx1 between the complex voltage and current, at a node 251, e.g., an intermediate node, is determined based on a capacitance of a capacitor 253, based on a capacitance of a capacitor C5, and based on the first complex voltage and current that is received at an input 255. Moreover, a complex voltage and current Vx2, Ix2, and φx2 at a node 257 is determined based on the complex voltage and current Vx1, Ix1, and φx1, and based on an inductance of an inductor L3. The complex voltage and current Vx2, Ix2, and φx2 includes the voltage magnitude Vx2, the current magnitude Ix2, and the phase φx2 between the voltage and current. When the 27 MHz RF generator and the 60 MHz RF generator are off, e.g., nonoperational, powered off, decoupled from the impedance matching model 104, etc., a complex voltage and current V2, I2, and φ2 is determined to be the second complex voltage and current at an output 259, which is an example of the output, e.g., the model node N4m (FIG. 1), of the impedance matching model 104 (FIG. 1). The complex voltage and current V2, I2, and φ2 is determined based on the complex voltage and current Vx2, Ix2, and φx2 and an inductor of an inductor L2. The complex voltage and current V2, I2, and φ2 includes the voltage magnitude V2, the current magnitude I2, and the phase φ2 between the voltage and current.

Similarly, when 27 MHz RF generator is on and the 2 MHz and the 60 MHz RF generators are off, a complex voltage and current V27, I27, and φ27 at the output 259 is determined based on a complex voltage and current received at a node 261 and characteristics of an inductor LPF2, a capacitor C3, a capacitor C4, and an inductor L2. The complex voltage and current V27, I27, and φ27 includes the voltage magnitude V27, the current magnitude I27, and the phase φ27 between the voltage and current. The complex voltage and current received at the node 261 is the same as the complex voltage and current measured at the node N5 (FIG. 1). When both the 2 MHz and 27 MHz RF generators are on and the 60 MHz RF generator is off, the complex voltages and currents V2, I2, φ2, V27, I27, and φ27 are an example of the second complex voltage and current. Moreover, similarly, when the 60 MHz RF generator is on and the 2 and 27 MHz RF generators are off, a complex voltage and current V60, I60, and φ60 at the output 259 is determined based on a complex voltage and current received at a node 265 and characteristics of an inductor LPF1, a capacitor C1, a capacitor C2, an inductor L4, a capacitor 269, and an inductor L1. The complex voltage and current V60, I60, and φ60 includes the voltage magnitude V60, the current magnitude I60, and the phase φ60 between the voltage and current. When the 2 MHz, 27 MHz, and the 60 MHz RF generators are on, the complex voltages and currents V2, I2, φ2, V27, I27, φ27, V60, I60, and φ60 are an example of the second complex voltage and current.

In an operation 117, the RF transmission model 161 (FIG. 1) is generated based on the electrical components of the RF transmission line 113 (FIG. 1). For example, connections between electrical components of the RF transmission line 113 and characteristics of the electrical components are provided to the processor of the host system 130 by the user via an input device that is coupled with the host system 130. Upon receiving the connections and the characteristics, the processor generates elements that have the same characteristics as that of electrical components of the RF transmission line 113 and generates connections between the elements that are the same as that between the electrical components.

In an operation 119, the second complex voltage and current is propagated through one or more elements of the RF transmission model portion 173 from the input of the RF transmission model 161 to the output, e.g., the model node N1m (FIG. 1), of the RF transmission model portion 173 to determine the third complex voltage and current at the output of the RF transmission model portion 173. For example, with reference to FIG. 5B, when the 2 MHz RF generator is on and the 27 and 60 MHz RF generators are off, a complex voltage and current Vx4, Ix4, and φx4, e.g., an intermediate complex voltage and current, at a node 293, e.g., an intermediate node, is determined based on an inductance of an inductor Ltunnel, based on a capacitance of a capacitor Ctunnel, and based on the complex voltage and current V2, I2, and φ2 (FIG. 3B), which is an example of the second complex voltage and current. It should be noted that Ltunnel is an inductance of a computer-generated model of an RF tunnel and Ctunnel is a capacitance of the RF tunnel model. Moreover, a complex voltage and current V21, I21, and φ21 at an output 297 of a tunnel and strap model 210 is determined based on the complex voltage and current Vx4, Ix4, and φx4, and based on an inductance of an inductor Lstrap. The output 297 is an example of the output, e.g., the model node N1m (FIG. 1), of the portion 173 (FIG. 1). It should be noted that Lstrap is an inductance of a computer-generated model of the RF strap. When the 2 MHz RF generator is on and the 27 and 60 MHz RF generators are off, the complex voltage and current V21, I21, and φ21 is determined to be the third complex voltage and current at the output 297.

Similarly, when the 27 MHz RF generator is on and the 2 and 60 MHz RF generators are off, a complex voltage and current V271, I271, and φ271 at the output 297 is determined based on the complex voltage and current V27, I27, φ27 (FIG. 3B) at the output 259 and characteristics of the inductor Ltunnel, the capacitor Ctunnel, and the inductor Lstrap. When both the 2 MHz and 27 MHz RF generators are on and the 60 MHz RF generator is off, the complex voltages and currents V21, I21, φ21, V271, I271, and φ271 are an example of the third complex voltage and current.

Moreover, similarly, when the 60 MHz RF generator is powered on and the 2 and 27 MHz RF generators are powered off, a complex voltage and current V601, I601, and φ601 at the output 297 is determined based on the complex voltage and current V60, I60, and φ60 (FIG. 3B) received at a node 259 and characteristics of the inductor Ltunnel, the capacitor Ctunnel, and the inductor Lstrap. When the 2 MHz, 27 MHz, and the 60 MHz RF generators are on, the complex voltages and currents V21, I21, φ21, V271, I271, φ271, V601, I601, and φ601 are an example of the third complex voltage and current. The method 102 ends after the operation 119.

Figure 3A:
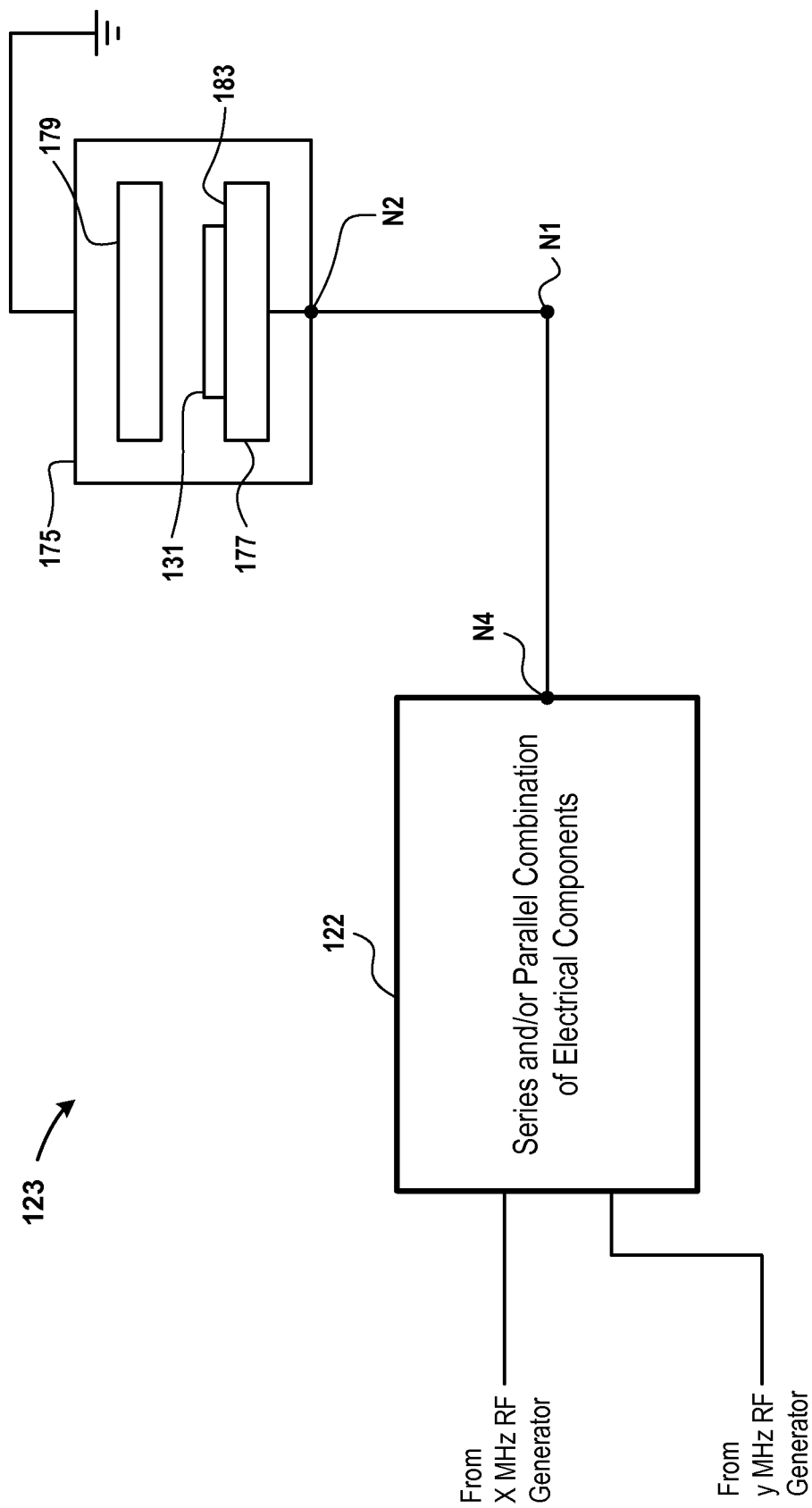
FIG. 3A is a block diagram of a system used to illustrate an impedance matching circuit, in accordance with an embodiment described in the present disclosure.

FIG. 3A is a block diagram of an embodiment of a system 123 used to illustrate an impedance matching circuit 122. The impedance matching circuit 122 is an example of the impedance matching circuit 114 (FIG. 1). The impedance matching circuit 122 includes series connections between electrical components and/or parallel connections between electrical components.

Figure 3B:
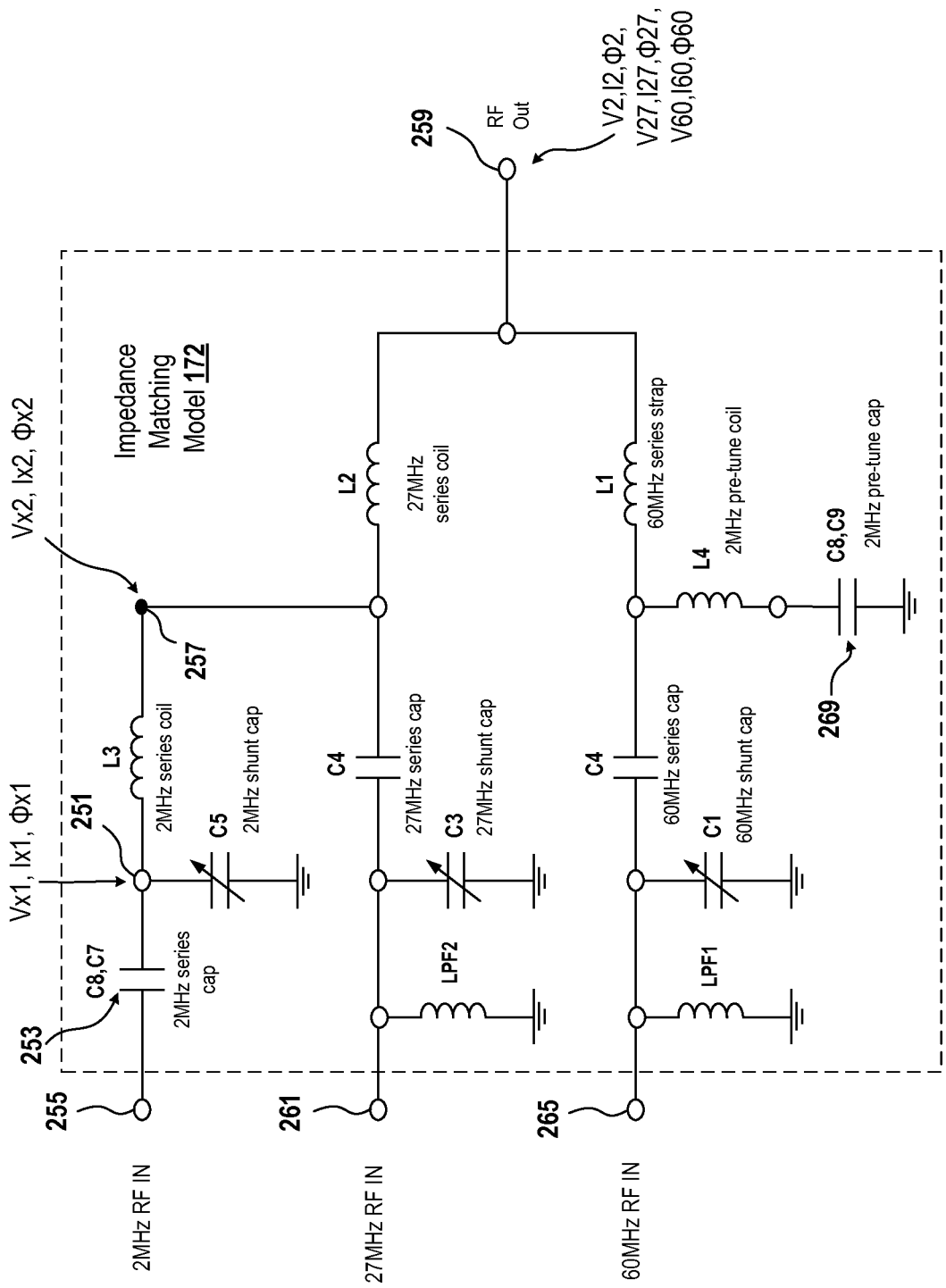
FIG. 3B is a circuit diagram of an impedance matching model, in accordance with an embodiment described in the present disclosure.

FIG. 3B is a circuit diagram of an embodiment of an impedance matching model 172. The impedance matching model 172 is an example of the impedance matching model 104 (FIG. 1). As shown, the impedance matching model 172 includes capacitors having capacitances C1 thru C9, inductors having inductances LPF1, LPF2, and L1 thru L4. It should be noted that the manner in which the inductors and/or capacitors are coupled with each other in FIG. 3B is an example. For example, the inductors and/or capacitors shown in FIG. 3B can be coupled in a series and/or parallel manner with each other. Also, in some embodiments, the impedance matching model 172 includes a different number of capacitors and/or a different number of inductors than that shown in FIG. 3B.

Figure 4:
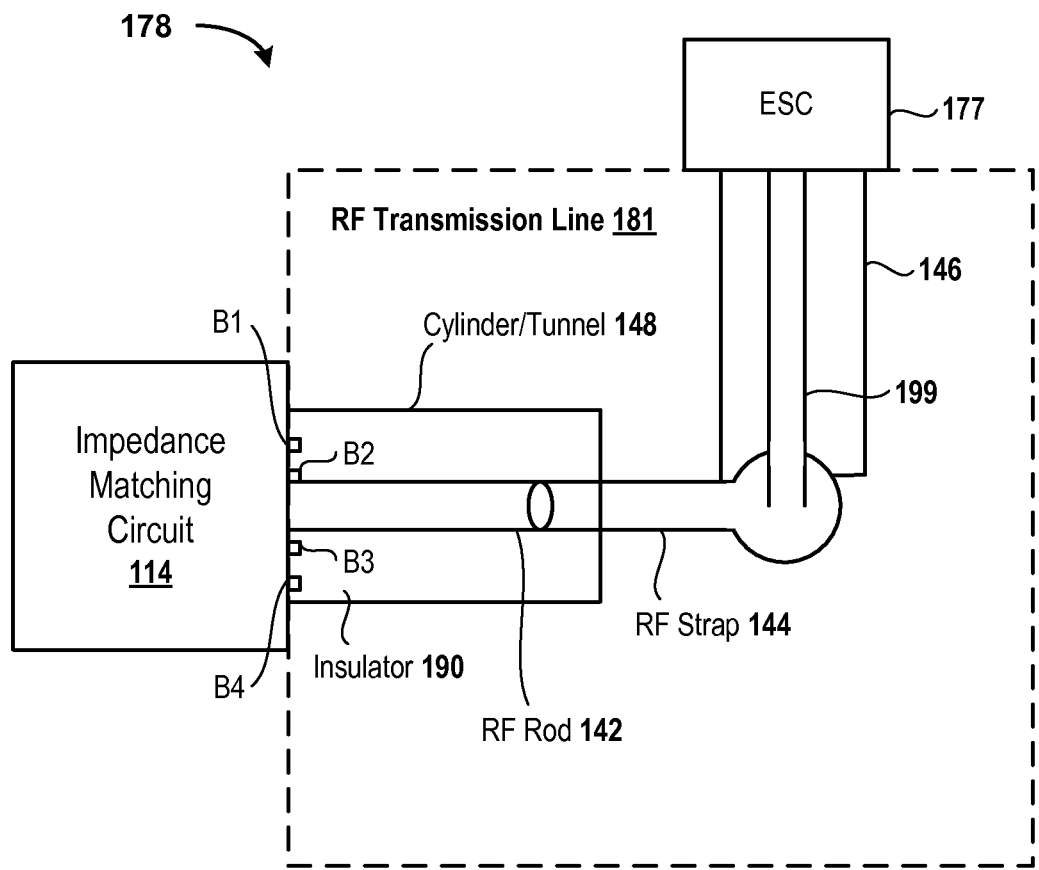
FIG. 4 is a diagram of a system used to illustrate an RF transmission line, in accordance with an embodiment described in the present disclosure.

FIG. 4 is a diagram of an embodiment of a system 178 used to illustrate an RF transmission line 181, which is an example of the RF transmission line 113 (FIG. 1). The RF transmission line 181 includes a cylinder 148, e.g., a tunnel. Within a hollow of the cylinder 148 lies an insulator 190 and an RF rod 142. A combination of the cylinder 148 and the RF rod 142 is an example of the portion 169 (FIG. 1) of the RF transmission line 113 (FIG. 1). The RF transmission line 181 is bolted via bolts B1, B2, B3, and B4 with the impedance matching circuit 114. In one embodiment, the RF transmission line 181 is bolted via any number of bolts with the impedance matching circuit 114. In some embodiments, instead of or in addition to bolts, any other form of attachment, e.g., glue, screws, etc., is used to attach the RF transmission line 181 to the impedance matching circuit 114.

The RF transmission rod 142 is coupled with the output of the impedance matching circuit 114. Also, an RF strap 144, also known as RF spoon, is coupled with the RF rod 142 and with an RF rod 199, a portion of which is located within a support 146, e.g., a cylinder. The support 146 that includes the RF rod 199 is an example of the portion 195 (FIG. 1). In an embodiment, a combination of the cylinder 148, the RF rod 142, the RF strap 144, the support 146 and the RF rod 199 forms the RF transmission line 181, which is an example of the RF transmission line 113 (FIG. 1). The support 146 provides support to the plasma chamber. The support 146 is attached to the ESC 177 of the plasma chamber. An RF signal is supplied from the x MHz generator via the cable 150, the impedance matching circuit 114, the RF rod 142, the RF strap 144, and the RF rod 199 to the ESC 177.

In one embodiment, the ESC 177 includes a heating element and an electrode on top of the heating element. In an embodiment, the ESC 177 includes a heating element and the lower electrode. In one embodiment, the ESC 177 includes the lower electrode and a heating element, e.g., coil wire, etc., embedded within holes formed within the lower electrode. In some embodiments, the electrode is made of a metal, e.g., aluminum, copper, etc. It should be noted that the RF transmission line 181 supplies an RF signal to the lower electrode of the ESC 177.

Figure 5A:
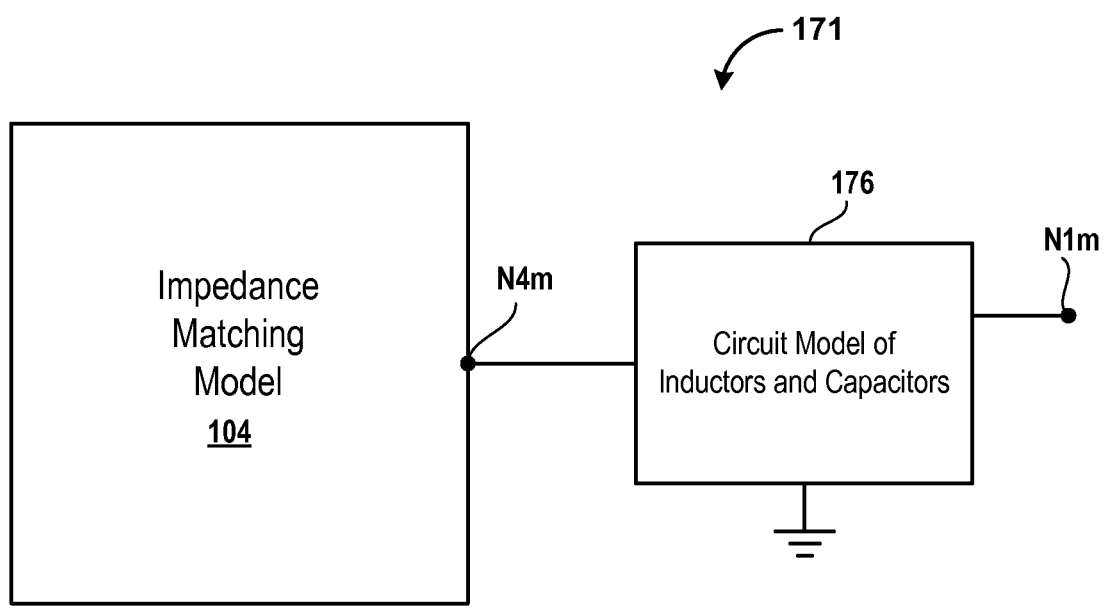
FIG. 5A is a block diagram of a system used to illustrate a circuit model of the RF transmission line, in accordance with an embodiment described in the present disclosure.

FIG. 5A is a block diagram of an embodiment of a system 171 used to illustrate a circuit model 176 of the RF transmission line 113 (FIG. 1). For example, the circuit model 176 includes inductors and/or capacitors, connections between the inductors, connections between the capacitors, and/or connections between the inductors and the capacitors. Examples of connections include series and/or parallel connections. The circuit model 176 is an example of the RF transmission model 161 (FIG. 1).

Figure 5B:
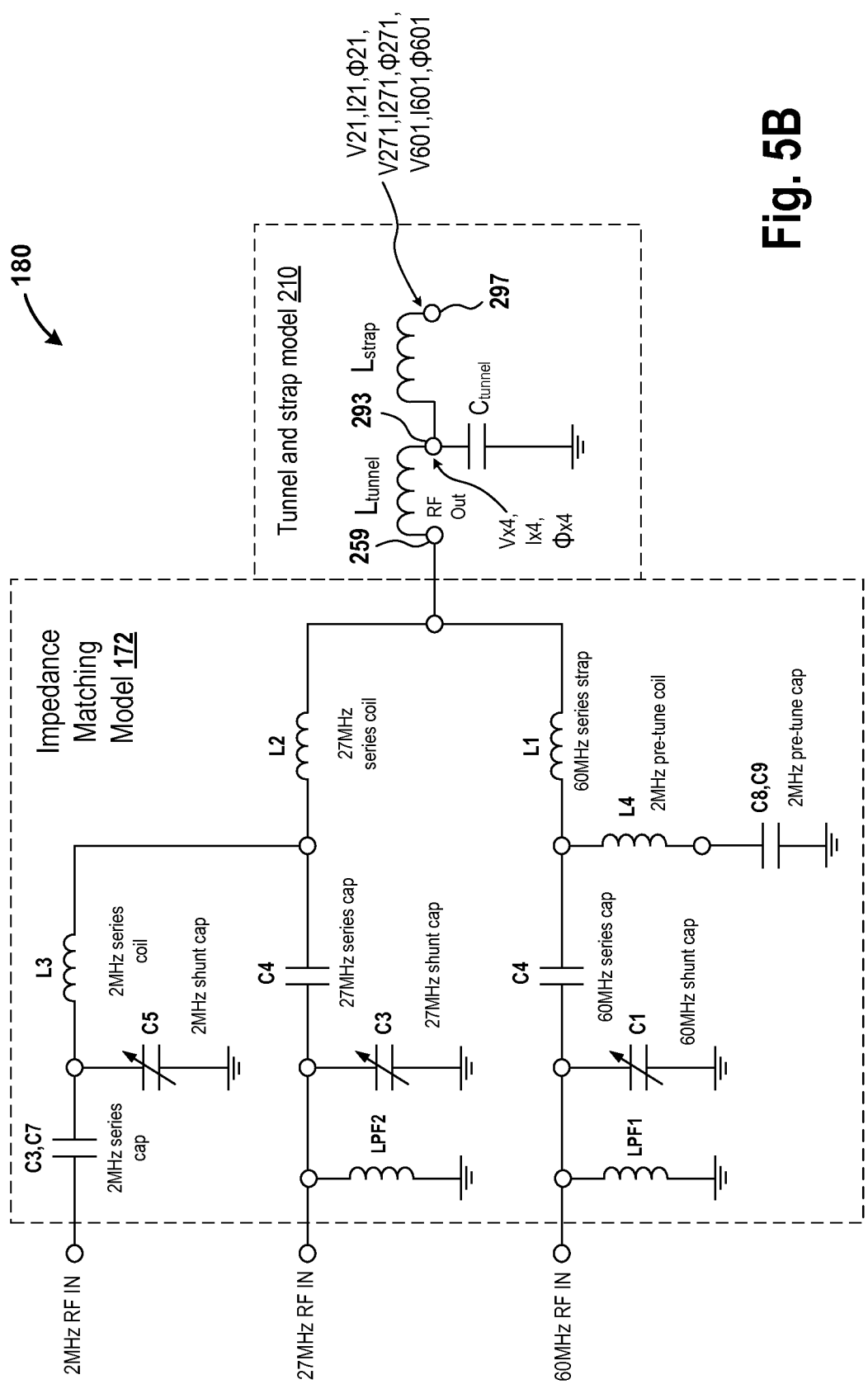
FIG. 5B is a diagram of an electrical circuit used to illustrate a tunnel and strap model of the RF transmission model, in accordance with an embodiment described in the present disclosure.

FIG. 5B is a diagram of an embodiment of an electrical circuit 180 used to illustrate the tunnel and strap model 210, which is an example of the portion 173 (FIG. 1) of the RF transmission model 161 (FIG. 1). The electrical circuit 180 includes the impedance matching model 172 and the tunnel and strap model 210. The tunnel and strap model 210 includes inductors Ltunnel and Lstrap and a capacitor Ctunnel. It should be noted that the inductor Ltunnel represents an inductance of the cylinder 148 (FIG. 4) and the RF rod 142 and the capacitor Ctunnel represents a capacitance of the cylinder 148 and the RF rod 142. Moreover, the inductor Lstrap represents an inductance of the RF strap 144 (FIG. 4).

In an embodiment, the tunnel and strap model 210 includes any number of inductors and/or any number of capacitors. In this embodiment, the tunnel and strap model 210 includes any manner, e.g., serial, parallel, etc. of coupling a capacitor to another capacitor, coupling a capacitor to an inductor, and/or coupling an inductor to another inductor.

Figure 5C:
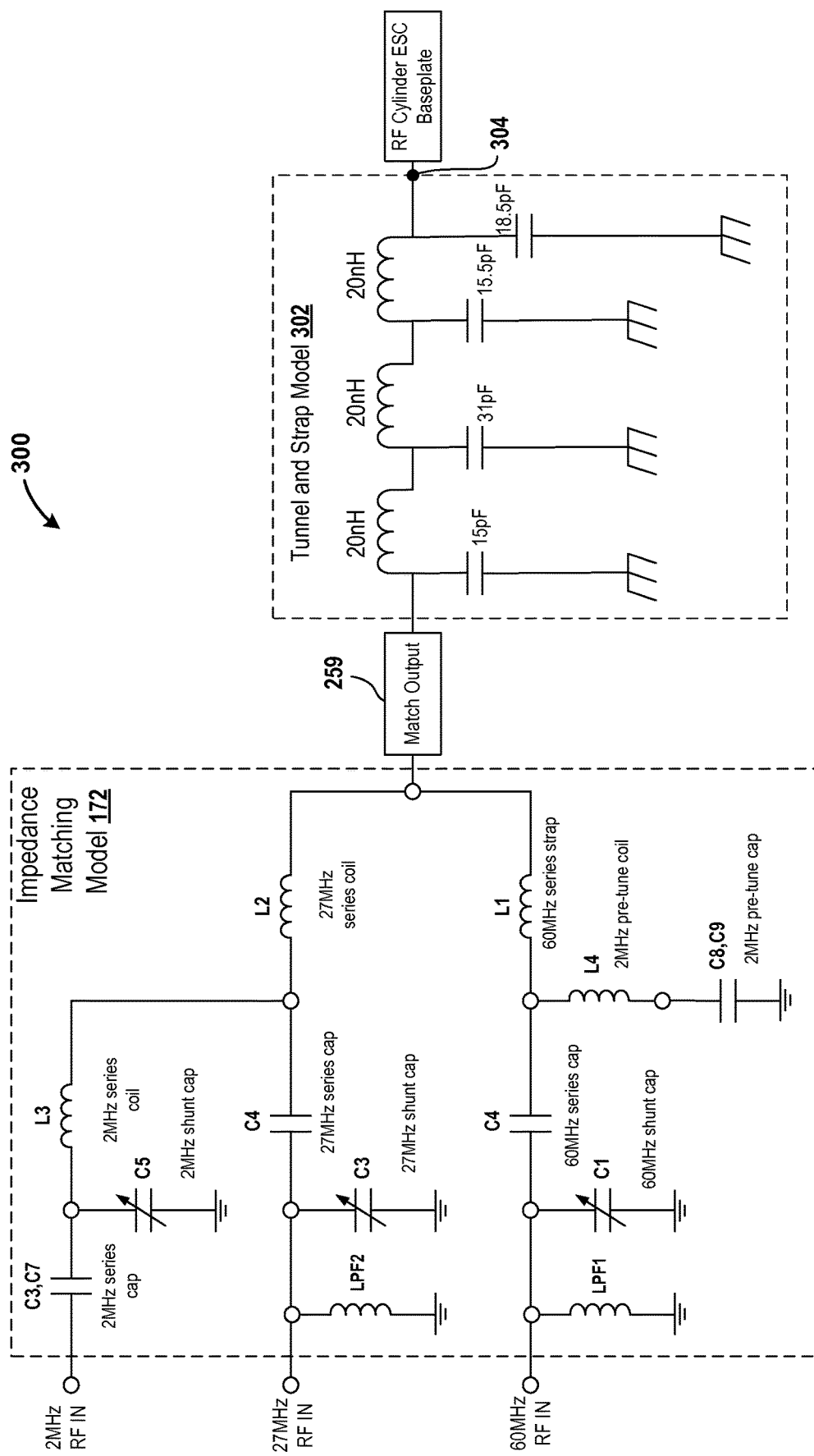
FIG. 5C is a diagram of an electrical circuit used to illustrate a tunnel and strap model, in accordance with an embodiment described in the present disclosure.

FIG. 5C is a diagram of an embodiment of an electrical circuit 300 used to illustrate a tunnel and strap model 302, which is an example of the portion 173 (FIG. 1) of the RF transmission model 161 (FIG. 1). The tunnel and strap model 302 is coupled via the output 259 to the impedance matching model 172. The tunnel and strap model 302 includes inductors having inductances 20 nanoHenry (nH) and capacitors having capacitances of 15 picoFarads (pF), 31 pF, 15.5 pF, and 18.5 pF. The tunnel and strap model 302 is coupled via a node 304 to an RF cylinder, which is coupled to the ESC 177 (FIG. 1). The RF cylinder is an example of the portion 195 (FIG. 1).

It should be noted that in some embodiments, the inductors and capacitors of the tunnel and strap model 302 have other values. For example, the 20 nH inductors have an inductance ranging between 15 and 20 nH or between 20 and 25 nH. As another example, two or more of the inductors of the tunnel and strap model 302 have difference inductances. As yet another example, the 15 pF capacitor has a capacitance ranging between 8 pF and 25 pF, the 31 pF capacitor has a capacitance ranging between 15 pF and 45 pF, the 15.5 pF capacitor has a capacitance ranging between 9 pF and 20 pF, and the 18.5 pF capacitor has a capacitance ranging between 10 pF and 27 pF.

In various embodiments, any number of inductors are included in the tunnel and strap model 302 and any number of capacitors are included in the tunnel and strap model 302.

Figure 6:
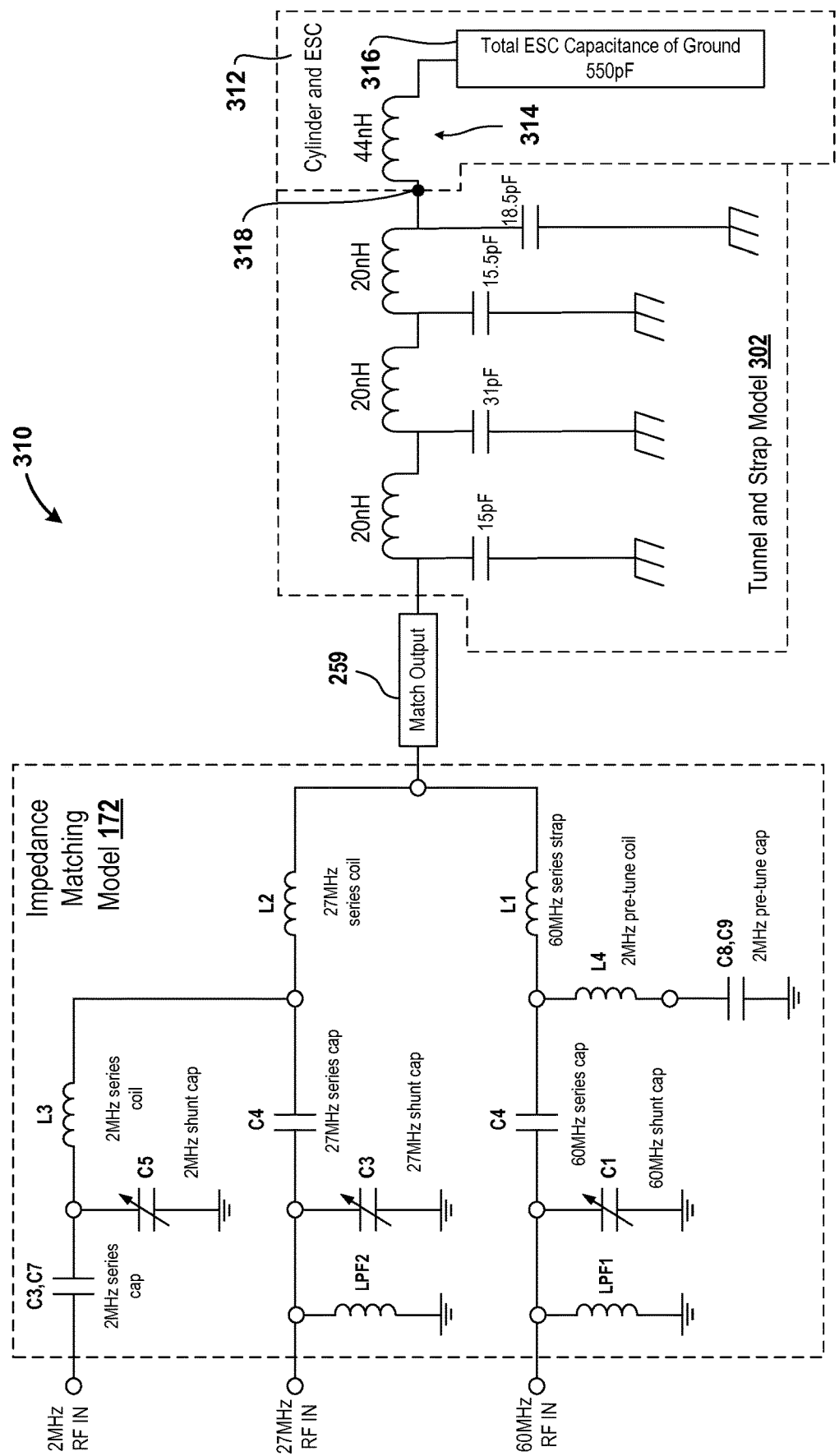
FIG. 6 is a diagram of an electrical circuit used to illustrate a cylinder and ESC model, in accordance with an embodiment described in the present disclosure.

FIG. 6 is a diagram of an embodiment of an electrical circuit 310 used to illustrate a cylinder and ESC model 312, which is a combination of an inductor 314 and a capacitor 316. The cylinder and ESC model 312 includes a cylinder model and an ESC model, which is an example of the ESC model 125 (FIG. 1). The cylinder model is an example of the portion 197 (FIG. 1) of the RF transmission model 161 (FIG. 1). The cylinder and ESC model 312 has similar characteristics as that of a combination of the portion 195 and the ESC 177 (FIG. 1). For example, the cylinder and ESC model 312 has the same resistance as that of a combination of the portion 195 and the ESC 177. As another example, the cylinder and ESC model 312 has the same inductance as that of a combination of the portion 195 and the ESC 177. As yet another example, the cylinder and ESC model 312 has the same capacitance as that of a combination of the portion 195 and the ESC 177. As yet another example, the cylinder and ESC model 312 has the same inductance, resistance, capacitance, or a combination thereof, as that of a combination of the portion 195 and the ESC 177.

The cylinder and ESC model 312 is coupled via a node 318 to the tunnel and strap model 302. The node 318 is an example of the model node N1m (FIG. 1).

It should be noted that in some embodiments, an inductor having an inductance other than the 44 milliHenry (mH) is used in the cylinder and ESC model 312. For example, an inductor having an inductance ranging from 35 mH to 43.9 mH or from 45.1 mH too 55 mH is used. In various embodiments, a capacitor having a capacitance other than 550 pF is used. For example, instead of the 550 pF capacitor, a capacitor having a capacitance ranging between 250 and 550 pF or between 550 and 600 pF is used.

The processor of the host system 130 (FIG. 1) calculates a combined impedance, e.g., total impedance, etc., of a combination of the model 172, the tunnel and strap model 302, and the cylinder and ESC model 312. The combined impedance and complex voltage and current determined at the model node 318 are used as inputs by the processor of the host system 130 to calculate a complex voltage and impedance at the node N6$m$. It should be noted that an output of the cylinder and ESC model 312 is the model node N6$m$.

Figure 7:
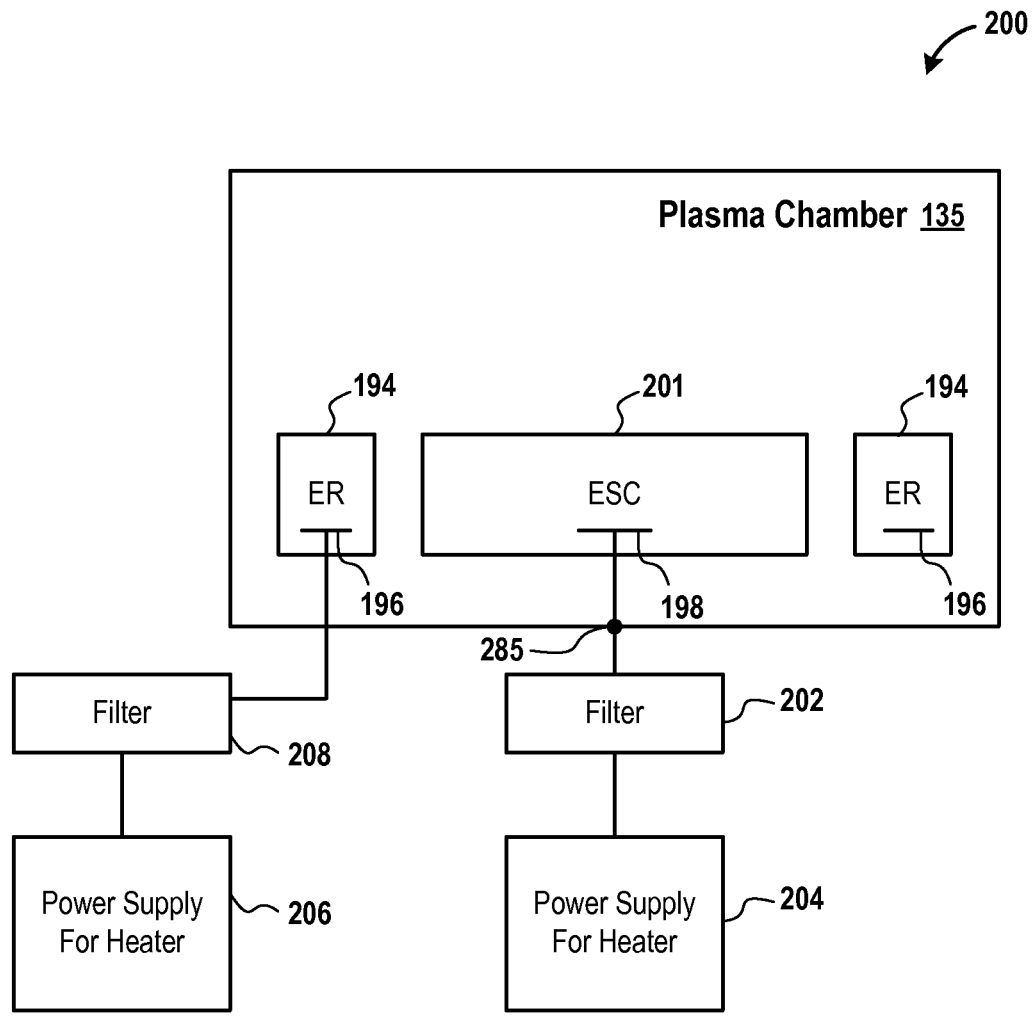
FIG. 7 is a block diagram of a plasma system that includes filters used to determine the variable, in accordance with an embodiment described in the present disclosure.

FIG. 7 is a block diagram of an embodiment of a system 200 that is used to determine a variable. The system 200 includes a plasma chamber 135, which further includes an ESC 201 and has an input 285. The plasma chamber 135 is an example of the plasma chamber 175 (FIG. 1) and the ESC 201 is an example of the ESC 177 (FIG. 1). The ESC 201 includes a heating element 198. Also, the ESC 201 is surrounded by an edge ring (ER) 194. The ER 194 includes a heating element 196. In an embodiment, the ER 194 facilitates a uniform etch rate and reduced etch rate drift near an edge of the workpiece 131 that is supported by the ESC201.

A power supply 206 provides power to the heating element 196 via a filter 208 to heat the heating element 196 and a power supply 204 provides power to the heating element 198 via a filter 202 to heat the heating element 198. In an embodiment, a single power supply provides power to both the heating elements 196 and 198. The filter 208 filters out predetermined frequencies of a power signal that is received from the power supply 206 and the filter 202 filters out predetermined frequencies of a power signal that is received from the power supply 204.

The heating element 198 is heated by the power signal received from the power supply 204 to maintain an electrode of the ESC 201 at a desirable temperature to further maintain an environment within the plasma chamber 135 at a desirable temperature. Moreover, the heating element 196 is heated by the power signal received from the power supply 206 to maintain the ER 194 at a desirable temperature to further maintain an environment within the plasma chamber 135 at a desirable temperature.

It should be noted that in an embodiment, the ER 194 and the ESC 201 include any number of heating elements and any type of heating elements. For example, the ESC 201 includes an inductive heating element or a metal plate. In one embodiment, each of the ESC 201 and the ER 194 includes one or more cooling elements, e.g., one or more tubes that allow passage of cold water, etc., to maintain the plasma chamber 135 at a desirable temperature.

It should further be noted that in one embodiment, the system 200 includes any number of filters. For example, the power supplies 204 and 206 are coupled to the ESC 201 and the ER 194 via a single filter.

Figure 8A:
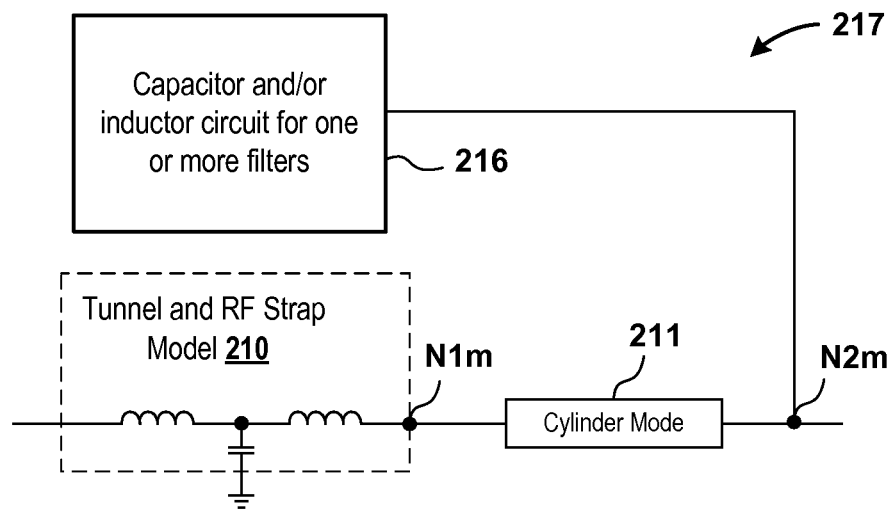
FIG. 8A is a diagram of a system used to illustrate a model of the filters to improve an accuracy of the variable, in accordance with an embodiment described in the present disclosure.

FIG. 8A is a diagram of an embodiment of a system 217 used to illustrate a model of the filters 202 and 208 (FIG. 7) to improve an accuracy of the variable. The system 217 includes the tunnel and strap model 210 that is coupled via a cylinder model 211 to a model 216, which includes capacitors and/or inductors and connections there between of the filters 202 and 208. The model 216 is stored within the storage HU 162 (FIG. 1) and/or the other storage HU. The capacitors and/or inductors of the model 216 are coupled with each other in a manner, e.g., a parallel manner, a serial manner, a combination thereof, etc. The model 216 represents capacitances and/or inductances of the filters 202 and 208.

Moreover, the system 217 includes the cylinder model 211, which is a computer-generated model of the RF rod 199 (FIG. 4) and the support 146 (FIG. 4). The cylinder model 211 has similar characteristics as that of electrical components of the RF rod 199 and the support 146. The cylinder model 211 includes one or more capacitors, one or more inductors, connections between the inductors, connections between the capacitors, and/or connections between a combination of the capacitors and inductors.

The processor of the host system 130 (FIG. 1) calculates a combined impedance, e.g., total impedance, etc., of the model 216, the tunnel and strap model 210, and the cylinder model 211. The combined impedance provides a complex voltage and impedance at the node N2$m$. With the inclusion of the model 216 and the tunnel and strap model 210 in determining the variable at the node N2$m$, accuracy of the variable is improved. It should be noted that an output of the model 216 is the model node N2$m$.

Figure 8B:
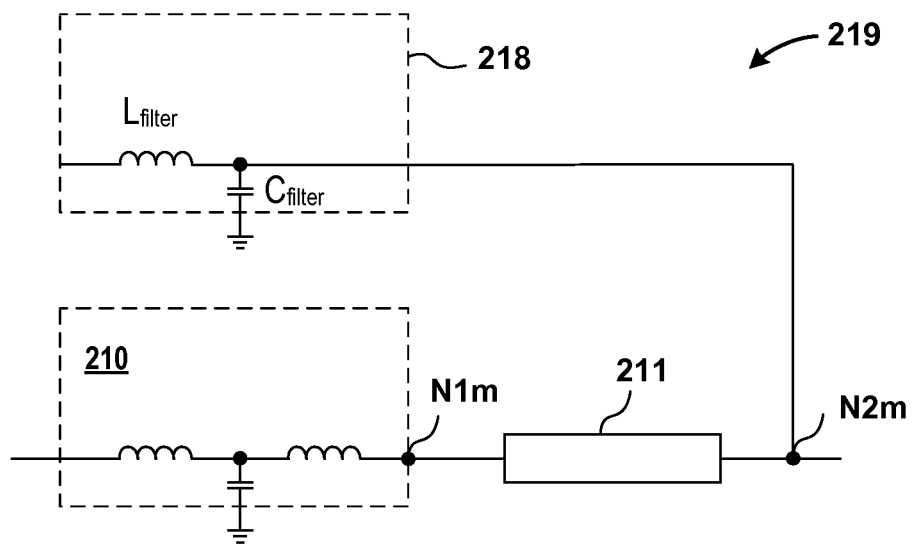
FIG. 8B is a diagram of a system used to illustrate a model of the filters, in accordance with an embodiment described in the present disclosure.

FIG. 8B is a diagram of an embodiment of a system 219 used to illustrate a model of the filters 202 and 208 (FIG. 7) to improve an accuracy of the variable. The system 219 includes the tunnel and strap model 210 and a model 218, which is coupled in parallel to the tunnel and strap model 210. The model 218 is an example of the model 216 (FIG. 8A). The model 218 includes an inductor Lfilter, which represents a combined inductance of the filters 202 and 208. The model 218 further includes a capacitor Cfilter, which represents directed combined capacitance of the filters 202 and 208.

Figure 9:
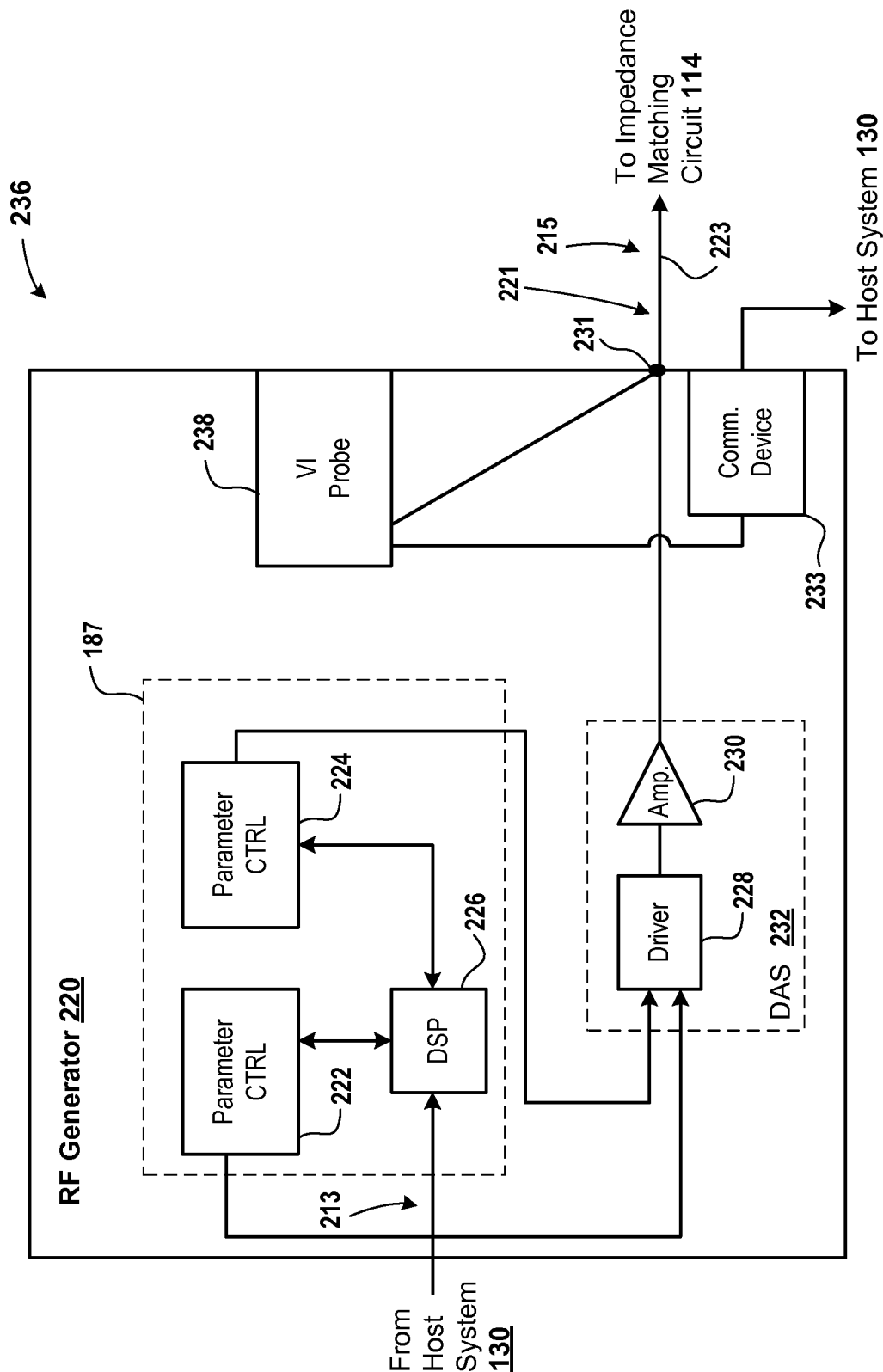
FIG. 9 is a block diagram of a system for using a current and voltage probe to measure the variable at an output of an RF generator of the system of FIG. 1, in accordance with one embodiment described in the present disclosure.

FIG. 9 is a block diagram of an embodiment of a system 236 for using a voltage and current probe 238 to measure a variable at an output 231 of an RF generator 220. The output 231 is an example of the node N3 (FIG. 1) or of the node N5 (FIG. 1). The RF generator 220 is an example of the x MHz generator or the y MHz generator (FIG. 1). The host system 130 generates and provides a digital pulsing signal 213 having two or more states to a digital signal processor (DSP) 226. In one embodiment, the digital pulsing signal 213 is a transistor-transistor logic (TTL) signal. Examples of the states include an on state and an off state, a state having a digital value of 1 and a state having a digital value of 0, a high state and a low state, etc.

In another embodiment, instead of the host system 130, a clock oscillator, e.g., a crystal oscillator, etc., is used to generate an analog clock signal, which is converted by an analog-to-digital converter into a digital signal similar to the digital pulsing signal 213.

The digital pulsing signal 213 is sent to the DSP 226. The DSP 226 receives the digital pulsing signal 213 and identifies the states of the digital pulsing signal 213. For example, the DSP 226 determines that the digital pulsing signal 213 has a first magnitude, e.g., the value of 1, the high state magnitude, etc., during a first set of time periods and has a second magnitude, e.g., the value of 0, the low state magnitude, etc., during a second set of time periods. The DSP 226 determines that the digital pulsing signal 213 has a state S1 during the first set of time periods and has a state S0 during the second set of time periods. Examples of the state S0 include the low state, the state having the value of 0, and the off state. Examples of the state S1 include the high state, the state having the value of 1, and the on state. As yet another example, the DSP 226 compares a magnitude of the digital pulsing signal 213 with a pre-stored value to determine that the magnitude of the digital pulsing signal 213 is greater than the pre-stored value during the first set of time periods and that the magnitude during the state S0 of the digital pulsing signal 213 is not greater than the pre-stored value during the second set of time periods. In the embodiment in which the clock oscillator is used, the DSP 226 receives an analog clock signal from the clock oscillator, converts the analog signal into a digital form, and then identifies the two states S0 and S1.

When a state is identified as S1, the DSP 226 provides a power value P1 and/or a frequency value F1 to a parameter control 222. Moreover, when the state is identified as S0, the DSP 226 provides a power value P0 and/or a frequency value F0 to a parameter control 224. An example of a parameter control that is used to tune a frequency includes an auto frequency tuner (AFT).

It should be noted that the parameter control 222, the parameter control 224, and the DSP 226 are portions of a control system 187. For example, the parameter control 222 and the parameter control 224 are logic blocks, e.g., tuning loops, etc., which are portions of a computer program that is executed by the DSP 226. In some embodiments, the computer program is embodied within a non-transitory computer-readable medium, e.g., a storage HU.

In an embodiment, a controller, e.g., hardware controller, ASIC, PLD, etc., is used instead of a parameter control. For example, a hardware controller is used instead of the parameter control 222 and another hardware controller is used instead of the parameter control 224.

Upon receiving the power value P1 and/or the frequency value F1, the parameter control 222 provides the power value P1 and/or the frequency value F1 to a driver 228 of a drive and amplifier system (DAS) 232. Examples of a driver includes a power driver, a current driver, a voltage driver, a transistor, etc. The driver 228 generates an RF signal having the power value P1 and/or the frequency value F1 and provides the RF signal to an amplifier 230 of the DAS 232.

In one embodiment, the driver 228 generates an RF signal having a drive power value that is a function of the power value P1 and/or having a drive frequency value that is a function of the frequency value F1. For example, the drive power value is within a few watts, e.g. 1 thru 5 watts, etc., of the power value P1 and the drive frequency value is within a few Hz, e.g. 1 thru 5 Hz, etc., of the frequency value F1.

The amplifier 230 amplifies the RF signal having the power value P1 and/or the frequency value F1 and generates an RF signal 215 that corresponds to the RF signal received from the driver 228. For example, the RF signal 215 has a higher amount of power than that of the power value P1. As another example, the RF signal 215 has the same amount of power as that of the power value P1. The RF signal 215 is transferred via a cable 223 and the impedance matching circuit 114 to the ESC 177 (FIG. 1).

The cable 223 is an example of the cable 150 or the cable 152 (FIG. 1). For example, when the RF generator 220 is an example of the x MHz RF generator (FIG. 1), the cable 223 is an example of the cable 150 and when the RF generator 220 is an example of the y MHz RF generator (FIG. 1), the cable 223 is an example of the cable 152.

When the power value P1 and/or the frequency value F1 are provided to the DAS 232 by the parameter control 222 and the RF signal 215 is generated, the voltage and current probe 238 measures values of the variable at the output 231 that is coupled to the cable 223. The voltage and current probe 238 is an example of the voltage and current probe 110 or the voltage and current probe 111 (FIG. 1). The voltage and current probe 238 sends the values of the variable via a communication device 233 to the host system 130 for the host system 130 to execute the method 102 (FIG. 2) and methods 340, 351, and 363 (FIGS. 13, 15, and 17) described herein. The communication device 233 is an example of the communication device 185 or 189 (FIG. 1). The communication device 233 applies a protocol, e.g., Ethernet, EtherCAT, USB, serial, parallel, packetization, depacketization, etc., to transfer data from the voltage and current probe 238 to the host system 130. In various embodiments, the host system 130 includes a communication device that applies the protocol applied by the communication device 233. For example, when the communication 233 applies packetization, the communication device of the host system 130 applies depacketization. As another example, when the communication device 233 applies a serial transfer protocol, the communication device of the host system 130 applies a serial transfer protocol.

Similarly, upon receiving the power value P0 and/or the frequency value F0, the parameter control 224 provides the power value P0 and/or the frequency value F0 to the driver 228. The driver 228 creates an RF signal having the power value P0 and/or the frequency value F0 and provides the RF signal to the amplifier 230.

In one embodiment, the driver 228 generates an RF signal having a drive power value that is a function of the power value P0 and/or having a drive frequency value that is a function of the frequency value F0. For example, the drive power value is within a few, e.g. 1 thru 5, watts of the power value P0 and the drive frequency value is within a few, e.g. 1 thru 5, Hz of the frequency value F0.

The amplifier 230 amplifies the RF signal having the power value P0 and/or the frequency value F0 and generates an RF signal 221 that corresponds to the RF signal received from the driver 228. For example, the RF signal 221 has a higher amount of power than that of the power value P0. As another example, the RF signal 221 has the same amount of power as that of the power value P0. The RF signal 221 is transferred via the cable 223 and the impedance matching circuit 114 to ESC 177 (FIG. 1).

Figure 17:
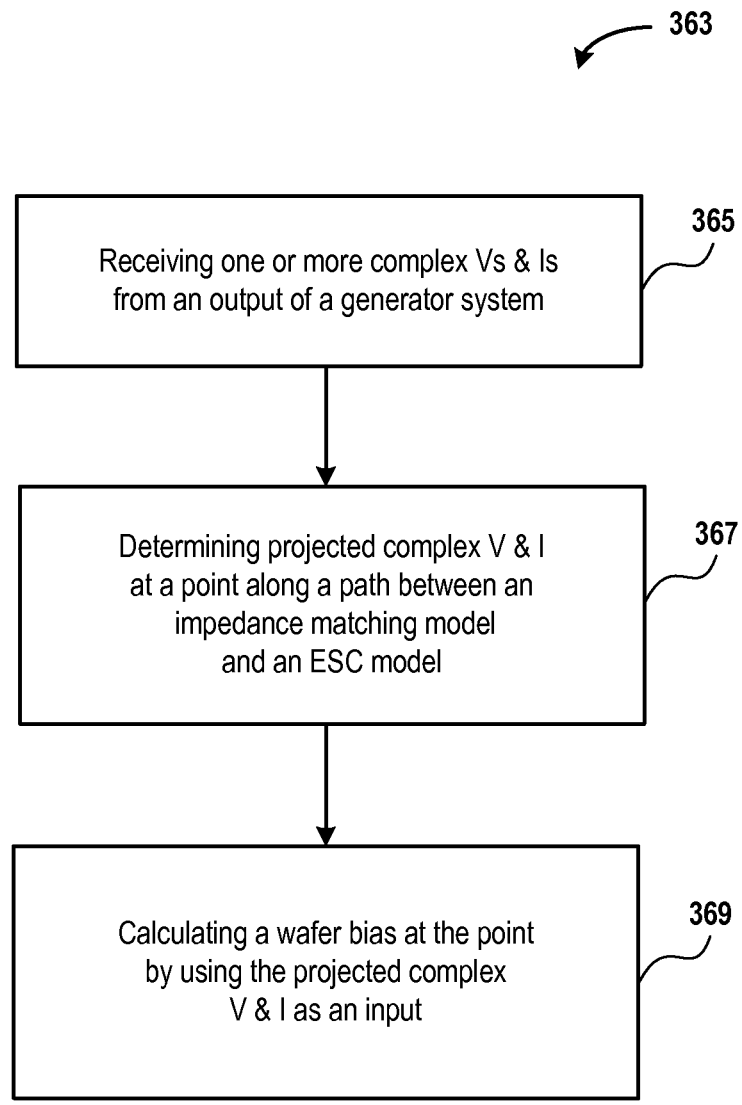
FIG. 17 is a flowchart of a method for determining a wafer bias at a model node of the system of FIG. 1, in accordance with an embodiment described in the present disclosure.

When the power value P0 and/or the frequency value F0 are provided to the DAS 232 by the parameter control 224 and the RF signal 221 is generated, the voltage and current probe 238 measures values of the variable at the output 231. The voltage and current probe 238 sends the values of the variable to the host system 130 for the host system 130 to execute the method 102 (FIG. 2), the method 340 (FIG. 13), the method 351 (FIG. 15), or the method 363 (FIG. 17).

It should be noted that the in one embodiment, the voltage and current probe 238 is decoupled from the DSP 226. In some embodiments, the voltage and current probe 238 is coupled to the DSP 226. It should further be noted that the RF signal 215 generated during the state S1 and the RF signal 221 generated during the state S0 are portions of a combined RF signal. For example, the RF signal 215 is a portion of the combined RF signal that has a higher amount of power than the RF signal 221, which is another portion of the combined RF signal.

Figure 10:
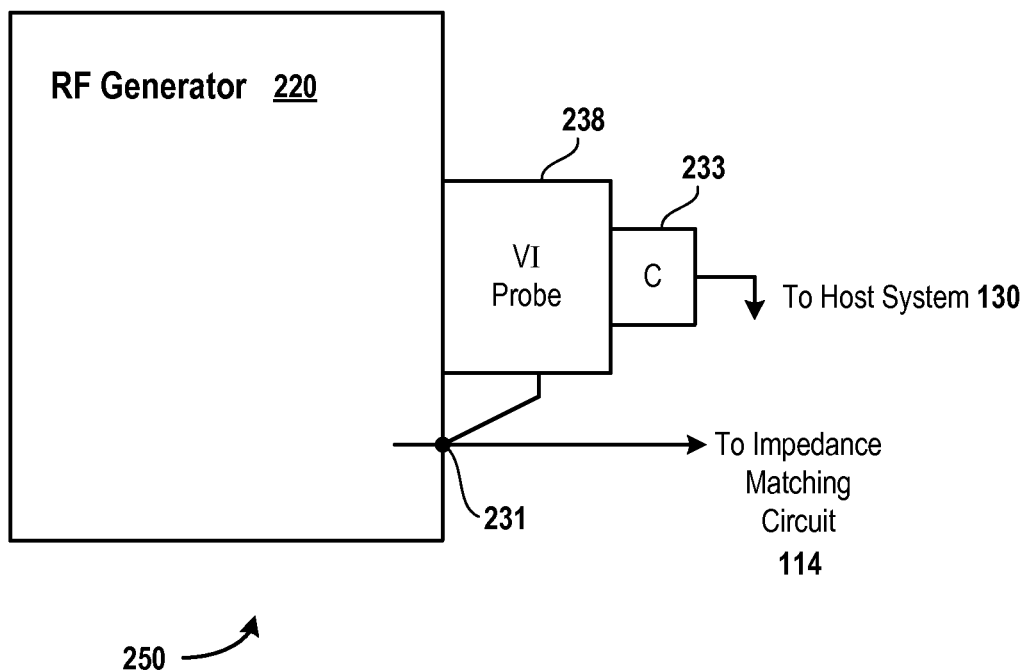
FIG. 10 is a block diagram of a system in which the voltage and current probe and a communication device are located outside the RF generator, in accordance with an embodiment described in the present disclosure.

FIG. 10 is a block diagram of an embodiment of a system 250 in which the voltage and current probe 238 and the communication device 233 are located outside the RF generator 220. In FIG. 1, the voltage and current probe 110 is located within the x MHz RF generator to measure the variable at the output of the x MHz RF generator. The voltage and current probe 238 is located outside the RF generator 220 to measure the variable at the output 231 of the RF generator 220. The voltage and current probe 238 is associated, e.g., coupled, to the output 231 of the RF generator 220.

Figure 11:
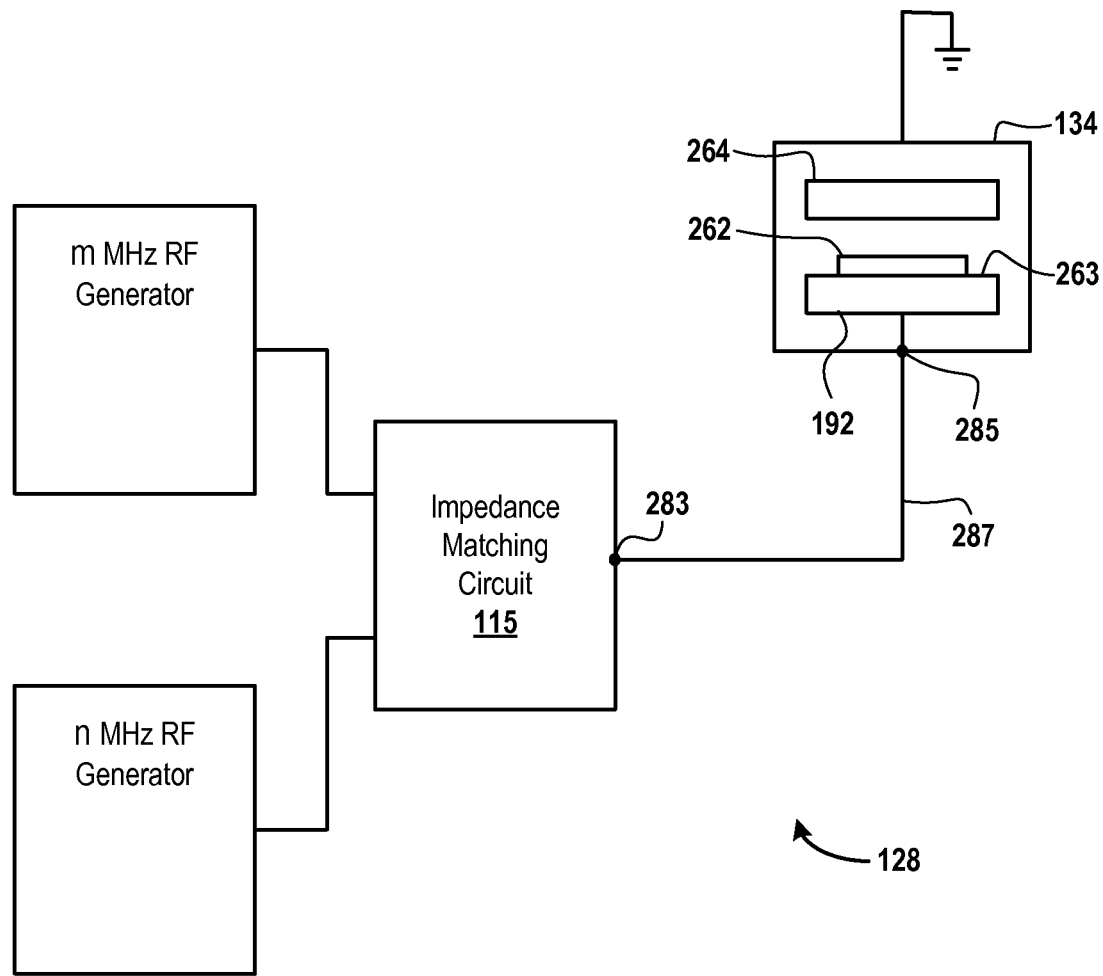
FIG. 11 is a block diagram of a system in which values of the variable determined using the system of FIG. 1 are used, in accordance with an embodiment described in the present disclosure.

FIG. 11 is a block diagram of an embodiment of a system 128 in which the values of the variable determined using the system 126 of FIG. 1 are used. The system 128 includes an m MHz RF generator, an n MHz RF generator, an impedance matching circuit 115, an RF transmission line 287, and a plasma chamber 134. The plasma chamber 134 may be similar to the plasma chamber 175.

It should be noted that in an embodiment, the x MHz RF generator of FIG. 1 is similar to the m MHz RF generator and the y MHz RF generator of FIG. 1 is similar to the n MHz RF generator. As an example, x MHz is equal to m MHz and y MHz is equal to n MHz. As another example, the x MHz generator and the m MHz generators have similar frequencies and the y MHz generator and the n MHz generator have similar frequencies. An example of similar frequencies is when the x MHz is within a window, e.g., within kHz or Hz, of the m MHz frequency. In some embodiments, the x MHz RF generator of FIG. 1 is not similar to the m MHz RF generator and the y MHz RF generator of FIG. 1 is not similar to the n MHz RF generator.

It is further noted that in various embodiments, a different type of sensor is used in each of the m MHz and n MHz RF generators than that used in each of the x MHz and y MHz RF generators. For example, a sensor that does not comply with the NIST standard is used in the m MHz RF generator. As another example, a voltage sensor that measures only voltage is used in the m MHz RF generator.

It should further be noted that in an embodiment, the impedance matching circuit 115 is similar to the impedance matching circuit 114 (FIG. 1). For example, an impedance of the impedance matching circuit 114 is the same as an impedance of the impedance matching circuit 115. As another example, an impedance of the impedance matching circuit 115 is within a window, e.g., within 10-20%, of the impedance of the impedance matching circuit 114. In some embodiments, the impedance matching circuit 115 is not similar to the impedance matching circuit 114.

The impedance matching circuit 115 includes electrical components, e.g., inductors, capacitors, etc., to match an impedance of a power source coupled to the impedance matching circuit 115 with an impedance of a load coupled to the circuit 115. For example, the impedance matching circuit 115 matches an impedance of a source coupled to the impedance matching circuit 115, e.g., a combination of the m MHz RF generator, the n MHz RF generator, and cables coupling the m and n MHz RF generators to the impedance matching circuit 115, etc., with an impedance of a load, e.g., a combination of the plasma chamber 134 and the RF transmission line 287, etc.

It should be noted that in an embodiment, the RF transmission line 287 is similar to the RF transmission line 113 (FIG. 1). For example, an impedance of the RF transmission line 287 is the same as an impedance of the RF transmission line 113. As another example, an impedance of the RF transmission line 287 is within a window, e.g., within 10-20%, of the impedance of the RF transmission line 113. In various embodiments, the RF transmission line 287 is not similar to the RF transmission line 113.

The plasma chamber 134 includes an ESC 192, an upper electrode 264, and other parts (not shown), e.g., an upper dielectric ring surrounding the upper electrode 264, an upper electrode extension surrounding the upper dielectric ring, a lower dielectric ring surrounding a lower electrode of the ESC 192, a lower electrode extension surrounding the lower dielectric ring, an upper plasma exclusion zone (PEZ) ring, a lower PEZ ring, etc. The upper electrode 264 is located opposite to and facing the ESC 192. A work piece 262, e.g., a semiconductor wafer, etc., is supported on an upper surface 263 of the ESC 192. Each of the upper electrode 264 and the lower electrode of the ESC 192 is made of a metal, e.g., aluminum, alloy of aluminum, copper, etc.

In one embodiment, the upper electrode 264 includes a hole that is coupled to a central gas feed (not shown). The central gas feed receives one or more process gases from a gas supply (not shown). The upper electrode 264 is grounded. The ESC 192 is coupled to the m MHz RF generator and the n MHz RF generator via the impedance matching circuit 115.

When the process gas is supplied between the upper electrode 264 and the ESC 192 and when the m MHz RF generator and/or the n MHz RF generator supplies power via the impedance matching circuit 115 to the ESC 192, the process gas is ignited to generate plasma within the plasma chamber 134.

It should be noted that the system 128 lacks a probe, e.g., a metrology tool, a voltage and current probe, a voltage probe, etc., to measure the variable at an output 283 of the impedance matching circuit 115, at a point on the RF transmission line 287, or at the ESC 192. The values of the variable at the model nodes N1$m$, N2$m$, N4$m$, and N6$m$ are used to determine whether the system 128 is functioning as desired.

In various embodiments, the system 128 lacks a wafer bias sensor, e.g., an in-situ direct current (DC) probe pick-up pin, and related hardware that is used to measure wafer bias at the ESC 192. The nonuse of the wafer bias sensor and the related hardware saves cost.

It should also be noted that in an embodiment, the system 128 includes any number of RF generators coupled to an impedance matching circuit.

FIGS. 12A, 12B, and 12C are diagrams of embodiments of graphs 268, 272, and 275 that illustrate a correlation between voltage, e.g., root mean square (RMS) voltage, peak voltage, etc., that is measured at the output, e.g., the node N4, of the impedance matching circuit 114 (FIG. 1) within the system 126 (FIG. 1) by using a voltage probe and a voltage, e.g., peak voltage, etc., at a corresponding model node output, e.g., the node N4$m$, determined using the method 102 (FIG. 2). Moreover, FIGS. 12A, 12B, and 12C are diagrams of embodiments of graphs 270, 274, and 277 that illustrate a correlation between current, e.g., root mean square (RMS) current, etc., that is measured the output, e.g., the node N4, of the system 126 (FIG. 1) by using a current probe and a current, e.g., RMS current, etc., at a corresponding output, e.g., the node N4$m$, determined using the method 102 (FIG. 2).

The voltage determined using the method 102 is plotted on an x-axis in each graph 268, 272, and 275 and the voltage measured with the voltage probe is plotted on a y-axis in each graph 268, 272, and 275. Similarly, the current determined using the method 102 is plotted on an x-axis in each graph 270, 274, and 277 and the current measured with the current probe is plotted on a y-axis in each graph 270, 274, and 277.

The voltages are plotted in the graph 268 when the x MHz RF generator is on and the y MHz RF generator and a z MHz RF generator, e.g., 60 MHz RF generator, are off. Moreover, the voltages are plotted in the graph 272 when the y MHz RF generator is on and the x and z MHz RF generators are off.

Also, the voltages are plotted in the graph 275 when the z MHz RF generator is on and the x and y MHz RF generators are off.

Similarly, currents are plotted in the graph 270 when the x MHz RF generator is on and the y MHz RF generator and a z MHz RF generator are off. Also, the currents are plotted in the graph 274 when the y MHz RF generator is on and the x and z MHz RF generators are off. Also, the currents are plotted in the graph 277 when the z MHz RF generator is on and the x and y MHz RF generators are off.

It can be seen in each graph 268, 272, and 275 that an approximately linear correlation exists between the voltage plotted on the y-axis of the graph and the voltage plotted on the x-axis of the graph. Similarly, it can be seen in each graph 270, 274, and 277 that an approximately linear correlation exists between the current plotted on the y-axis and the current plotted on the x-axis.

Figure 13:
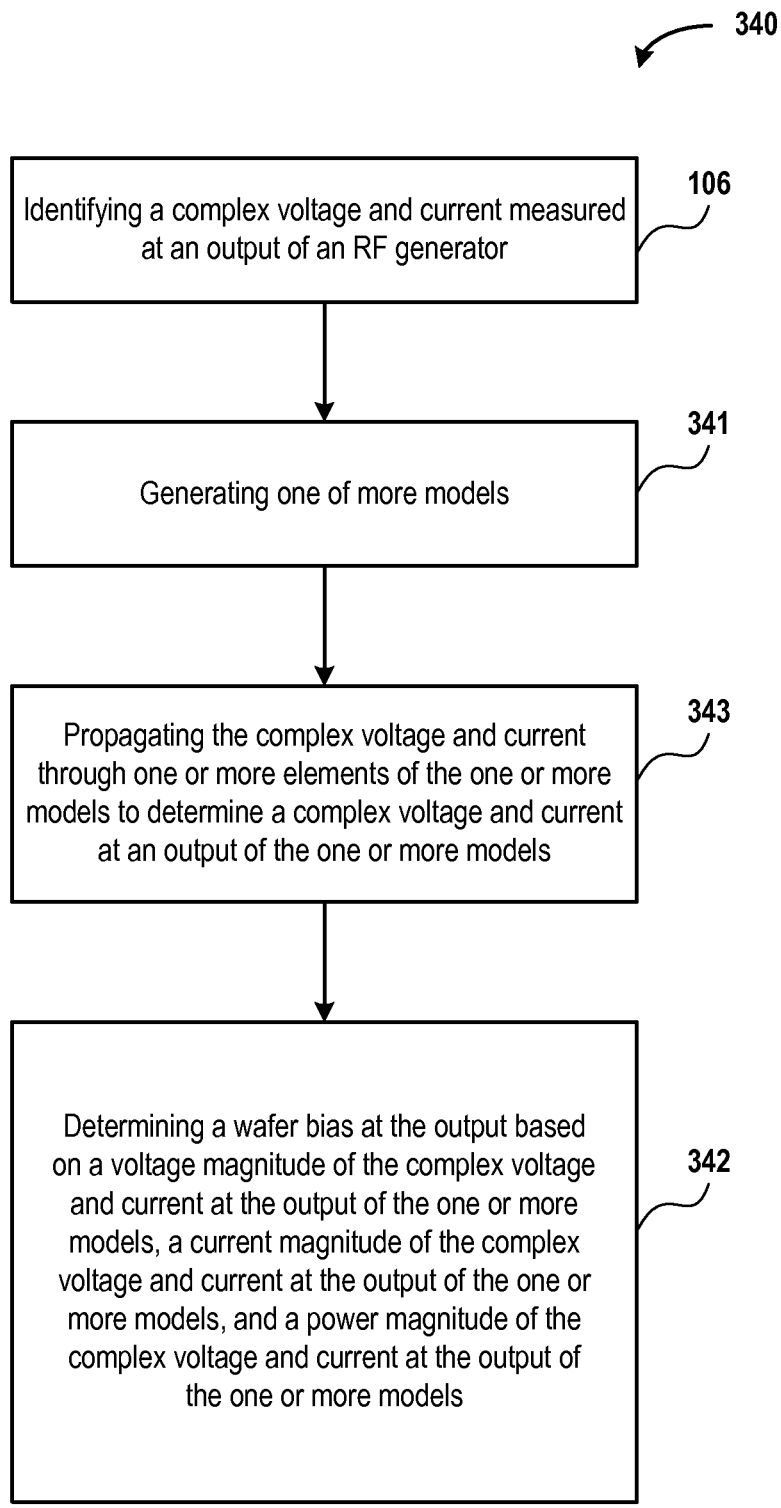
FIG. 13 is a flowchart of a method for determining wafer bias at a model node of the impedance matching model, the RF transmission model, or the ESC model, in accordance with an embodiment described in the present disclosure.

FIG. 13 is a flowchart of an embodiment of the method 340 for determining wafer bias at a model node, e.g., the model node N4m, the model node N1m, the model node N2m, the model node N6m, etc., of the plasma system 126 (FIG. 1). It should be noted that in some embodiments, wafer bias is a direct current (DC) voltage that is created by plasma generated within the plasma chamber 175 (FIG. 1). In these embodiments, the wafer bias is present on a surface, e.g., the upper surface 183, of the ESC 177 (FIG. 1) and/or on a surface, e.g., an upper surface, of the work piece 131 (FIG. 1).

It should further be noted that the model nodes N1m and N2m are on the RF transmission model 161 (FIG. 1) and the model node N6m is on the ESC model 125 (FIG. 1). The method 340 is executed by the processor of the host system 130 (FIG. 1). In the method 340, the operation 106 is performed.

Moreover, in an operation 341, one or more models, e.g. the impedance matching model 104, the RF transmission model 161, the ESC model 125 (FIG. 1), a combination thereof, etc., of corresponding one or more devices, e.g., the impedance matching circuit 114, the RF transmission line 113, the ESC 177, a combination thereof, etc., are generated. For example, the ESC model 125 is generated with similar characteristics to that of the ESC 177 (FIG. 1).

In an operation 343, the complex voltage and current identified in the operation 106 is propagated through one or more elements of the one or more models to determine a complex voltage and current at an output of the one or more models. For example, the second complex voltage and current is determined from the first complex voltage and current. As another example, the second complex voltage and current is determined from the first complex voltage and current and the third complex voltage and current is determined from the second complex voltage and current. As yet another example, the second complex voltage and current is determined from the first complex voltage and current, the third complex voltage and current is determined from the second complex voltage and current, and the third complex voltage and current is propagated through the portion 197 of the RF transmission model 161 (FIG. 1) to determine a fourth complex voltage and current at the model node N2m. In this example, the fourth complex voltage and current is determined by propagating the third complex voltage and current through impedances of elements of the portion 197. As yet another example, the RF transmission model 161 provides an algebraic transfer function that is executed by the processor of the host system 130 to translate the complex voltage and current measured at one or more outputs of one or more RF generators to an electrical node, e.g., the model node N1m, the model node N2m, etc., along the RF transmission model 161.

As another example of the operation 343, the second complex voltage and current is determined from the first complex voltage and current, the third complex voltage and current is determined from the second complex voltage and current, the fourth complex voltage and current is determined from the third complex voltage and current, and the fourth complex voltage and current is propagated through the ESC model 125 to determine a fifth complex voltage and current at the model node N6m. In this example, the fifth complex voltage and current is determined by propagating the fourth complex voltage and current through impedances of elements, e.g., capacitors, inductors, etc., of the ESC model 125.

In an operation 342, a wafer bias is determined at the output of the one or more models based on a voltage magnitude of the complex voltage and current at the output, a current magnitude of the complex voltage and current at the output, and a power magnitude of the complex voltage and current at the output. For example, wafer bias is determined based on a voltage magnitude of the second complex voltage and current, a current magnitude of the second complex voltage and current, and a power magnitude of the second complex voltage and current. To further illustrate, when the x MHz RF generator is on and the y MHz and z MHz RF generators are off, the processor of the host system 130 (FIG. 1) determines wafer bias at the model node N4m (FIG. 1) as a sum of a first product, a second product, a third product, and a constant. In this illustration, the first product is a product of a first coefficient and the voltage magnitude of the second complex voltage and current, the second product is a product of a second coefficient and the current magnitude of the second complex voltage and current, and the third product is a product of a square root of a third coefficient and a square root of a power magnitude of the second complex voltage and current.

As an example, a power magnitude is a power magnitude of delivered power, which is determined by the processor of the host system 130 as a difference between forward power and reflected power. Forward power is power supplied by one or more RF generators of the system 126 (FIG. 1) to the plasma chamber 175 (FIG. 1). Reflected power is power reflected back from the plasma chamber 175 towards one or more RF generators of the system 126 (FIG. 1). As an example, a power magnitude of a complex voltage and current is a determined by the processor of the host system 130 as a product of a current magnitude of the complex voltage and current and a voltage magnitude of the complex voltage and current. Moreover, each of a coefficient and a constant used to determine a wafer bias is a positive or a negative number. As another example of determination of the wafer bias, when the x MHz RF generator is on and the y and z MHz RF generators are off, the wafer bias at a model node is represented as $ax*Vx+bx*Ix+cx*sqrt(Px)+dx$, where "ax" is the first coefficient, "bx" is the second coefficient, "dx" is the constant, "Vx" is a voltage magnitude of a complex voltage and current at the model node "Ix" is a current magnitude of the complex voltage and current at the model node, and "Px" is a power magnitude of the complex voltage and current at the model node. It should be noted that "sqrt" is a square root operation, which is performed by the processor of the host system 130. In some embodiments, the power magnitude Px is a product of the current magnitude Ix and the voltage magnitude Vx.

In various embodiments, a coefficient used to determine a wafer bias is determined by the processor of the host system 130 (FIG. 1) based on a projection method. In the projection method, a wafer bias sensor, e.g., a wafer bias pin, etc., measures wafer bias on a surface, e.g., the upper surface 183 (FIG. 1), etc., of the ESC 177 for a first time. Moreover, in the projection method, a voltage magnitude, a current magnitude, and a power magnitude are determined at a model node within the plasma system 126 based on complex voltage and current measured at an output of an RF generator. For example, the complex voltage and current measured at the node N3 (FIG. 1) for the first time is propagated by the processor of the host system 130 to a model node, e.g., the model node N4m, the model node N1m, the model node N2m, or the model node N6m (FIG. 1), etc., to determine complex voltage and current at the model node for the first time. Voltage magnitude and current magnitude are extracted by the processor of the host system 130 from the complex voltage and current at the model node for the first time. Also, power magnitude is calculated by the processor of the host system 130 as a product of the current magnitude and the voltage magnitude for the first time.

Similarly, in the example, complex voltage and current is measured at the node N3 for one or more additional times and the measured complex voltage and current is propagated to determine complex voltage and current at the model node, e.g., the model node N4m, the model node N1m, the model node N2m, the model node N6m, etc., for the one or more additional times. Also, for the one or more additional times, voltage magnitude, current magnitude, and power magnitude are extracted from the complex voltage and current determined for the one or more additional times. A mathematical function, e.g., partial least squares, linear regression, etc., is applied by the processor of the host system 130 to the voltage magnitude, the current magnitude, the power magnitude, and the measured wafer bias obtained for the first time and for the one or more additional times to determine the coefficients ax, bx, cx and the constant dx.

As another example of the operation 342, when the y MHz RF generator is on and the x and z MHz RF generators are off, a wafer bias is determined as ay*Vy+by*Iy+cy*sqrt (Py)+dy, where "ay" is a coefficient, "by" is a coefficient, "dy" is a constant, "Vy" is a voltage magnitude of the second complex voltage and current, "Iy" is a current magnitude of the second complex voltage and current, and "Py" is a power magnitude of the second complex voltage and current. The power magnitude Py is a product of the current magnitude Iy and the voltage magnitude Vy. As yet another example of the operation 342, when the z MHz RF generator is on and the x and y MHz RF generators are off, a wafer bias is determined as az*Vz+bz*Iz+cz*sqrt (Pz)+dz, where "az" is a coefficient, "bz" is a coefficient, "dz" is a constant, "Vz" is a voltage magnitude of the second complex voltage and current, "Iz" is a current magnitude of the second complex voltage and current, and "Pz" is a power magnitude of the second complex voltage and current. The power magnitude Pz is a product of the current magnitude Iz and the voltage magnitude Vz.

As another example of the operation 342, when the x and y MHz RF generators are on and the z MHz RF generator is off, the wafer bias is determined as a sum of a first product, a second product, a third product, a fourth product, a fifth product, a sixth product, and a constant. The first product is a product of a first coefficient and the voltage magnitude Vx, the second product is a product of a second coefficient and the current magnitude Ix, the third product is a product of a third coefficient and a square root of the power magnitude Px, the fourth product is a product of a fourth coefficient and the voltage magnitude Vy, the fifth product is a product of a fifth coefficient and the current magnitude Iy, and the sixth product is a product of a sixth coefficient and a square root of the power magnitude Py. When the x and y MHz RF generators are on and the z MHz RF generator is off, the wafer bias is represented as axy*Vx+bxy*Ix+cxy*sqrt (Px)+dxy*Vy+exy*Iy+fxy*sqrt (Py)+gxy, where "axy", "bxy", "cxy", "dxy", "exy", "fxy", "dxy", "exy", and "fxy" are coefficients, and "gxy" is a constant.

As another example of the operation 342, when the y and z MHz RF generators are on and the x MHz RF generator is off, a wafer bias is determined as ayz*Vy+byz*Iy+cyz*sqrt (Py)+dyz*Vz+eyz*Iz+fyz*sqrt (Pz)+gyz, where "ayz", "byz", "cyz", "dyz", "eyz", and "fyz" are coefficients, and "gyz" is a constant. As yet another example of the operation 342, when the x and z MHz RF generators are on and the y MHz RF generator is off, a wafer bias is determined as axz*Vx+bxz*Ix+cxz*sqrt (Px)+dxz*Vz+exz*Iz+fxz*sqrt (Pz)+gxz, where "axz", "bxz", "cxz", "dxz", "exz", and "fxz" are coefficients, and gxz is a constant.

As another example of the operation 342, when the x, y, and z MHz RF generators are on, the wafer bias is determined as a sum of a first product, a second product, a third product, a fourth product, a fifth product, a sixth product, a seventh product, an eighth product, a ninth product, and a constant. The first product is a product of a first coefficient and the voltage magnitude Vx, the second product is a product of a second coefficient and the current magnitude Ix, the third product is a product of a third coefficient and a square root of the power magnitude Px, the fourth product is a product of a fourth coefficient and the voltage magnitude Vy, the fifth product is a product of a fifth coefficient and the current magnitude Iy, the sixth product is a product of a sixth coefficient and a square root of the power magnitude Py, the seventh product is a product of a seventh coefficient and the voltage magnitude Vz, the eighth product is a product of an eighth coefficient and the current magnitude Iz, and the ninth product is a product of a ninth coefficient and a square root of a power magnitude Pz. When the x, y, and z MHz RF generators are on, the wafer bias is represented as axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz, where "axyz", "bxyz", "cxyz", "dxyz", "exyz", "fxyz", "gxyz", "hxyz", and "ixyz" are coefficients, and "jxyz" is a constant.

As another example of determination of wafer bias at the output of the one or more models, wafer bias at the model node N1m is determined by the processor of the host system 130 based on voltage and current magnitudes determined at the model node N1m. To further illustrate, the second complex voltage and current is propagated along the portion 173 (FIG. 1) to determine complex voltage and current at the model node N1m. The complex voltage and current is determined at the model node N1m from the second complex voltage and current in a manner similar to that of determining the second complex voltage and current from the first complex voltage and current. For example, the second complex voltage and current is propagated along the portion 173 based on characteristics of elements of the portion 173 to determine a complex voltage and current at the model node N1m.

Based on the complex voltage and current determined at the model node N1m, wafer bias is determined at the model node N1m by the processor of the host system 130. For example, wafer bias is determined at the model node N1m from the complex voltage and current at the model node N1m in a manner similar to that of determining the wafer bias at the model node N4$m$ from the second complex voltage and current. To illustrate, when the x MHz RF generator is on and the y MHz and z MHz RF generators are off, the processor of the host system 130 (FIG. 1) determines wafer bias at the model node N1$m$ as a sum of a first product, a second product, a third product, and a constant. In this example, the first product is a product of a first coefficient and the voltage magnitude of the complex voltage and current at the model node N1$m$, the second product is a product of a second coefficient and the current magnitude of the complex voltage and current at the model node N1$m$, and the third product is a product of a square root of a third coefficient and a square root of a power magnitude of the complex voltage and current at the model node N1$m$. When the x MHz RF generator is on and the y and z MHz RF generators are off, the wafer bias at the model node N1$m$ is represented as ax*Vx+bx*Ix+cx*sqrt (Px)+dx, where ax is the first coefficient, bx is the second coefficient, cx is the third coefficient, dx is the constant, Vx is the voltage magnitude at the model node N1$m$, Ix is the current magnitude at the model node N1$m$, and Px is the power magnitude at the model node N1$m$.

Similarly, based on the complex voltage and current at the model node N1$m$ and based on which of the x, y, and z MHz RF generators are on, the wafer bias ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined.

As yet another example of determination of wafer bias at the output of the one or more models, wafer bias at the model node N2$m$ is determined by the processor of the host system 130 based on voltage and current magnitudes determined at the model node N2$m$ in a manner similar to that of determining wafer bias at the model node N1$m$ based on voltage and current magnitudes determined at the model node N1$m$. To further illustrate, wafer bias ax*Vx+bx*Ix+cx*sqrt (Px)+dx, ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined at the model node N2$m$.

As another example of determination of wafer bias at the output of the one or more models, wafer bias at the model node N6$m$ is determined by the processor of the host system 130 based on voltage and current magnitudes determined at the model node N6$m$ in a manner similar to that of determining wafer bias at the model node N2$m$ based on voltage and current magnitudes determined at the model node N2$m$. To further illustrate, wafer bias ax*Vx+bx*Ix+cx*sqrt (Px)+dx, ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined at the model node N6$m$.

It should be noted that in some embodiments, wafer bias is stored within the storage HU 162 (FIG. 1).

Figure 14:
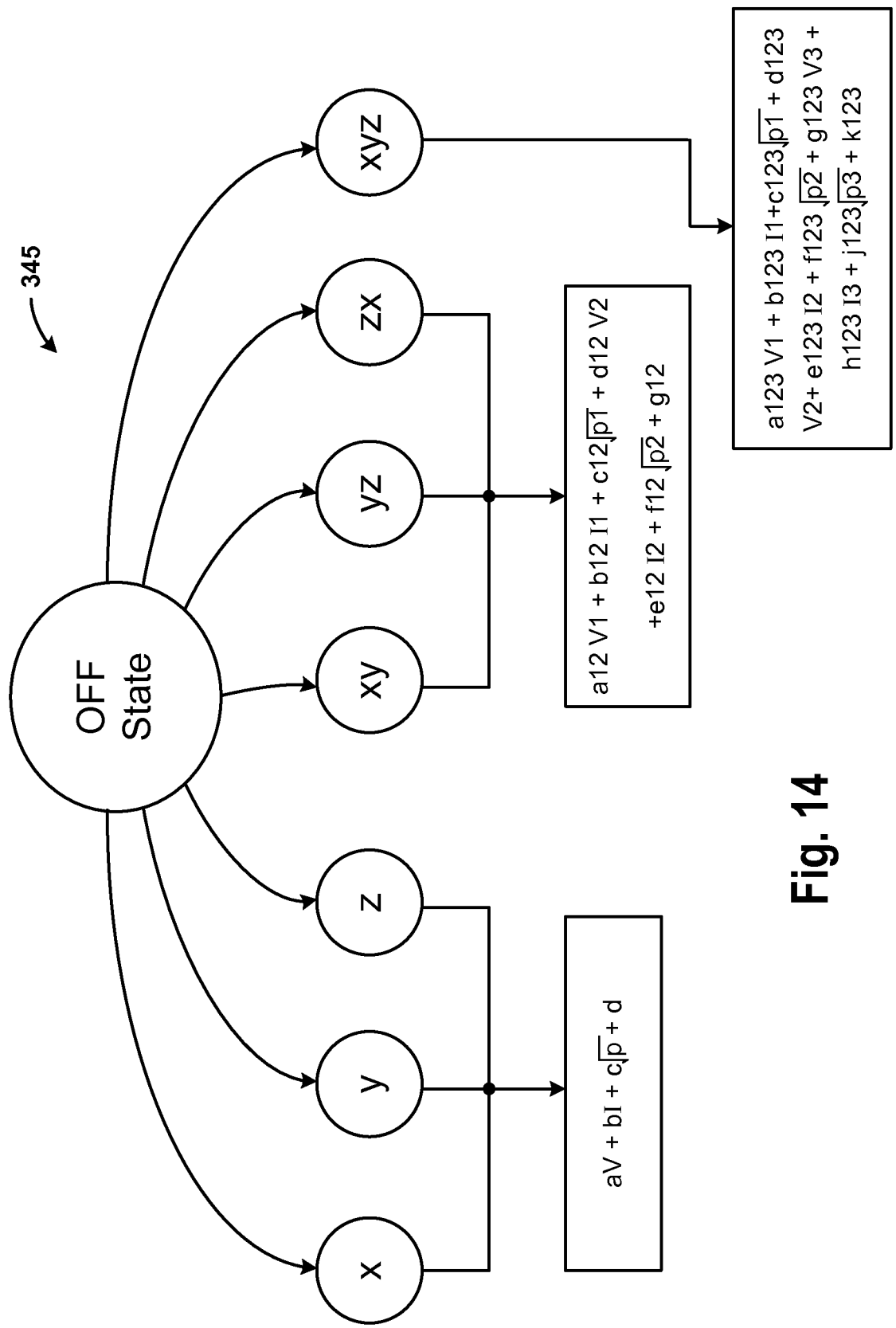
FIG. 14 is a state diagram illustrating a wafer bias generator used to generate a wafer bias, in accordance with an embodiment described in the present disclosure.

FIG. 14 is a state diagram illustrating an embodiment of a wafer bias generator 340, which is implemented within the host system 130 (FIG. 1). When all of the x, y, and z MHz RF generators are off, wafer bias is zero or minimal at a model node, e.g., the model node N4$m$, N1$m$, N2$m$, N6$m$ (FIG. 1), etc. When the x, y, or z MHz RF generator is on and the remaining of the x, y, and z MHz RF generators are off, the wafer bias generator 345 determines a wafer bias at a model node, e.g., the model node N4$m$, N1$m$, N2$m$, N6$m$, etc., as a sum of a first product a*V, a second product b*I, a third product c*sqrt(P), and a constant d, where V is a voltage magnitude of a complex voltage and current at the model node, I is a current magnitude of the complex voltage and current, P is a power magnitude of the complex voltage and current, a is a coefficient, b is a coefficient, c is a coefficient, and d is a constant. In various embodiments, a power magnitude at a model node is a product of a current magnitude at the model node and a voltage magnitude at the model node. In some embodiments, the power magnitude is a magnitude of delivered power.

When two of the x, y, and z MHz RF generators are on and the remaining of the x, y, and z MHz RF generators are off, the wafer bias generator 345 determines a wafer bias at a model node, e.g., the model node N4$m$, N1$m$, N2$m$, N6$m$, etc., as a sum of a first product a12*V1, a second product b12*I1, a third product c12*sqrt(P1), a fourth product d12*V2, a fifth product e12*I2, a sixth product f12*sqrt (P2), and a constant g12, where "V1" is a voltage magnitude of a complex voltage and current at the model node determined by propagating a voltage measured at an output of a first one of the RF generators that is on, "I1" is a current magnitude of the complex voltage and current determined by propagating a current measured at the output of the first RF generator that is on, "P1" is a power magnitude of the complex voltage and current determined as a product of V1 and I1, "V2" is a voltage magnitude of the complex voltage and current at the model node determined by propagating a voltage measured at an output of a second one of the RF generators that is on, "I2" is a current magnitude of the complex voltage and current determined by propagating the current measured at an output of the second RF generator that is on, "P2" is a power magnitude determined as a product of V2 and I2, each of "a12", "b12", "c12", "d12", "e12" and "f12" is a coefficient, and "g12" is a constant.

When all of the x, y, and z MHz RF generators are on, the wafer bias generator 345 determines a wafer bias at a model node, e.g., the model node N4$m$, N1$m$, N2$m$, N6$m$, etc., as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where "V1" is a voltage magnitude of a complex voltage and current at the model node determined by propagating a voltage measured at an output of a first one of the RF generators, "I1" is a current magnitude of the complex voltage and current determined by propagating a current measured at the output of the first RF generator, "P1" is a power magnitude of the complex voltage and current determined as a product of V1 and I1, "V2" is a voltage magnitude of the complex voltage and current at the model node determined by propagating a voltage measured at an output of a second one of the RF generators, "I2" is a current magnitude of the complex voltage and current determined by propagating a current measured at the output of the second RF generator, "P2" is a power magnitude of the complex voltage and current determined as a product of V2 and I2, "V3" is a voltage magnitude of the complex voltage and current at the model node determined by propagating a voltage measured at an output of a third one of the RF generators, "I3" is a current magnitude of the complex voltage and current determined by propagating a current at the output of the third RF generator, "P3" is a power magnitude of the complex voltage and current determined as a product of V3 and I3, each of "a123", "b123", "c123", "d123", "e123", "f123", "g123", "h123", and "i123" is a coefficient, and "j123" is a constant.

Figure 15:
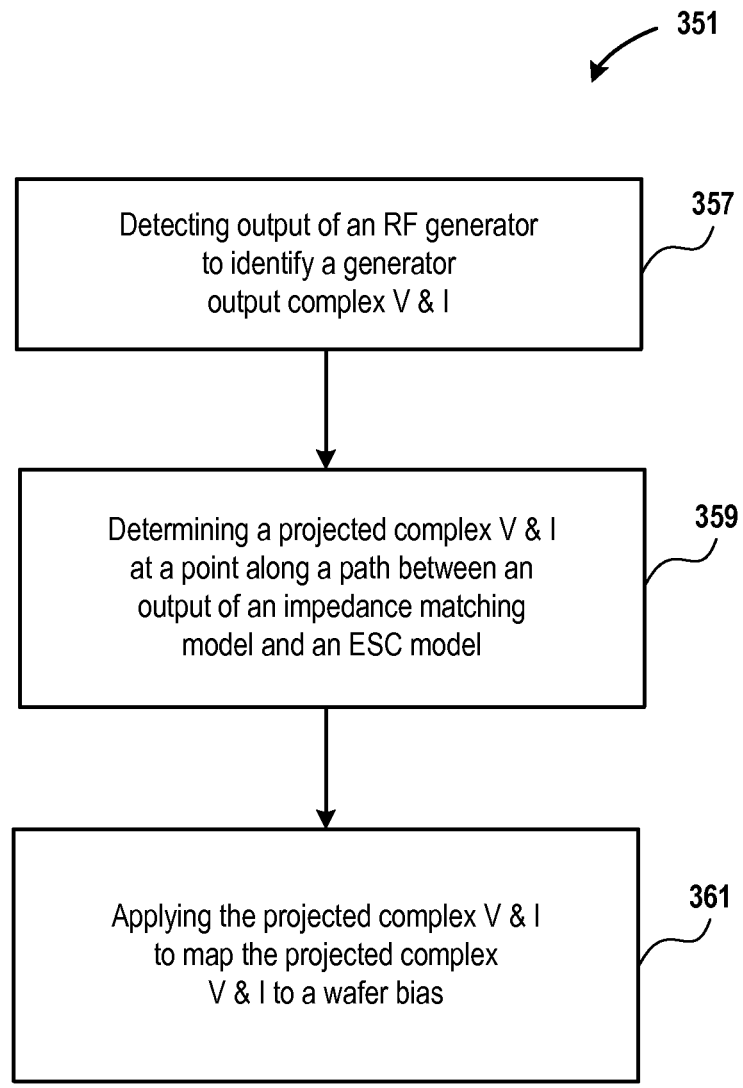
FIG. 15 is a flowchart of a method for determining a wafer bias at a point along a path between the impedance matching model and the ESC model, in accordance with an embodiment described in the present disclosure.
Figure 16:
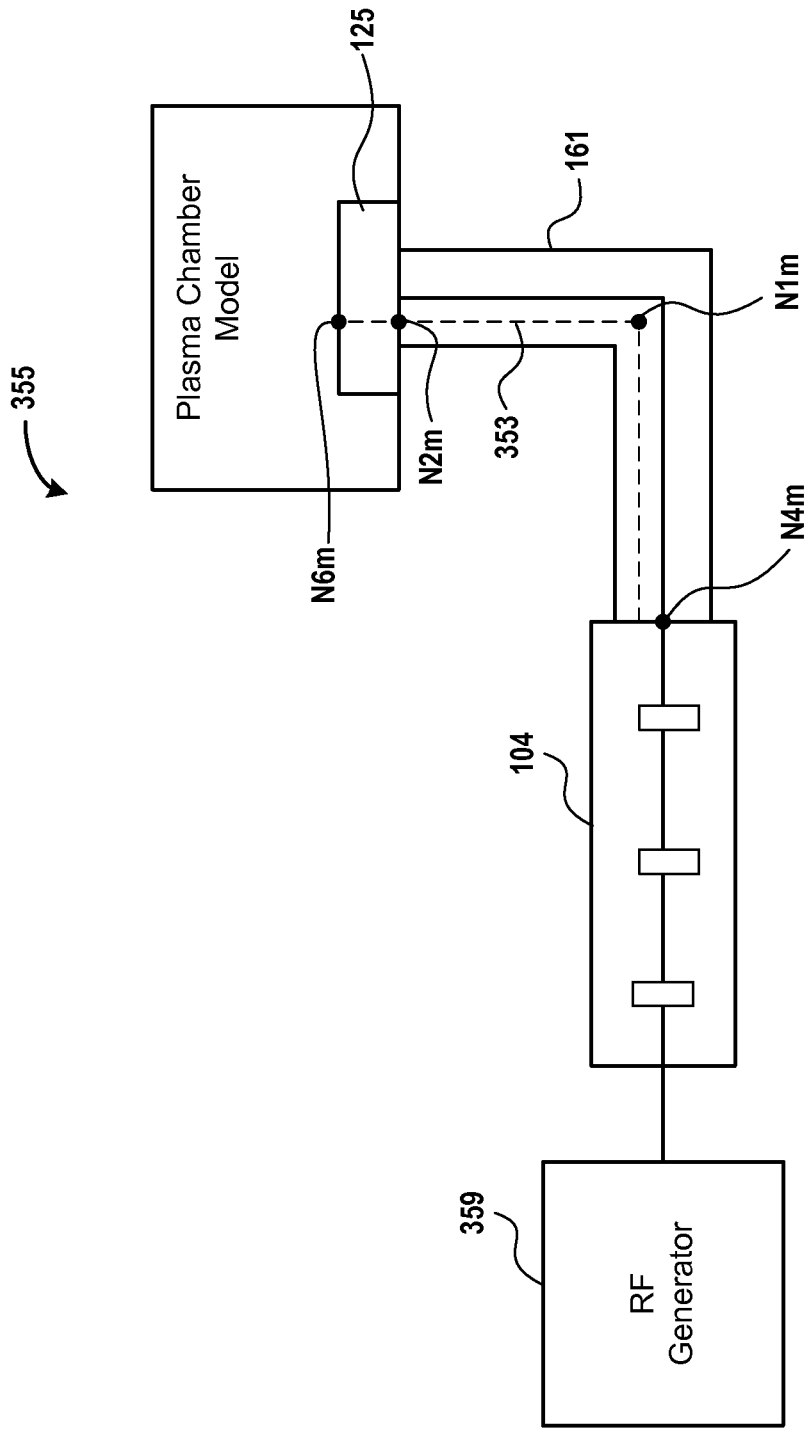
FIG. 16 is a block diagram of a system for determining a wafer bias at a node of a model, in accordance with an embodiment described in the present disclosure.

FIG. 15 is a flowchart of an embodiment of the method 351 for determining a wafer bias at a point along a path 353 (FIG. 16) between the model node N4m (FIG. 16) and the ESC model 125 (FIG. 16). FIG. 15 is described with reference to FIG. 16, which is a block diagram of an embodiment of a system 355 for determining a wafer bias at an output of a model.

In an operation 357, output of the x, y, or z MHz RF generator is detected to identify a generator output complex voltage and current. For example, the voltage and current probe 110 (FIG. 1) measures complex voltage and current at the node N3 (FIG. 1). In this example, the complex voltage and current is received from the voltage and current probe 110 via the communication device 185 (FIG. 1) by the host system 130 (FIG. 1) for storage within the storage HU 162 (FIG. 1). Also, in the example, the processor of the host system 130 identifies the complex voltage and current from the storage HU 162.

In an operation 359, the processor of the host system 130 uses the generator output complex voltage and current to determine a projected complex voltage and current at a point along the path 353 between the model node N4m and the model node N6m. The path 353 extends from the model node N4m to the model node N6m. For example, the fifth complex voltage and current is determined from the complex voltage and current measured at the output of the x MHz RF generator, the y MHz RF generator, or the z MHz RF generator. As another example, the complex voltage and current measured at the node N3 or the node N5 is propagated via the impedance matching model 104 to determine a complex voltage and current at the model node N4m (FIG. 1). In the example, the complex voltage and current at the model node N4m is propagated via one or more elements of the RF transmission model 161 (FIG. 16) and/or via one or more elements of the ESC model 125 (FIG. 16) to determine complex voltage and current at a point on the path 353.

In an operation 361, the processor of the host system 130 applies the projected complex voltage and current determined at the point on the path 353 as an input to a function to map the projected complex voltage and current to a wafer bias value at the node N6m of the ESC model 125 (FIG. 15). For example, when the x, y, or z MHz RF generator is on, a wafer bias at the model node N6m is determined as a sum of a first product a*V, a second product b*I, a third product c*sqrt(P), and a constant d, where, V is a voltage magnitude of the projected complex voltage and current at the model node N6m, I is a current magnitude of the projected complex voltage and current at the model node N6m, P is a power magnitude of the projected complex voltage and current at the model node N6m, a, b, and c are coefficients, and d is a constant.

As another example, when two of the x, y, and z MHz RF generators are on and the remaining of the x, y, and z MHz RF generators are off, a wafer bias at the model node N6m is determined as a sum of a first product a12*V1, a second product b12*I1, a third product c12*sqrt(P1), a fourth product d12*V2, a fifth product e12*I2, a sixth product f12*sqrt(P2), and a constant g12, where V1 is a voltage magnitude at the model node N6m as a result of a first one of the two RF generators being on, I1 is a current magnitude at the model node N6m as a result of the first RF generator being on, P1 is a power magnitude at the model node N6m as a result of the first RF generator being on, V2 is a voltage magnitude at the model node N6m as a result of a second one of the two RF generators being on, I2 is a current magnitude at the model node N6m as a result of the second RF generator being on, and P2 is a power magnitude at the model node N6m as a result of the second RF generator being on, a12, b12, c12, d12, e12, and f12 are coefficients, and g12 is a constant.

As yet another example, when all of the x, y, and z MHz RF generators are on, a wafer bias at the model node N6m is determined as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where V1, I1, P1, V2, I2, and P2 are described above in the preceding example, V3 is a voltage magnitude at the model node N6m as a result of a third one of the RF generators being on, I3 is a current magnitude at the model node N6m as a result of the third RF generator being on, and P3 is a power magnitude at the model node N6m as a result of the third RF generator being on, a123, b123, c123, d123, e123, f123, g123, h123, and i123 are coefficients and j123 is a constant.

As another example, a function used to determine a wafer bias is a sum of characterized values and a constant. The characterized values include magnitudes, e.g., the magnitudes V, I, P, V1, I1, P1, V2, I2, P2, V3, I3, P3, etc. The characterized values also include coefficients, e.g., the coefficients, a, b, c, a12, b12, c12, d12, e12, f12, a123, b123, c123, d123, e123, f123, g123, h123, i123, etc. Examples of the constant include the constant d, the constant g12, the constant j123, etc.

It should be noted that the coefficients of the characterized values and the constant of the characterized values incorporate empirical modeling data. For example, wafer bias is measured for multiple times at the ESC 177 (FIG. 1) using a wafer bias sensor. Moreover, in the example, for the number of times the wafer bias is measured, complex voltages and currents at the point along the path 353 (FIG. 16) are determined by propagating the complex voltage and current from one or more of the nodes, e.g., the nodes N3, N5, etc., of one or more of the RF generators, e.g., the x MHz RF generator, the y MHz RF generator, the z MHz RF generator, etc., via one or more of the models, e.g., the impedance matching model 104, the model portion 173, the RF transmission model 161, the ESC model 125 (FIG. 1), to reach to the point on the path 353 (FIG. 16). Moreover, in this example, a statistical method, e.g., partial least squares, regression, etc., is applied by the processor of the host system 130 to the measured wafer bias and to voltage magnitudes, current magnitudes, and power magnitudes extracted from the complex voltages and currents at the point to determine the coefficients of the characterized values and the constant of the characterized values.

In various embodiments, a function used to determine a wafer bias is characterized by a summation of values that represent physical attributes of the path 353. The physical attributes of the path 353 are derived values from test data, e.g., empirical modeling data, etc. Examples of physical attributes of the path 353 include capacitances, inductances, a combination thereof, etc., of elements on the path 353. As described above, the capacitances and/or inductances of elements along the path 353 affect voltages and currents empirically determined using the projection method at the point on the path 353 and in turn, affect the coefficients of the characterized values and the constant of the characterized values.

In some embodiments, a function used to determine a wafer bias is a polynomial.

FIG. 17 is a flowchart of an embodiment of the method 363 for determining a wafer bias at a model node of the system 126 (FIG. 1). FIG. 17 is described with reference to FIGS. 1 and 16. The method 363 is executed by the processor of the host system 130 (FIG. 1). In an operation 365, one or more complex voltages and currents are received by the host system 130 from one or more communication devices of a generator system, which includes one or more of the x MHz RF generator, the y MHz RF generator, and the z MHz RF generator. For example, complex voltage and current measured at the node N3 is received from the communication device 185 (FIG. 1). As another example, complex voltage and current measured at the node N5 is received from the communication device 189 (FIG. 1). As yet another example, complex voltage and current measured at the node N3 and complex voltage and current measured at the node N5 are received. It should be noted that an output of the generator system includes one or more of the nodes N3, N5, and an output node of the z MHz RF generator.

In an operation 367, based on the one or more complex voltages and currents at the output of the generator system, a projected complex voltage and current is determined at a point along, e.g., on, etc., the path 353 (FIG. 16) between the impedance matching model 104 and the ESC model 125 (FIG. 16). For example, the complex voltage and current at the output of the generator system is projected via the impedance matching model 104 (FIG. 16) to determine a complex voltage and current at the model node N4$m$. As another example, the complex voltage and current at the output of the generator system is projected via the impedance matching model 104 and the portion 173 (FIG. 1) of the RF transmission model 161 to determine a complex voltage and current at the model node N1$m$ (FIG. 1). As yet another example, the complex voltage and current at the output of the generator system is projected via the impedance matching model 104 and the RF transmission model 161 to determine a complex voltage and current at the model node N2$m$ (FIG. 1). As another example, the complex voltage and current at the output of the generator system is projected via the impedance matching model 104, the RF transmission model 161, and the ESC model 125 to determine a complex voltage and current at the model node N6$m$ (FIG. 1).

In an operation 369, a wafer bias is calculated at the point along the path 353 by using the projected complex V&I as an input to a function. For example, when the x, y, or z MHz RF generator is on and the remaining of the x, y, and z MHz RF generators are off, a wafer bias at the point is determined from a function, which is as a sum of a first product $a*V$, a second product $b*I$, a third product $c*\text{sqrt}(P)$, and a constant d, where, V is a voltage magnitude of the projected complex voltage and current at the point, I is a current magnitude of the projected complex voltage and current at the point, P is a power magnitude of the projected complex voltage and current at the point, a, b, and c are coefficients, and d is a constant.

As another example, when two of the x, y, and z MHz RF generators are on and the remaining of the x, y, and z MHz RF generators are off, a wafer bias at the point is determined as a sum of a first product $a12*V1$, a second product $b12*I1$, a third product $c12*\text{sqrt}(P1)$, a fourth product $d12*V2$, a fifth product $e12*I2$, a sixth product $f12*\text{sqrt}(P2)$, and a constant g12, where V1 is a voltage magnitude at the point as a result of a first one of the two RF generators being on, I1 is a current magnitude at the point as a result of the first RF generator being on, P1 is a power magnitude at the point as a result of the first RF generator being on, V2 is a voltage magnitude at the point as a result of a second one of the two RF generators being on, I2 is a current magnitude at the point as a result of the second RF generator being on, and P2 is a power magnitude at the point as a result of the second RF generator being on, a12, b12, c12, d12, e12, and f12 are coefficients, and g12 is a constant.

As yet another example, when all of the x, y, and z MHz RF generators are on, a wafer bias at the point is determined as a sum of a first product $a123*V1$, a second product $b123*I1$, a third product $c123*\text{sqrt}(P1)$, a fourth product $d123*V2$, a fifth product $e123*I2$, a sixth product $f123*\text{sqrt}(P2)$, a seventh product $g123*V3$, an eighth product $h123*I3$, a ninth product $i123*\text{sqrt}(P3)$, and a constant j123, where V1, I1, P1, V2, I2, and P2 are described above in the preceding example, V3 is a voltage magnitude at the point as a result of a third one of the RF generators being on, I3 is a current magnitude at the point as a result of the third RF generator being on, and P3 is a power magnitude at the point as a result of the third RF generator being on, a123, b123, c123, d123, e123, f123, g123, h123, and i123 are coefficients, and j123 is a constant.

Figure 18:
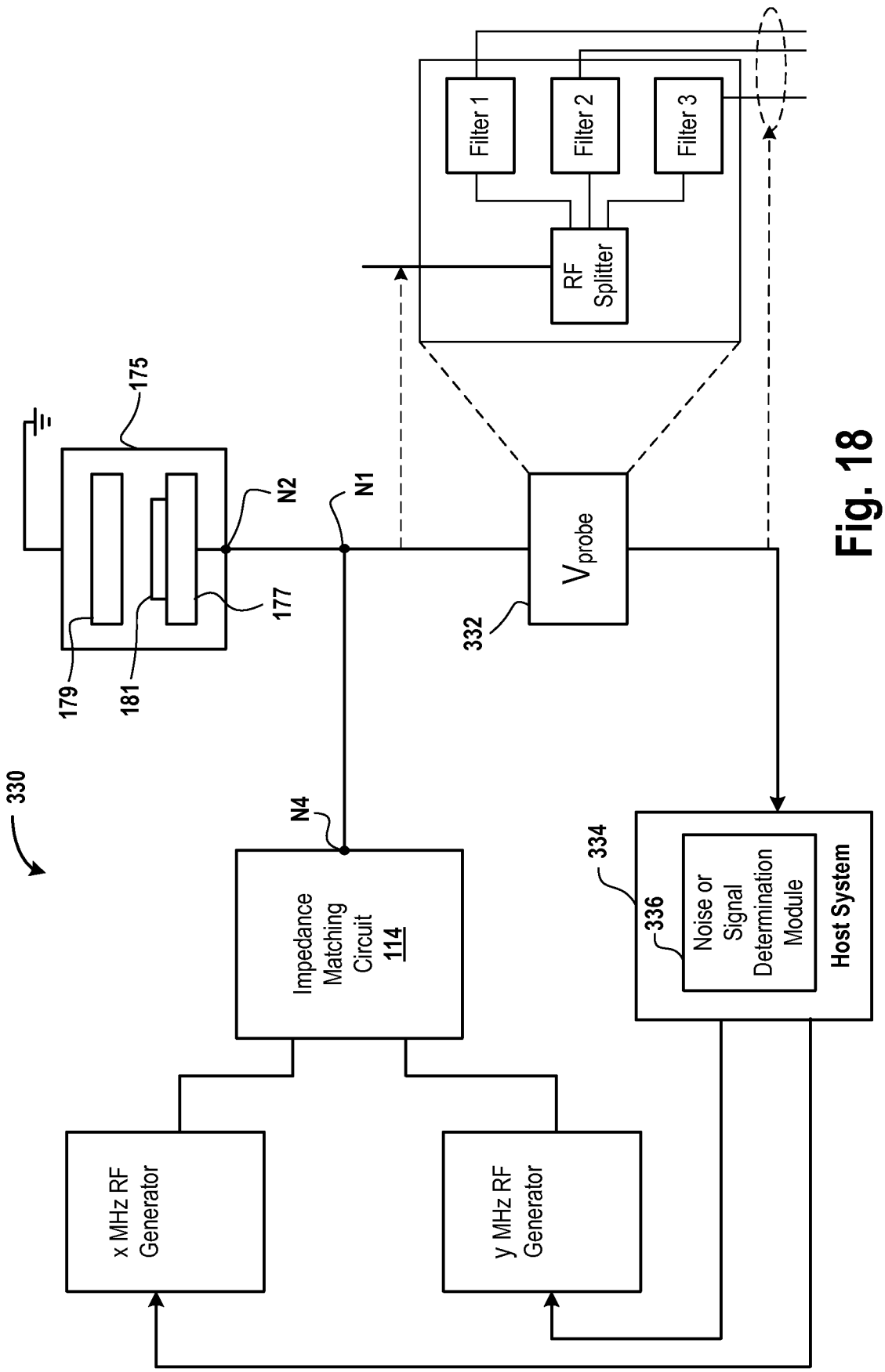
FIG. 18 is a block diagram of a system that is used to illustrate advantages of determining wafer bias by using the method of FIG. 13, FIG. 15, or FIG. 17 instead of by using a voltage probe, in accordance with an embodiment described in the present disclosure.

FIG. 18 is a block diagram of an embodiment of a system 330 that is used to illustrate advantages of determining wafer bias by using the method 340 (FIG. 13), the method 351 (FIG. 15), or the method 363 (FIG. 17) instead of by using a voltage probe 332, e.g., a voltage sensor, etc.

The voltage probe 332 is coupled to the node N1 to determine a voltage at the node N1. In some embodiments, the voltage probe 332 is coupled to another node, e.g., node N2, N4, etc., to determine voltage at the other node. The voltage probe 332 includes multiple circuits, e.g., an RF splitter circuit, a filter circuit 1, a filter circuit 2, a filter circuit 3, etc.

Also, the x and y MHz RF generators are coupled to a host system 334 that includes a noise or signal determination module 336. It should be noted that a module may be a processor, an ASIC, a PLD, a software executed by a processor, or a combination thereof.

The voltage probe 332 measures a voltage magnitude, which is used by the host system 334 to determine a wafer bias. The module 336 determines whether the voltage magnitude measured by the voltage probe 332 is a signal or noise. Upon determining that the voltage magnitude measured by the voltage probe 332 is a signal, the host system 334 determines wafer bias.

The system 126 (FIG. 1) is cost effective compared to the system 330 and saves time and effort compared to the system 330. The system 330 includes the voltage probe 332, which does not need to be included in the system 126. There is no need to couple a voltage probe at the node N4, N1, or N2 of the system 126 to determine wafer bias. In the system 126, wafer bias is determined based on the impedance matching model 104, RF transmission model 161, and/or the ESC model 125 (FIG. 1). Moreover, the system 330 includes the module 336, which also does not need to be included in the system 126. There is no need to spend time and effort to determine whether a complex voltage and current is a signal or noise. No such determination needs to be made by the host system 130 (FIG. 1).

Figure 19C:
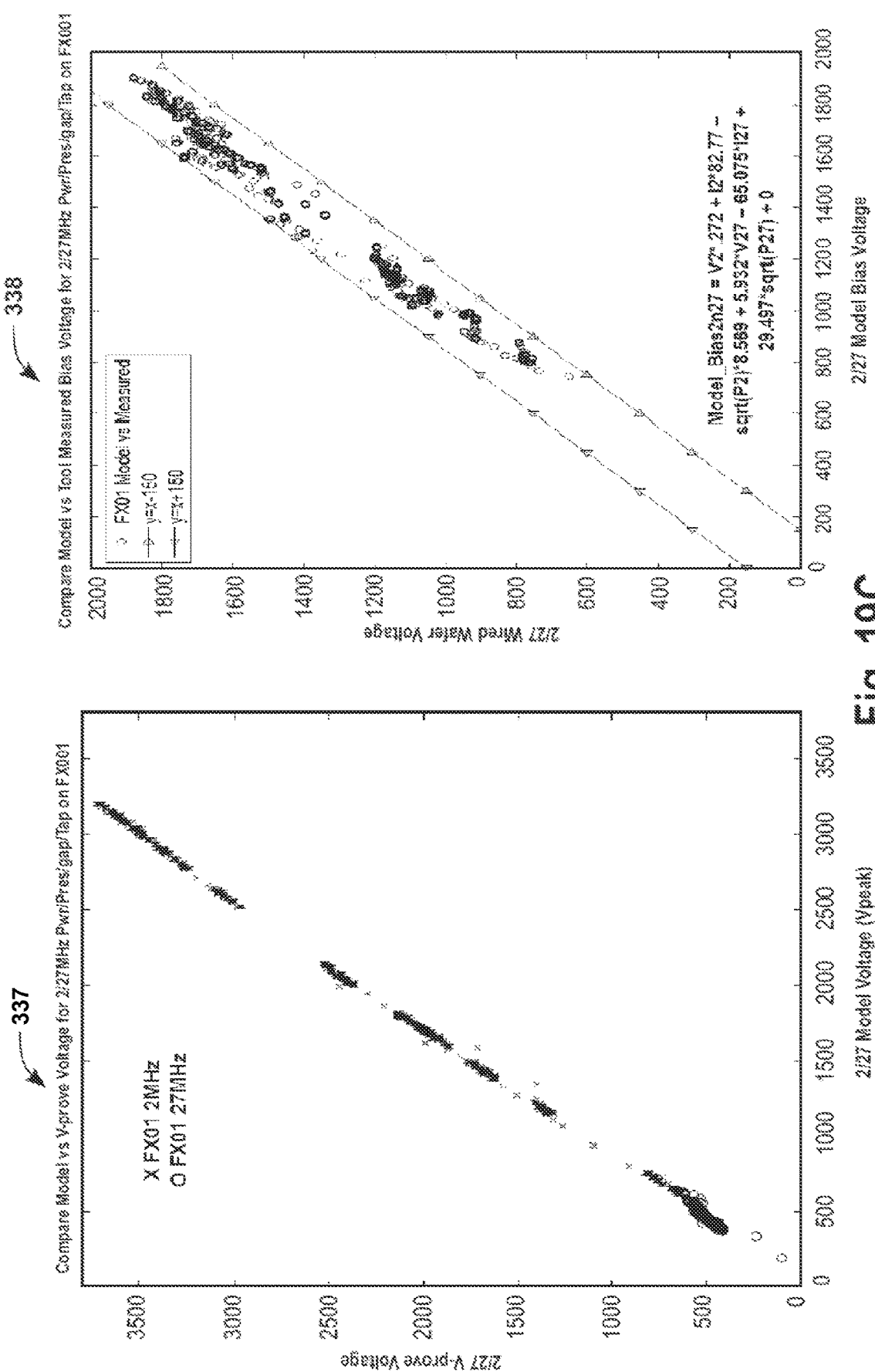
FIG. 19C show embodiments of graphs to illustrate a correlation between a variable that is measured at a node of the plasma system of FIG. 1 by using a voltage probe and a variable at a corresponding model node output determined using the method of FIG. 2, 13, 15, or 17 when the x and y MHz RF generators are on, in accordance with an embodiment described in the present disclosure.

FIGS. 19A, 19B, and 19C show embodiments of graphs 328, 333, and 337 to illustrate a correlation, e.g., a linear correlation, etc., between voltage, e.g., peak voltage, etc., that is measured at the output, e.g., the node N1, of the portion 195 (FIG. 1) by using a voltage probe and a voltage, e.g., peak voltage, etc., at a corresponding model node output, e.g., the node N1m, determined using the method 102 (FIG. 2). In each graph 328, 332, and 336, the measured voltage is plotted on a y-axis and the voltage determined using the method 102 is plotted on an x-axis.

Moreover, FIGS. 19A, 19B, and 19C show embodiments of graphs 331, 335, and 338 to illustrate a correlation, e.g., a linear correlation, etc., between wafer bias that is measured at the output N6 (FIG. 1) by using a wafer bias probe and wafer bias at a corresponding model node output, e.g., the node N6m, determined using the method 340 (FIG. 13), the method 351 (FIG. 15), or the method 363 (FIG. 17). In each graph 331, 335, and 338, the wafer bias determined using the wafer bias probe is plotted on a y-axis and the wafer bias determined using the method 340, the method 351, or the method 363 is plotted on an x-axis.

The voltages and wafer bias are plotted in the graphs 328 and 331 when the y MHz and z MHz RF generators are on and the x MHz RF generator is off. Moreover, the voltages and wafer bias are plotted in the graphs 333 and 335 when the x MHz and z MHz RF generators are on and the y MHz RF generator is off. Also, the voltages are plotted in the graphs 337 and 338 when the x MHz and y MHz RF generators are on and the z MHz RF generator is off.

Figure 20A:
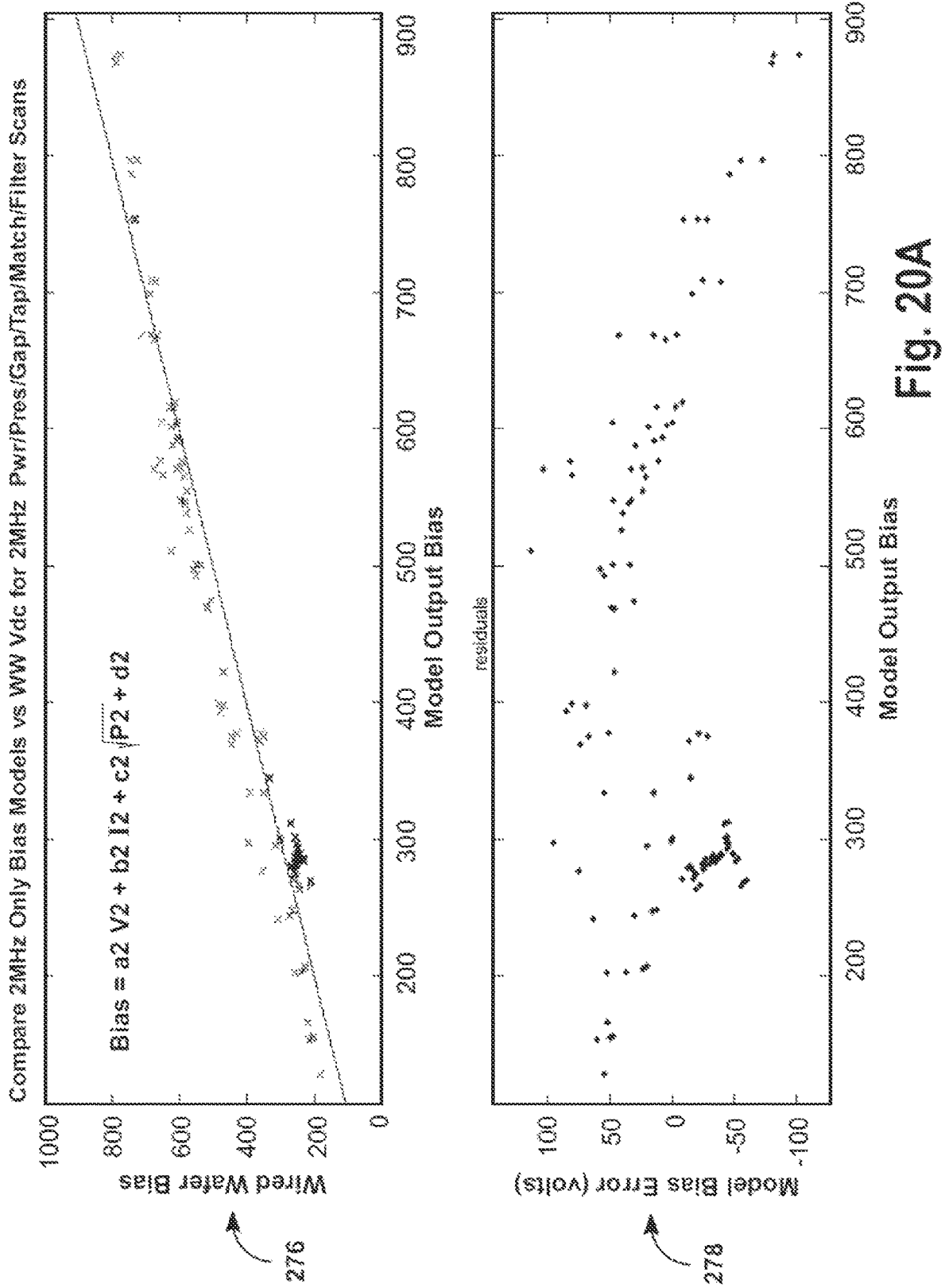
FIG. 20A is a diagram of graphs used to illustrate a correlation between a wired wafer bias measured using a sensor tool, a model wafer bias that is determined using the method of FIG. 13, 15, or 17 and an error in the model bias when the x MHz RF generator is on, in accordance with an embodiment described in the present disclosure.

FIG. 20A is a diagram of an embodiment of graphs 276 and 278 to illustrate that there is a correlation between a wired wafer bias measured using a sensor tool, e.g., a metrology tool, a probe, a sensor, a wafer bias probe, etc., a model wafer bias that is determined using the method 340 (FIG. 13), the method 351 (FIG. 15), or the method 363 (FIG. 17), and an error in the model bias. The wired wafer bias that is plotted in the graph 276 is measured at a point, e.g., a node on the RF transmission line 113, a node on the upper surface 183 (FIG. 1) of the ESC 177, etc. and the model bias that is plotted in the graph 276 is determined at the corresponding model point, e.g., the model node N4m, the model node N1m, the model node N2m, the model node N6m, etc. (FIG. 1), on the path 353 (FIG. 16). The wired wafer bias is plotted along a y-axis in the graph 276 and the model bias is plotted along an x-axis in the graph 276.

The wired wafer bias and the model bias are plotted in the graph 276 when the x MHz RF generator is on, and the y and z MHz RF generators are off. Moreover, the model bias of graph 276 is determined using an equation $a2*V2+b2*I2+c2*sqrt(P2)+d2$, where "*" represents multiplication, "sqrt" represents a square root, "V2" represents voltage at the point along the path 353 (FIG. 16), I2 represents current at the point, P2 represents power at the point, "a2" is a coefficient, "b2" is a coefficient, "c2" is a coefficient, and "d2" is a constant value.

The graph 278 plots an error, which is an error in the model bias at the point, on a y-axis and plots the model bias at the point on an x-axis. The model error is an error, e.g., a variance, a standard deviation, etc., in the model bias. The model error and the model bias are plotted in the graph 278 when the x MHz RF generator is on and the y and z MHz RF generators are off.

Figure 20B:
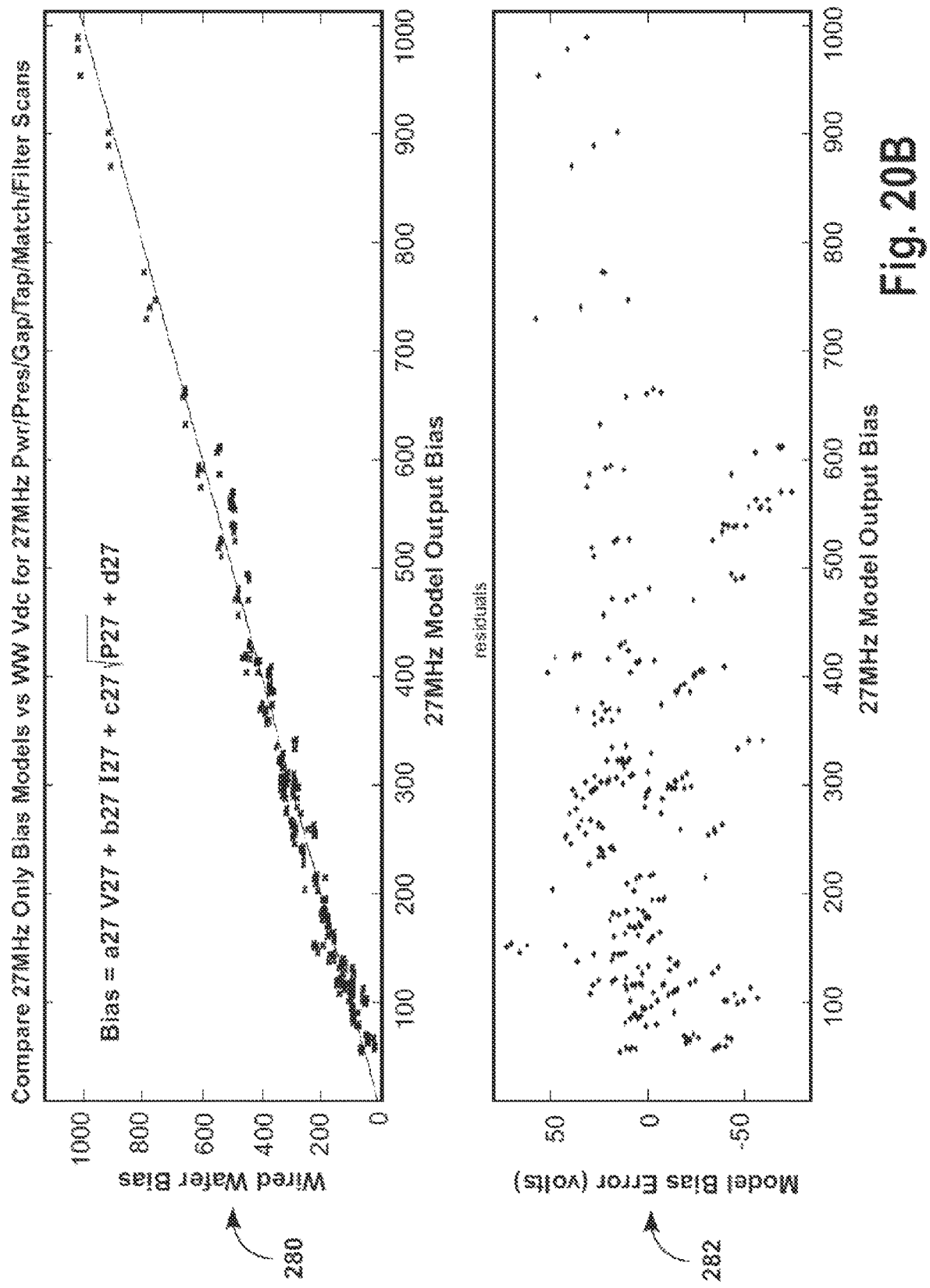
FIG. 20B is a diagram of graphs used to illustrate a correlation between a wired wafer bias measured using a sensor tool, a model bias that is determined using the method of FIG. 13, 15, or 17 and an error in the model bias when the y MHz RF generator is on, in accordance with one embodiment described in the present disclosure.

FIG. 20B is a diagram of an embodiment of graphs 280 and 282 to illustrate that there is a correlation between a wired wafer bias, a model bias that is determined using the method 340 (FIG. 13), the method 351 (FIG. 15) or method 363 (FIG. 17), and an error in the model bias. The graphs 280 and 282 are plotted in a manner similar to the graphs 276 and 278 (FIG. 20A) except that the graphs 280 and 282 are plotted when the y MHz RF generator is on and the x and z MHz RF generators are off. Moreover, the model bias of the graphs 280 and 282 is determined using an equation $a27*V27+b27*I27+c27*sqrt(P27)+d27$, where "V27" represents a voltage magnitude at the point along the path 353 (FIG. 16), "I27" represents a current magnitude at the point, "P27" represents a power magnitude at the point, "a27" is a coefficient, "b27" is a coefficient, "c27" is a coefficient, and "d27" is a constant value.

FIG. 20C is a diagram of an embodiment of graphs 284 and 286 to illustrate that there is a correlation between a wired wafer bias, a model bias that is determined using the method 340 (FIG. 13), the method 351 (FIG. 15) or method 363 (FIG. 17), and an error in the model bias. The graphs 284 and 286 are plotted in a manner similar to the graphs 276 and 278 (FIG. 20A) except that the graphs 284 and 286 are plotted when the z MHz RF generator is on and the x and y MHz RF generators are off. Moreover, the model bias of the graphs 284 and 286 is determined using an equation $a60*V60+b60*I60+c60*sqrt(P60)+d60$, where "V60" represents a voltage magnitude at the point along the path 353 (FIG. 16), "I60" represents a current magnitude at the point, "P60" represents a power magnitude at the point, "a60" is a coefficient, "b60" is a coefficient, "c60" is a coefficient, and "d60" is a constant value.

Figure 20D:
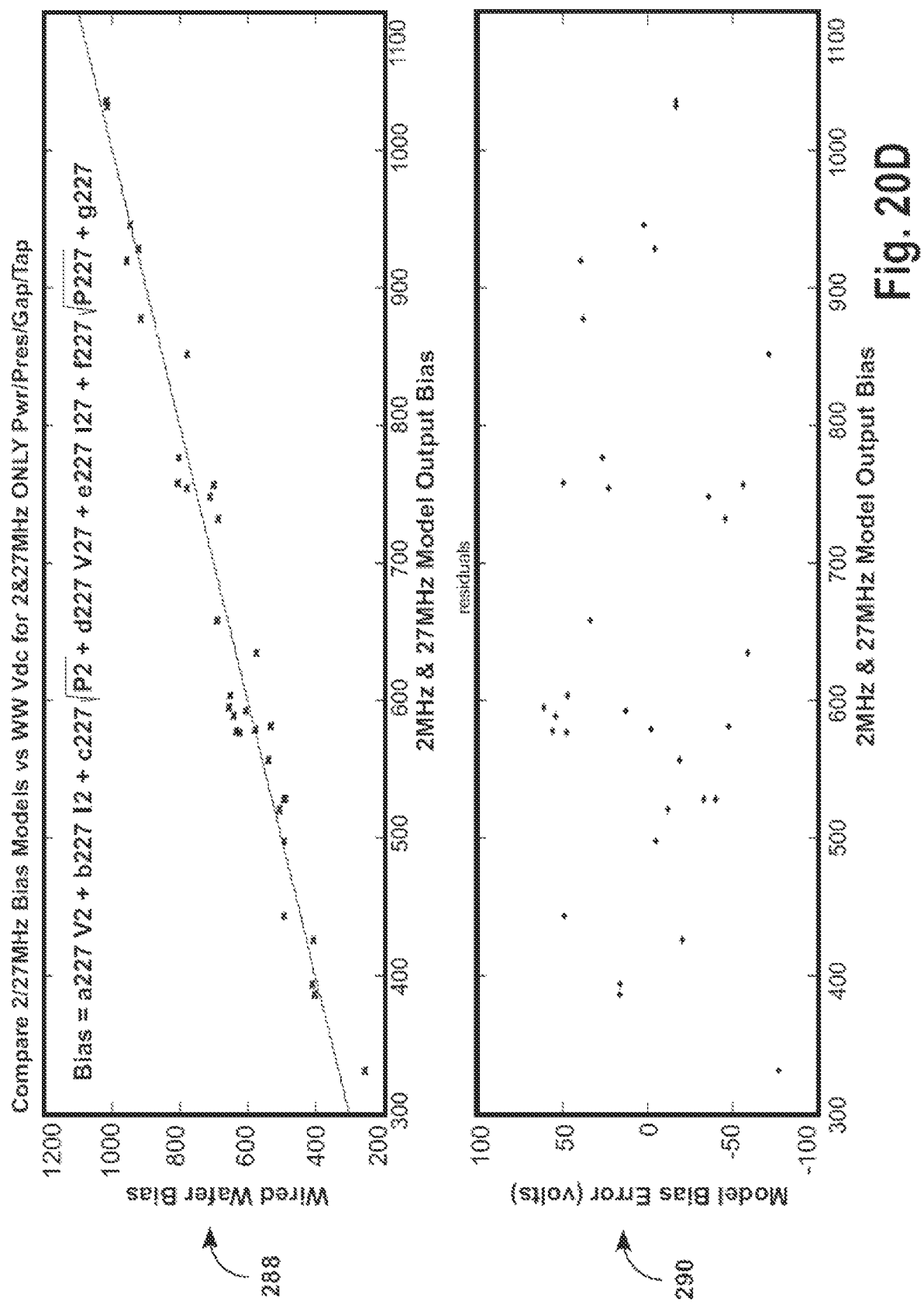
FIG. 20D is a diagram of graphs used to illustrate a correlation between a wired wafer bias measured using a sensor tool, a model bias that is determined using the method of FIG. 13, 15, or 17 and an error in the model bias when the x and y MHz RF generators are on, in accordance with an embodiment described in the present disclosure.

FIG. 20D is a diagram of an embodiment of graphs 288 and 290 to illustrate that there is a correlation between a wired wafer bias, a model bias that is determined using the method 340 (FIG. 13), the method 351 (FIG. 15) or method 363 (FIG. 17), and an error in the model bias. The graphs 288 and 290 are plotted in a manner similar to the graphs 276 and 278 (FIG. 20A) except that the graphs 288 and 290 are plotted when the x and y MHz RF generators are on, and the z MHz RF generator is off. Moreover, the model bias of the graphs 288 and 290 is determined using an equation $a227*V2+b227*I2+c227*sqrt(P2)+d227*V27+e227*I27+f227*sqrt(P27)+g227$, where "a227", "b227" and "c227", "d227", "e227" and "f227" are coefficients, and "g227" is a constant value.

Figure 20E:
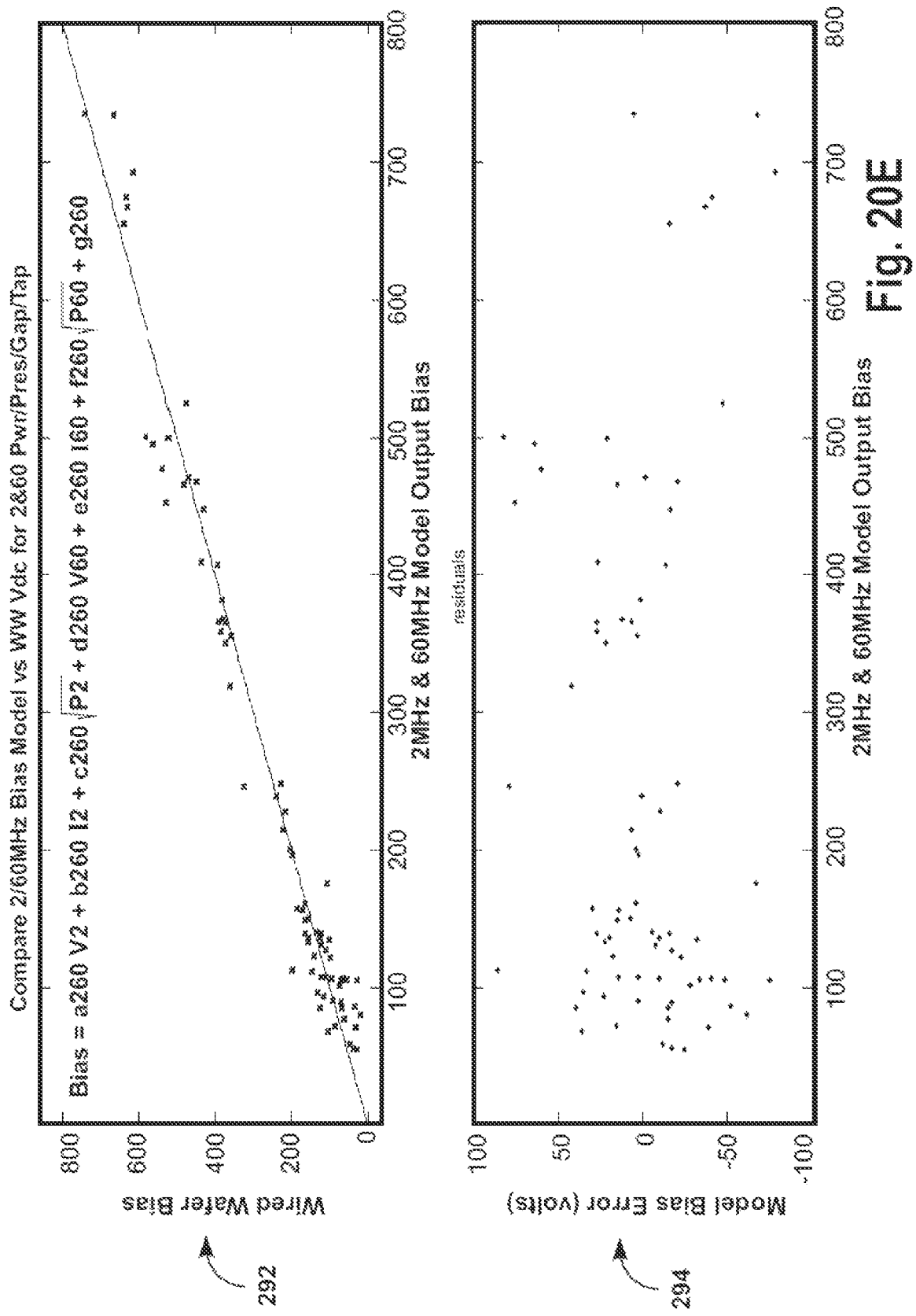
FIG. 20E is a diagram of graphs used to illustrate a correlation between a wired wafer bias measured using a sensor tool, a model bias that is determined using the method of FIG. 13, 15, or 17 and an error in the model bias when the x and z MHz RF generators are on, in accordance with an embodiment described in the present disclosure.

FIG. 20E is a diagram of an embodiment of graphs 292 and 294 to illustrate that there is a correlation between a wired wafer bias, a model bias that is determined using the method 340 (FIG. 13), the method 351 (FIG. 15) or method 363 (FIG. 17), and an error in the model bias. The graphs 292 and 294 are plotted in a manner similar to the graphs 276 and 278 (FIG. 20A) except that the graphs 292 and 294 are plotted when the x and z MHz RF generators are on, and the y MHz RF generator is off. Moreover, the model bias of the graphs 292 and 294 is determined using an equation $a260*V2+b260*I2+c260*sqrt(P2)+d260*V60+e260*I60+f260*sqrt(P60)+g260$, where "a260", "b260" "c260", "d260", "e260" and "f260" are coefficients, and "g260" is a constant value.

Figure 20F:
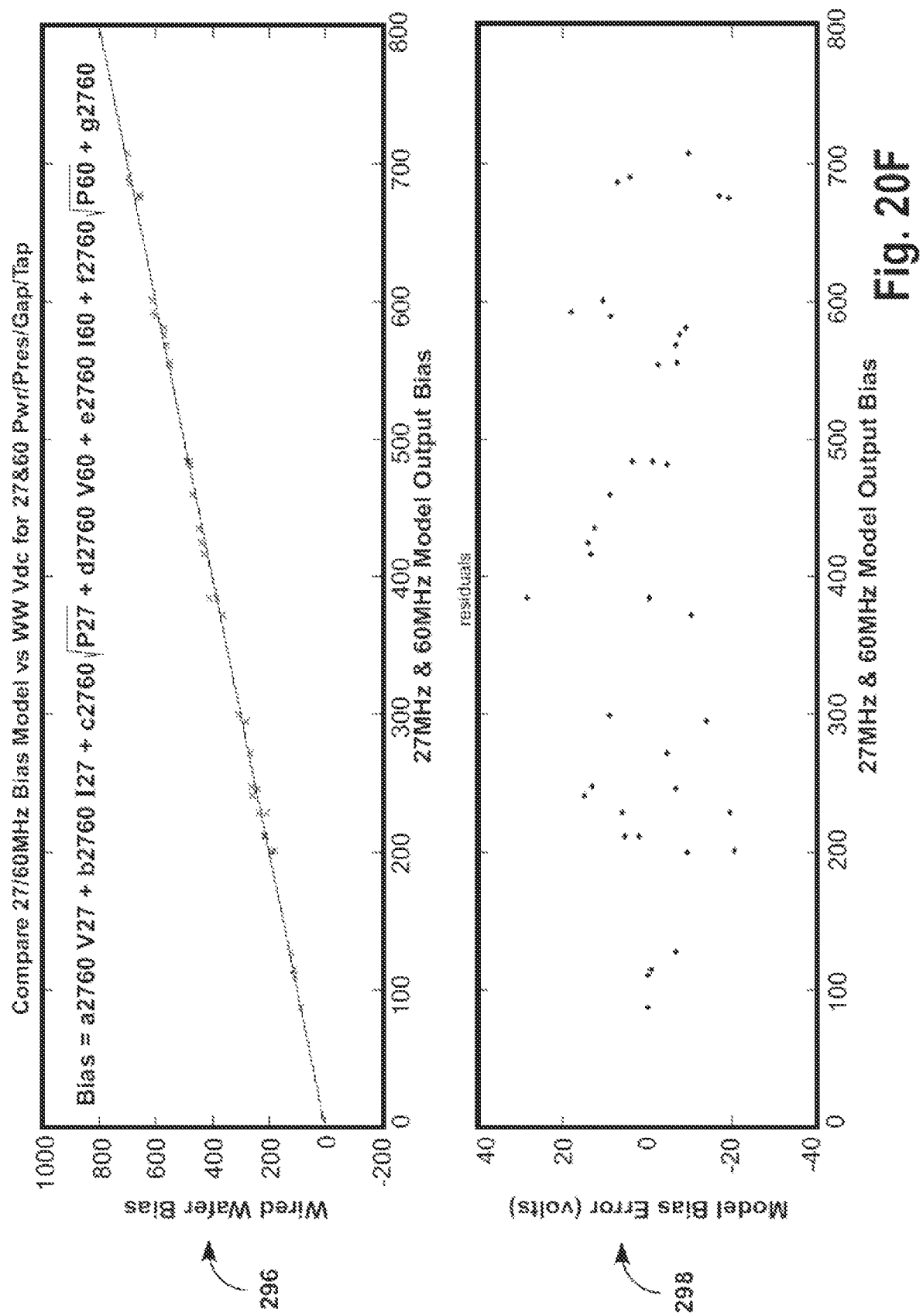
FIG. 20F is a diagram of graphs used to illustrate a correlation between a wired wafer bias measured using a sensor tool, a model bias that is determined using the method of FIG. 13, 15, or 17 and an error in the model bias when the y and z MHz RF generators are on, in accordance with an embodiment described in the present disclosure.

FIG. 20F is a diagram of an embodiment of graphs 296 and 298 to illustrate that there is a correlation between a wired wafer bias, a model bias that is determined using the method 340 (FIG. 13), the method 351 (FIG. 15) or method 363 (FIG. 17), and an error in the model bias. The graphs 296 and 298 are plotted in a manner similar to the graphs 276 and 278 (FIG. 20A) except that the graphs 296 and 298 are plotted when the y and z MHz RF generators are on, and the x MHz RF generator is off. Moreover, the model bias of the graphs 296 and 298 is determined using an equation $a2760*V27+b2760*I27+c2760*sqrt(P27)+d2760*V60+e2760*I60+f2760*sqrt(P60)+g2760$, where "a2760", "b2760" "c2760", "d2760", "e2760" and "f2760" are coefficients, and "g2760" is a constant value.

Figure 20G:
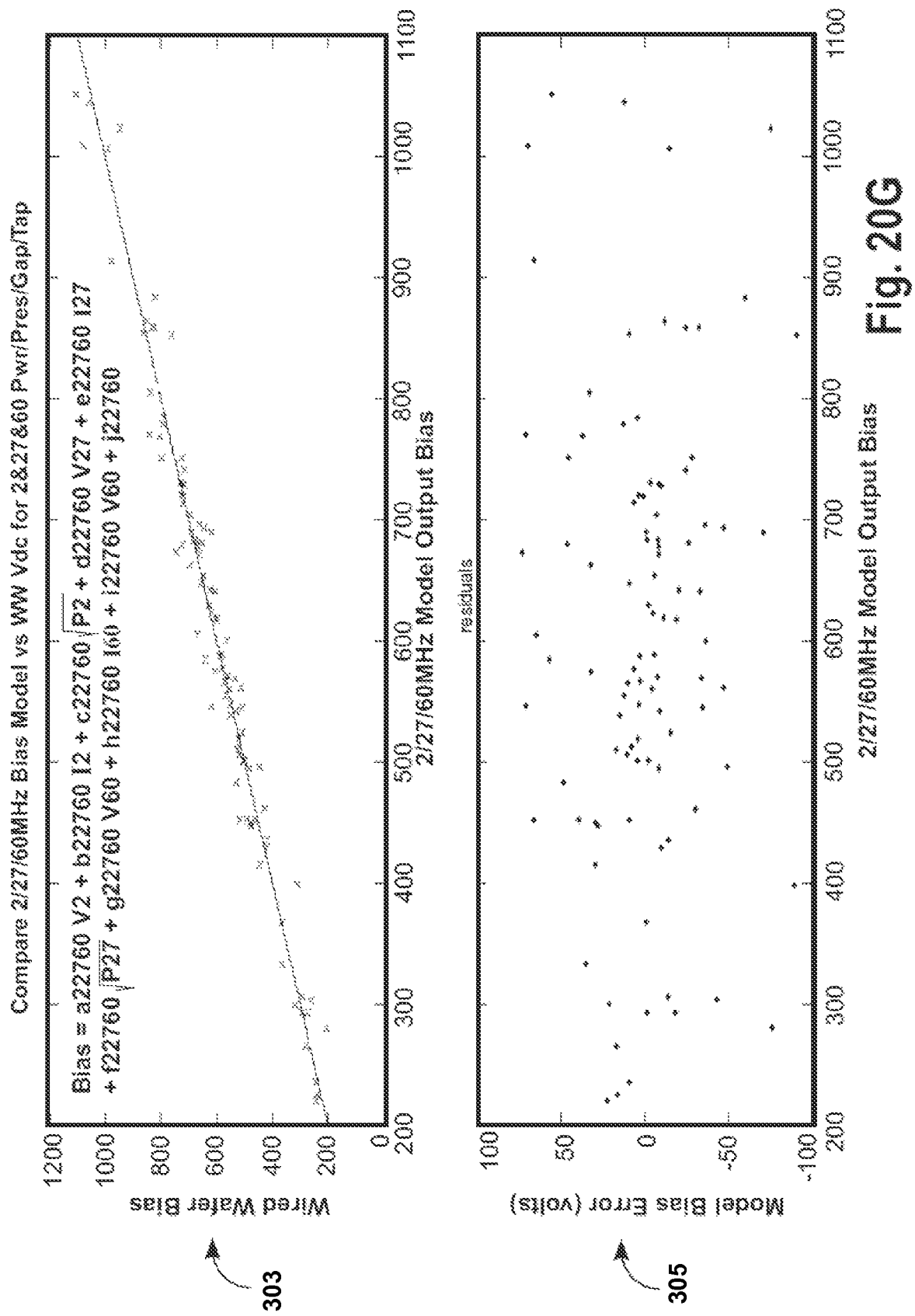
FIG. 20G is a diagram of graphs used to illustrate a correlation between a wired wafer bias measured using a sensor tool, a model bias that is determined using the method of FIG. 13, 15, or 17 and an error in the model bias when the x, y, and z MHz RF generators are on, in accordance with an embodiment described in the present disclosure.

FIG. 20G is a diagram of an embodiment of graphs 303 and 305 is to illustrate that there is a correlation between a wired wafer bias, a model bias that is determined using the method 340 (FIG. 13), the method 351 (FIG. 15) or method 363 (FIG. 17), and an error in the model bias. The graphs 303 and 305 are plotted in a manner similar to the graphs 276 and 278 (FIG. 20A) except that the graphs 303 and 305 are plotted when the x, y and z MHz RF generators are on. Moreover, the model bias of the graphs 303 and 305 is determined using an equation a22760*V2+b22760*I2+c22760*sqrt (P2)+d22760*V60+e22760*I60+f22760*sqrt (P60)+g22760*V27+h22760*I27+i22760*sqrt (P27)+j22760, where "a22760", "b22760", "c22760", "d22760", "e22760", "f22760" "g22760", "h22760", and "i22760" are coefficients and "j22760" is a constant value.

Figure 21:
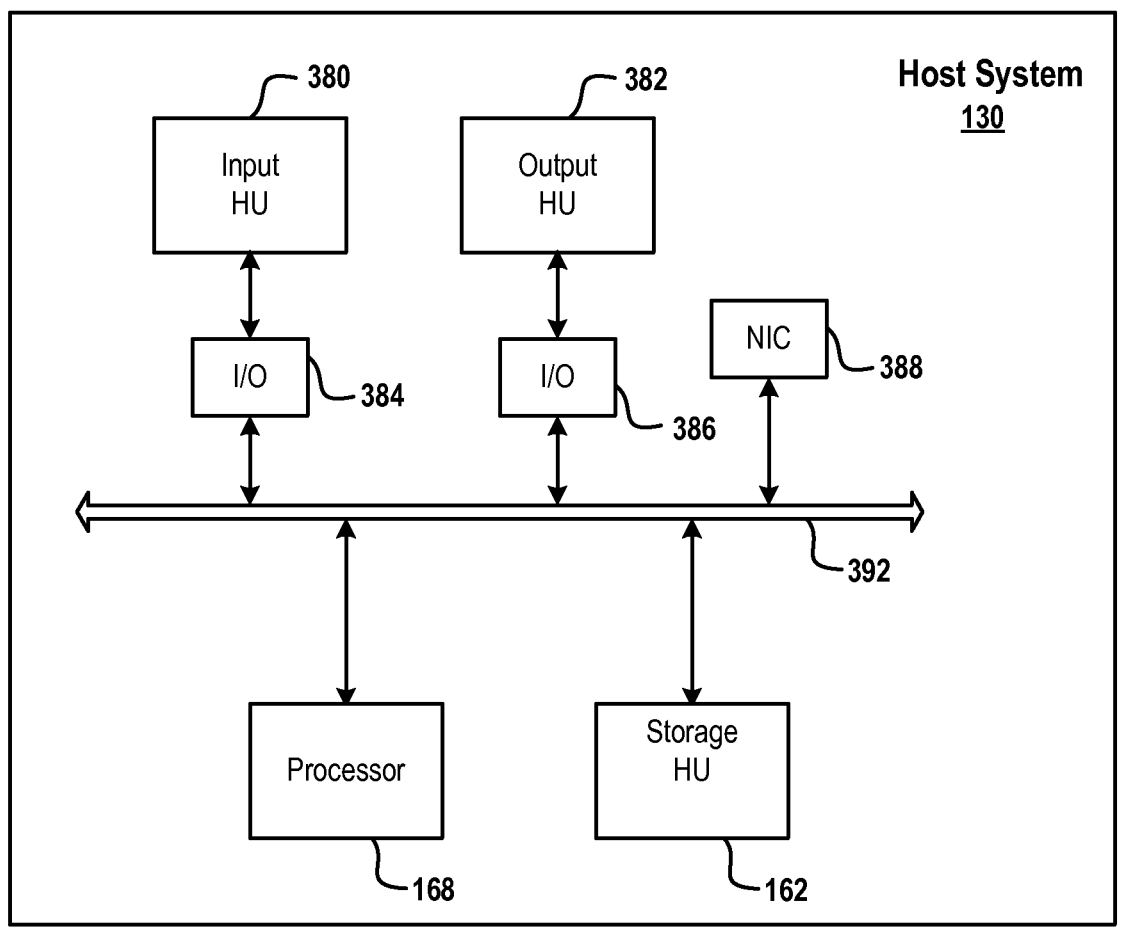
FIG. 21 is a block diagram of a host system of the system of FIG. 1, in accordance with an embodiment described in the present disclosure.

FIG. 21 is a block diagram of an embodiment of the host system 130. The host system 130 includes a processor 168, the storage HU 162, an input HU 380, an output HU 382, an input/output (I/O) interface 384, an I/O interface 386, a network interface controller (NIC) 388, and a bus 392. The processor 168, the storage HU 162, the input HU 380, the output HU 382, the I/O interface 384, the I/O interface 386, and the NIC 388 are coupled with each other via a bus 392. Examples of the input HU 380 include a mouse, a keyboard, a stylus, etc. Examples of the output HU 382 include a display, a speaker, or a combination thereof. The display may be a liquid crystal display, a light emitting diode display, a cathode ray tube, a plasma display, etc. Examples of the NIC 388 include a network interface card, a network adapter, etc.

Examples of an I/O interface include an interface that provides compatibility between pieces of hardware coupled to the interface. For example, the I/O interface 384 converts a signal received from the input HU 380 into a form, amplitude, and/or speed compatible with the bus 392. As another example, the I/O interface 386 converts a signal received from the bus 392 into a form, amplitude, and/or speed compatible with the output HU 382.

Locating Faults Using RF Transmission System Models

An RF transmission system can experience faults due to failed electrical components or failed or missing physical components (e.g., connections, corrosion, insulators). However, specifically identifying the failed component or connection is often difficult without physically moving other components and connections in the RF transmission system. Each time a component is physically moved or replaced or a connection is changed, there is a potential for introducing an additional error, fault or other change in the RF transmission system. Therefore it is important to be able to identify a location of a failed component or connection without disturbing any components or connections not required to assess and access the failed component or connection in the RF transmission system.

Figure 22:
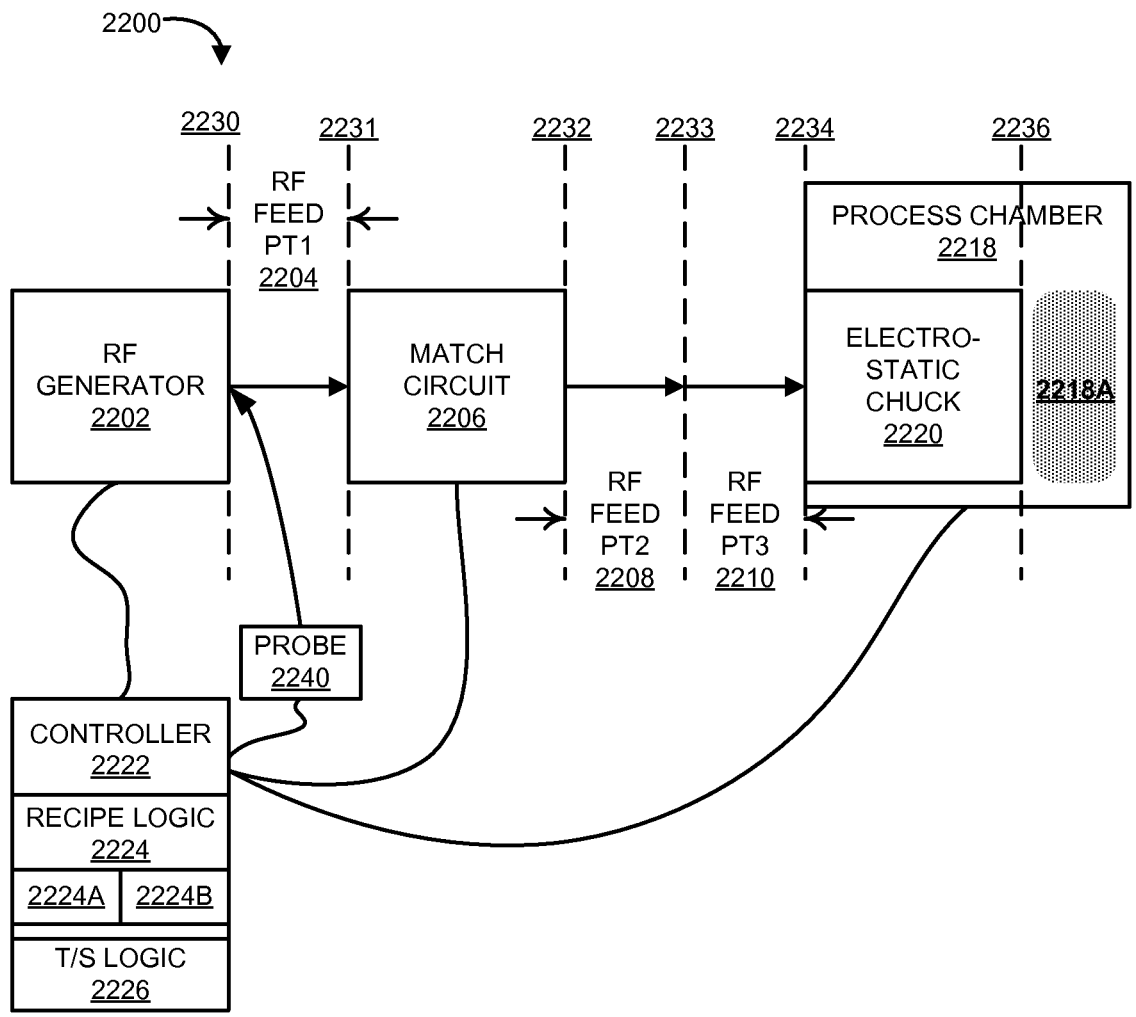
FIG. 22 is a block diagram of an RF transmission system, in accordance with an embodiment described in the present disclosure.

As described above, an RF transmission system can be accurately modeled by running a calibration recipe for the RF transmission system for a process chamber system. FIG. 22 is a block diagram of the RF transmission system 2200, in accordance with an embodiment described in the present disclosure. The RF transmission system 2200 includes one or more RF generators 2202. The respective outputs of the RF generators 2202 are coupled to inputs of corresponding match circuits 2206 by an RF feed part one 2204 (e.g. RF tunnel). The outputs of the match circuit(s) 2206 are coupled by RF feed part two 2208 (e.g., an RF strap) and part three 2210 (e.g., a cylindrical RF feed) to an electrostatic chuck 2220 disposed in the process chamber 2218. A test probe 2240 is often connected to the output of the RF generator 2202 to monitor the output of the RF generator.

A controller 2222 includes recipe logic 2224 including the calibration recipe 2224A and other recipes 2224B for processing wafers in the process chamber 2218. The controller 2222 is coupled to the one or more RF generators 2202 and provides the respective one or more RF control signals to each RF generator. The controller 2222 can also include troubleshooting recipe logic 2226 as will be described in more detail below.

As shown, the RF transmission system 2200 is divided into six stages 2230-2236. Each of the six stages 2230-2236 can, in at least some instances, correspond to test points in the RF transmission system or separate components (e.g., RF generator, 2202, match circuit 2206, RF feed, electrostatic chuck 2220). Alternatively, the stages 2230-2236 can correspond to selected electrical components within one or more of the RF generator, 2202, match circuit 2206, RF feed, electrostatic chuck 2220.

As shown, a first stage includes the RF generator 2202. A second stage begins at first test point at the output 2230 of the RF generator 2202 and includes RF feed part one 2204 (e.g., an RF tunnel) extending to a second test point at the input 2231 of the match circuit 2206. The match circuit 2206 including the internal capacitive and inductive components forms the third stage with a third test point at the output of the match circuit.

A fourth stage of the RF transmission system 2200 begins at the output 2232 of the match circuit 2206 and includes the RF feed part two 2208 (e.g., an RF strap) and continues to a fourth test point 2233 at an intermediate point in the RF feed such as where the RF strap connects to the RF feed part three 2210 (e.g., cylindrical RF feed). A fifth stage begins at the fourth test point 2233 and includes the RF feed part three 2210 (e.g., circumferential RF feed) and continues to a fifth test point at an input 2234 of the electrostatic chuck 2220. The electrostatic chuck 2220 and the components and structures therein forms the sixth stage which ends at the top surface 2236 of the electrostatic chuck.

Various instruments can detect dynamic parameters of the process such as wafer bias voltage. It should be understood that dividing the RF transmission system 2200 into six stages is merely an example for description purposes and the RF transmission system can be divided into more or fewer than six stages. By way of example, the probe 2240 can monitor the output of the RF generator 2202 and couple the measured output to the controller 2222 or other sources such as an external monitoring system (not shown).

Figure 23:
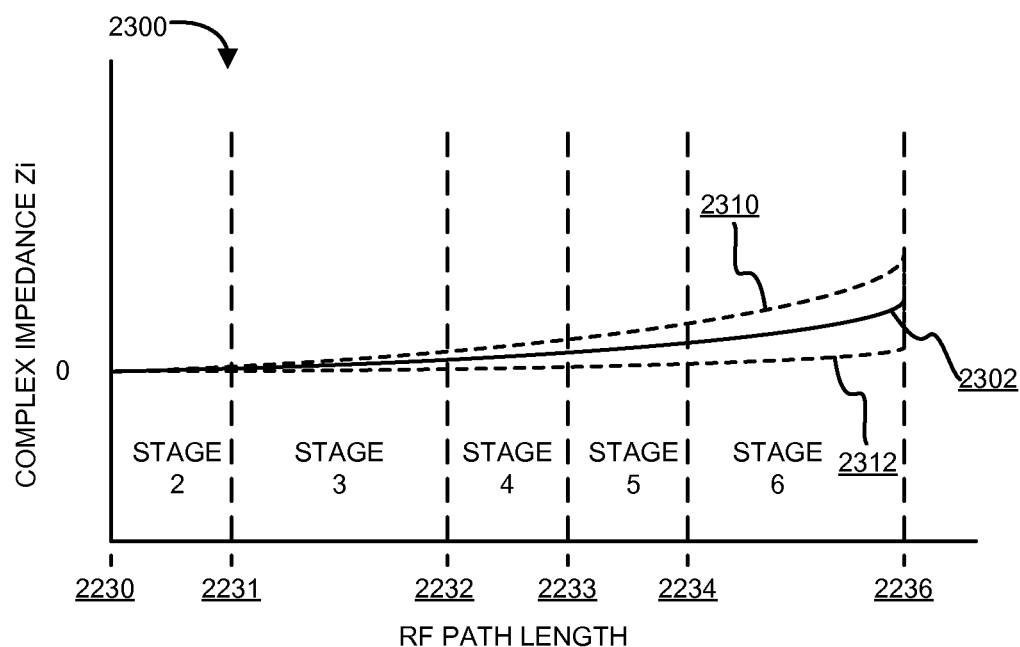
FIG. 23 is an accuracy graph of an RF transmission model of the RF transmission system, in accordance with an embodiment described in the present disclosure.

FIG. 23 is an accuracy graph of an RF transmission model 2300 of the RF transmission system 2200, in accordance with an embodiment described in the present disclosure. The RF transmission model 2300 of the RF transmission system 2200 is calculated as described above. The RF transmission model 2300 can be used to predict the outputs of each of the stages 2230-2236 to within a few percent (e.g., 0 to about +/−3 percent) of what can actually be measured by suitable test equipment. By way of example, line 2302 is a graph of actually measured outputs of each of stages 1-6 when running the calibration recipe 2224A and the system is operating properly (e.g., no faults in stages 1-6). Line 2310 is an upper limit of an acceptable range of RF model and line 2312 is the lower acceptable limit of the range of the RF model and line 2302 is the nominal predicted value at each stage 2230-2236.

The vertical axis of the graph is the complex impedance (Zi), however other parameters such as power, voltage and current could also be detected and/or derived at each test point as discussed in more detail above. The RF transmission model 2300 is extremely accurate at the output of stage 1 and the accuracy of model decreases (e.g., lines 2310 and 2312 diverge) as the number of stages increase because the complexity of calculating the model increases with each stage as the number of electrical and physical components in the RF transmission system 2200 increases.

If a malfunction occurs at within a stage of the RF transmission system 2200 an erroneous output of the malfunctioning stage will diverge from the output predicted by the RF transmission model. The erroneous output is then amplified by each subsequent stage as the erroneous output is propagated through the RF model.

The RF generator 2202 has an operational variation of about 1%. This 1% operational variation is a generally accepted nominal variation. Further, the output of the RF generator 2202 is dynamic in that the output varies with the impedance of the RF transmission path 2200 and the plasma 2218A within the process chamber 2218. By way of example, as the plasma processing within the process chamber 2218 occurs the impedance of the plasma 2218A varies. The RF generator 2202 senses the variation in the downstream impedance and adjusts the output accordingly. Thus, while the RF model 2300 of the RF transmission path 2200 is very precise it allows for the variation due to the dynamics of the over all plasma processing system.

The dynamic variation in the output of the RF generator 2202 is known and the 1% operational tolerance of the output of the RF generator is also known. As a result, the output of the RF generator is not typically viewed as being useful for indicating a fault in the RF transmission path 2200 except for faults that are large enough, or near enough to the output of the RF generator to cause the output to vary greater than the 1% operational tolerance. By way of example, an open or a short to ground in the second stage will cause the output of the RF generator to cause the output to vary much greater than the 1% operational tolerance. A fault located further downstream from the output of the RF generator 2202 may not cause the actual measured output of the RF generator to vary more than the 1% operational tolerance.

The RF models disclosed herein have demonstrated accuracy sufficient to locate faults in the RF transmission path 2200 based on variations in the output of the RF generator 2202 less than the 1% operational tolerance. By way of example, an output variation less than about 0.25% can be used as a variable value input to the RF model 2300 to locate a fault in the RF transmission path 2200. It should be noted that while the output of the RF generator 2202 is discussed in the following examples, the output of any one or more stages 2230-2236 can be selected and used similarly to locate faults between the selected stage(s) and the plasma 2218A (e.g., downstream from the selected stage).

A calibration recipe can be used when a wafer process being applied in the process chamber 2218 begins to produce erroneous results. If the RF transmission system 2200 is properly functioning, the calibration recipe should produce a graph of the RF outputs fitting within the RF transmission model 2300 bounded by lines 2310 and 2312, as shown in FIG. 23. However, if a malfunction occurs within the RF transmission system 2200, such as a failed component or a faulty connection, the calibration recipe produces an output graph that may lie outside the RF transmission model 2300 bounded by lines 2310 and 2312. During the calibration recipe operations, the output of the RF generator 2202 can be measured with the probe 2240 and any deviation from the nominal, expected value can be input to the RF model to determine the location of a fault in the RF transmission path 2200.

Figure 24:
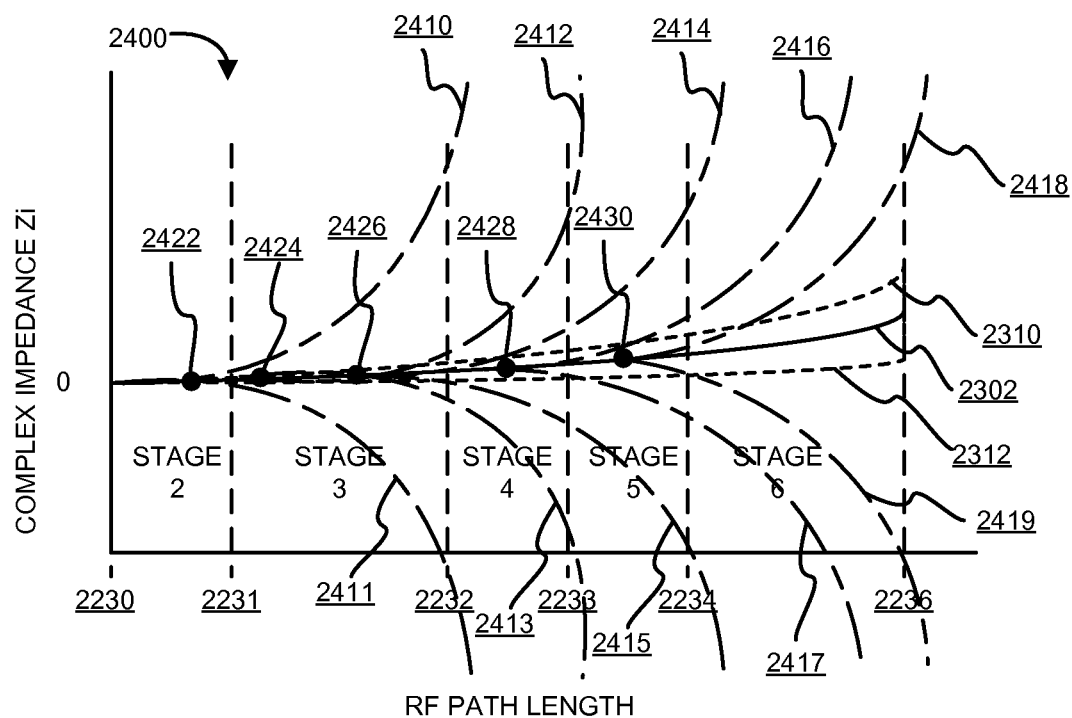
FIG. 24 is an example graph of measured RF outputs of a malfunctioning RF transmission system, in accordance with an embodiment described in the present disclosure.

FIG. 24 is an example graph 2400 of measured RF outputs 2230-2236 of a malfunctioning RF transmission system 2200, in accordance with an embodiment described in the present disclosure. The RF outputs 2230-2236 are shown in complex impedance (Zi) as predicted by the RF model 2300, however, other parameters such as power, voltage and current could also be detected and/or derived at each test point as discussed in more detail above. The curvature of the lines identified by the calibration recipe 2224A begin to diverge from the RF transmission model 2300 at a deflection point substantially corresponding to a physical location of the failed electrical component or faulty physical component (e.g., connection, corrosion, etc.) in the RF transmission system 2200. Such a divergence from the RF transmission model 2300 will be amplified by the model of each subsequent stage in the RF transmission system 2200.

By way of example, an RF signal is output from the RF generator output 2230 and a malfunction occurs in stage 2. One or more parameters of the actual RF signal output at 2231 deflects at a deflection point 2422 and diverges from the RF transmission model 2300 at any value between lines 2410 and 2411. The deflection point 2422 substantially corresponds to a failed component location.

In one example, a fault in the RF transmission path 2200 can result in a measured difference of about +0.22% from the nominal, RF model predicted value of the output of the RF generator 2202. The RF model 2300 mathematically represents the operation of the RF transmission path 2200. Thus, exchanging the value of the nominal, RF model predicted, output of the RF generator 2202 for the actual measured value (e.g., about nominal+0.22%) and recalculating the RF model will result in a fault graph, such as shown by line 2414. Fault graph line 2414 shows where the RF model predicts the calculated value to drastically deviate from the RF model range between lines 2310 and 2312.

Fault graph line 2414 deflects from the RF model 2300 at about deflection point 2426, within stage 3. The actual, measured output of the RF generator 2202 of nominal+ 0.22% during the calibration recipe 2224A indicates a high probability that the failed component is in stage 3. As a result, the technician can focus his repair efforts on stage 3, without disturbing the other stages of the RF transmission path 2200. Similar, measured deviations in the RF output of the RF generator 2202 can be propagated through the RF model to identify corresponding points of deflection 2422-2430 and corresponding fault graph lines 2410-2419 to locate faulty components and connections within the malfunctioning RF transmission path 2200.

Figure 25:
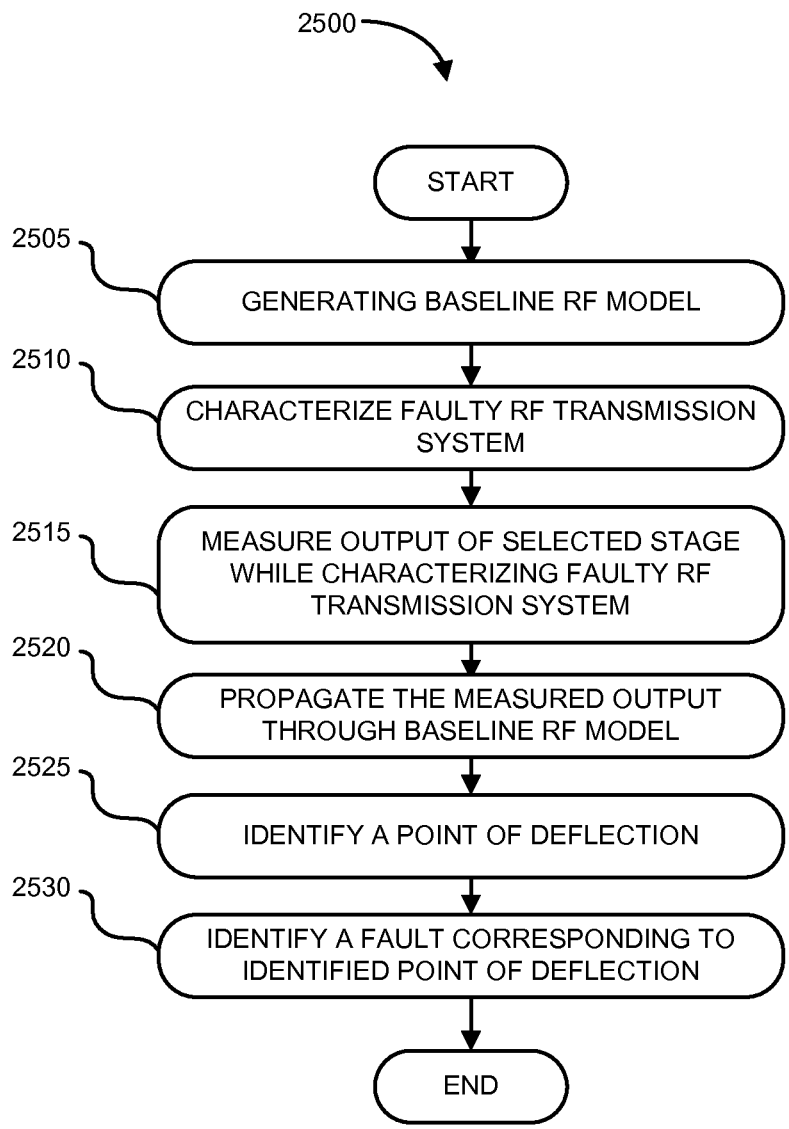
FIG. 25 is a flowchart diagram that illustrates the method operations performed in troubleshooting a malfunctioning RF transmission system, in accordance with an embodiment described in the present disclosure.

FIG. 25 is a flowchart diagram that illustrates the method operations 2500 performed in troubleshooting a malfunctioning RF transmission system 2200, in accordance an embodiment described in the present disclosure. In an operation 2505 the RF transmission system 2200 is characterized by using a calibration recipe to generate a baseline RF model for the RF transmission system such as RF model 2300. By way of example, the baseline characterization RF model 2300 can be generated at startup/installation of the RF transmission system 2200 when the RF transmission system is known to be functioning properly. Alternatively, the baseline RF model 2300 can be based on an ideal set of model values such as from a theoretical ideal RF transmission system having ideal physical components and electrical circuit components operating under ideal conditions. In yet another alternative, the baseline RF model 2300 can be based on a "golden" RF transmission system or other example RF transmission system such as a statistical analysis of multiple RF transmission systems to determine an acceptable range of operating parameters in the multiple RF transmission systems.

The baseline RF model 2300 of the RF transmission system 2200 reflects the normal operating parameters and ranges for a normally functioning RF transmission system. One approach to generating the baseline RF model is to apply a characterization recipe to a test set wafers to be processed within the processing chamber. As the test set of wafers are processed the outputs of one or more, preferably all or most of the stages, are measured and recorded for later use. The baseline RF model can optionally be compared to the actual measurements to confirm the accuracy of the RF model.

The baseline RF model 2300 of the RF transmission system 2200 can be stored for later recall and comparison or other use. The baseline RF model 2300 of the RF transmission system 2200 can be stored within the controller 2222 or in an external database such as may be maintained by the manufacturer.

The process being applied in the process chamber 2218 can eventually experience an error that may be caused by a fault in the RF transmission system 2200. In an operation 2510, the malfunctioning RF transmission system 2200 is characterized by using the calibration recipe. Alternatively, the RF transmission system 2200 can be characterized on demand such as a scheduled period or whenever needed. One approach to characterizing the RF transmission system 2200 is to apply a characterization recipe to a new test set wafers to be processed within the processing chamber. As the new test set of wafers are processed the outputs of at least one of the stages, are measured and recorded in operation 2515. For purposes of discussion the actual output of the RF generator 2202 is measured, however, as discussed above, any one or more stages could be selected to be measured.

In an operation 2520, the actual, measured output of the RF generator 2202 is propagated through the baseline RF model. Propagating the actual, measured output of the RF generator 2202 through the baseline RF model will result in a fault graph 2400 such as shown in FIG. 24 above and having one or more fault lines 2410-2419.

In an operation 2515, the one or more fault lines 2410-2419 are analyzed to determine a corresponding point of deflection 2422-2430. In operation 2530, corresponding point of deflection 2422-2430 substantially identifies the location of the fault in the RF transmission system 2200 and the method operations can end.

In at least one embodiment, the analysis described in method operations 2500 can be embodied in computer readable media such as the troubleshooting logic 2226 in the controller 2222. The controller 2222 can execute the troubleshooting logic 2226 to identify a probably location for the fault in the RF transmission system 2200.

Figure 26:
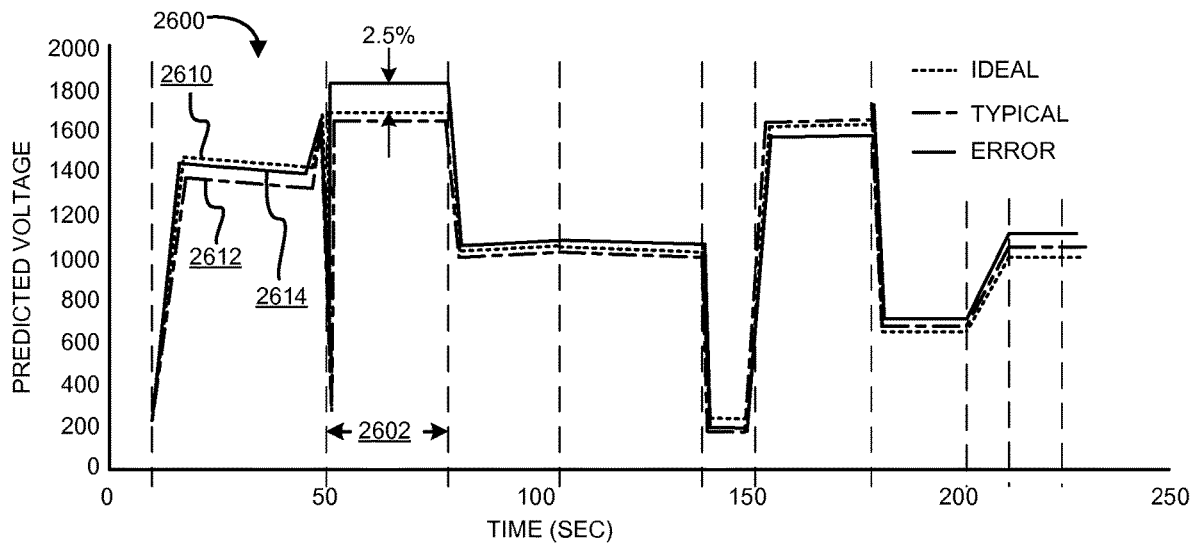
FIG. 26 is a graph of a monitored output of the RF generator during processing in the calibration recipe on an RF transmission system being tested, in accordance with an embodiment described in the present disclosure.

FIG. 26 is a graph 2600 of a monitored output of the RF generator 2202 during processing in the calibration recipe 2224A on an RF transmission system 2200 being tested, in accordance with an embodiment described in the present disclosure. The graph 2600 includes a graph 2610 in the dashed line as the ideal output of the RF generator 2202 during processing of the calibration recipe 2224A such as may be produced by a "golden" RF transmission system 2200. The graph 2600 also includes a graph 2612 in the long and short dashed line as the typical output of the RF generator 2202 during processing in the calibration recipe 2224A such as may be produced by a properly operating, typical RF transmission system 2200. The graph 2600 also includes an error graph 2614 in the solid line as the erroneous output of the RF generator 2202 during processing in the calibration recipe 2224A such as may be produced by a malfunctioning RF transmission system 2200. Note that the differences between graphs 2610, 2612 and 2614 are not to scale and are exaggerated for discussion purposes.

A significant difference of about 2.5 percent is shown between the ideal graph 2610 and the error graph 2614, during a portion 2602 of the calibration recipe 2224A. The 2.5 percent difference falls within a +/−5 percent acceptable range of variation in the output of the RF generator 2202, this 2.5 percent variation can still provide valuable troubleshooting information.

Figure 27:
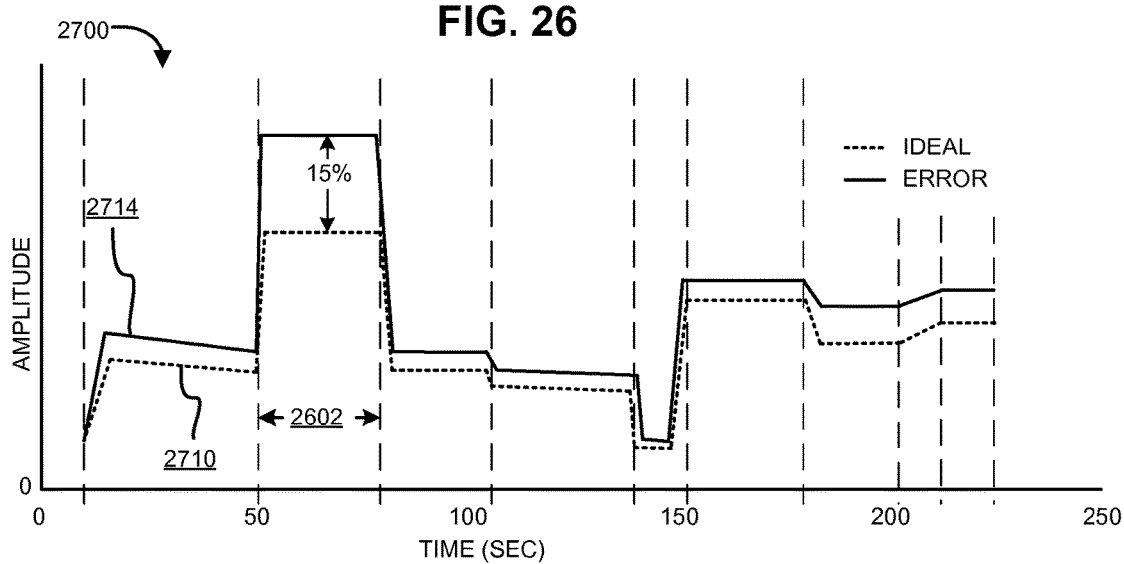
FIG. 27 is a graph of a monitored output of the RF feed part three (e.g., cylindrical RF feed) during processing of the calibration recipe on the RF transmission system being tested, in accordance with an embodiment described in the present disclosure.

FIG. 27 is a graph 2700 of a monitored output of the RF feed part three 2210 (e.g., cylindrical RF feed) during processing of the calibration recipe 2224A on the RF transmission system 2200 being tested, in accordance with an embodiment described in the present disclosure. The graph 2700 also mirrors that of the RF model predicted output of the RF transmission system 2200 being tested, during the calibration recipe 2224A processing.

The graph 2700 a graph 2710 in the dashed line as the ideal output of the RF tunnel 2204 during processing of the calibration recipe 2224A such as may be produced by a "golden" RF transmission system 2200. The graph 2700 also includes an error graph 2714 in the solid line as the erroneous output of the cylindrical RF feed 2210 during processing in the calibration recipe 2224A such as may be produced by a malfunctioning RF transmission system 2200. Note that the differences between graphs 2710 and 2714 are not to scale and are exaggerated for discussion purposes.

A significant difference of about 15 percent is shown between the ideal graph 2710 and the error graph 2714, during the portion 2602 of the calibration recipe 2224A. The 15 percent difference is caused by a fault in the cylindrical RF feed 2210. The 15 percent difference is predicted by the RF model, even though the corresponding 2.5 percent variation in the output of the RF generator 2202, falls within the +/−5 percent acceptable range of variation in the output of the RF generator 2202. Propagating the 2.5 percent variation in the output of the RF generator 2202 through the RF transmission model 2300 predicts the 15 percent difference between the ideal graph 2710 and the error graph 2714, during the portion 2602 of the calibration recipe 2224A. As a result, a test engineer can focus troubleshooting efforts on the cylindrical RF feed 2210.

Figure 28:
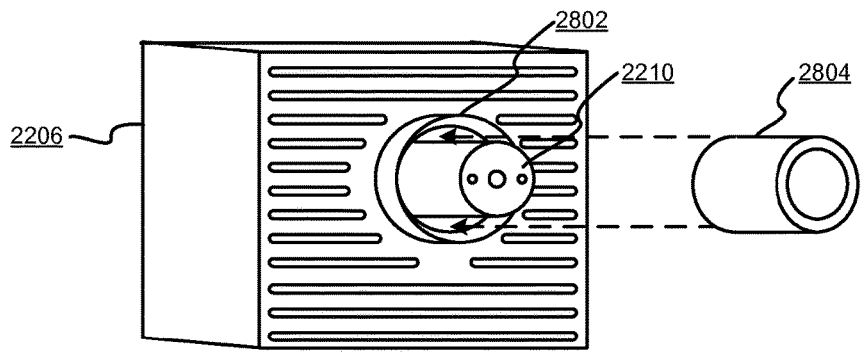
FIG. 28 is a drawing of the cylindrical RF feed portion of the malfunctioning RF transmission system, in accordance with an embodiment described in the present disclosure.

FIG. 28 is a drawing of the cylindrical RF feed 2210 portion of the malfunctioning RF transmission system, in accordance with an embodiment described in the present disclosure. The cylindrical RF feed 2210 forms the output of the match circuit 2206. An RF shield 2802 surrounds the cylindrical RF feed 2210. A solid insulator 2804 between the cylindrical RF feed 2210 and the RF shield 2802 is missing. The solid insulator 2804 has a difference capacitance than the air that is present without the solid insulator, resulting in a different capacitance and a corresponding different impedance in the cylindrical RF feed 2210 resulting in the 15 percent error shown in FIG. 27 above.

It should be noted that in some embodiments, wafer bias is used to determine a clamping voltage that is used to clamp the work piece 131 (FIG. 1) to the ESC 177 (FIG. 1). For example, when wafer bias is absent from the plasma chamber 175 (FIG. 1), two electrodes within the ESC 177 have matching voltages with opposite polarities to clamp the work piece 131 to the ESC 177. In the example, when the wafer bias is present within the plasma chamber 175, voltages supplied to the two electrodes are different in magnitude to compensate for the presence of the wafer bias. In various embodiments, wafer bias is used to compensate for bias at the ESC 177 (FIG. 1).

It is also noted that the use of three parameters, e.g., current magnitude, voltage magnitude, and phase between the current and voltage, etc., to determine wafer bias compared to use of voltage to compensate for bias at the ESC 177 allows better determination of wafer bias. For example, wafer bias calculated using the three parameters has a stronger correlation to non-linear plasma regimes compared to a relation between RF voltage and the non-linear plasma regimes. As another example, wafer bias calculated using the three parameters is more accurate than that determined using a voltage probe.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the x MHz RF generator and the y MHz RF generator are coupled to an inductor within the ICP plasma chamber.

It is also noted that although the operations above are described as being performed by the processor of the host system 130 (FIG. 1), in some embodiments, the operations may be performed by one or more processors of the host system 130 or by multiple processors of multiple host systems.

It should be noted that although the above-described embodiments relate to providing an RF signal to the lower electrode of the ESC 177 (FIGS. 1 and 18) and to the lower electrode of the ESC 192 (FIG. 11), and grounding the upper electrodes 179 and 264 (FIGS. 1 and 11), in several embodiments, the RF signal is provided to the upper electrodes 179 and 264 while the lower electrodes of the ESCs 177 and 192 are grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitorycomputer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations in the flowchart of FIG. 2, FIG. 13, FIG. 15, FIG. 17 and FIG. 25 above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method for locating a fault in a radio frequency (RF) transmission system, the RF transmission system starts from an output of an RF generator and extends to a substrate support of a process chamber, comprising:
 characterizing the RF transmission system into stages, wherein each stage is one or more physical components, the characterizing implements a characterization recipe run when processing a plurality of wafers within a processing chamber and measuring at least one parameter of each of the plurality of stages in the RF transmission system during the processing of the plurality of wafers to produce a baseline model, the baseline model produced when the RF transmission system was known to be functioning properly;
 using the baseline model for identifying a fault stage in the RF transmission system when the RF transmission system is not functioning properly, wherein said identifying the fault stage includes,
  selecting a stage as an initial selected stage from the plurality of stages of the RF transmission system;
  measuring an output of the initial selected stage and one or more additional stages of the plurality of stages in the RF transmission system;
  propagating the measured output of the initial selected stage and one or more additional stages of said plurality of stages through the baseline RF model to produce a resulting RF model; and identifying a point of deflection in the resulting RF model of the RF transmission system, wherein the point of deflection is used to locate the fault stage in the RF transmission system; and wherein the identified point of deflection is used to repair at least one or more of said physical components corresponding to the fault stage of the RF transmission system.

2. The method of claim 1, wherein the physical components are circuit components defined in the RF transmission system, the baseline RF model having an input and an output.

3. The method of claim 1, wherein the baseline RF model is based on electrical components defined in the RF transmission system, the baseline RF model having an input and an output.

4. The method of claim 3, wherein the electrical components of the RF transmission system include capacitors, inductors, or a combination thereof.

5. The method of claim 1, wherein the baseline RF model includes:
a model of an RF transmission line;
a model of impedance matching circuit, the RF transmission line coupled between an output of the RF generator and an input of the impedance matching circuit;
a model of an RF tunnel coupled to the output of the impedance matching circuit;
a model of an RF strap, the RF tunnel model coupled with the RF strap model; and
a model of an electrostatic chuck having an input coupled to the RF strap.

6. The method of claim 5, wherein the electrostatic chuck is included in the processing chamber.

7. The method of claim 1, wherein the RF transmission system is part of a plasma processing system.

8. The method of claim 1, wherein the physical components of the RF transmission system includes a first RF feed between the output of the RF generator, a match circuit, one or more RF feeds between an output of a match, and an electrostatic chuck of the plasma chamber, and said match circuit includes electrical components such one or more capacitors and one or more inductors.

9. A plasma system comprising:
a plasma processing chamber;
an RF transmission system coupled to an RF input of the plasma processing chamber;
an RF generator having an output coupled to the RF transmission system, such that the RF transmission system has a plurality of stages that extend between the output of the RF generator, and extending to the RF input of the plasma processing chamber, wherein each of the stages is one or more physical components; and
a controller coupled to the RF generator and the plasma processing chamber, the controller including logic on non-transitory computer readable media that is executable for identifying a fault in the RF transmission system by selecting two or more of the plurality of stages and propagating a measured output of the selected stage through a baseline RF model of the RF transmission system;
wherein the baseline RF model is a characterized model of the RF transmission system generated when the RF transmission system was known to be functioning without fault, the baseline RF model of the RF transmission system is generated by applying a characterization recipe to process a plurality of wafers within the plasma processing chamber and measuring at least one parameter of an output of the plurality of stages of the RF transmission system during the processing of the plurality of wafers, wherein the controller is configured to measure and compare an output of a stage of the plurality of stages of the RF transmission system to a predicted value for a corresponding stage of the baseline RF model, the comparing used to identify if the fault is associated with the stage, wherein physical components associated with stages with identified faults are identified for repair without disturbing physical components of other stages of the RF transmission system.

10. The plasma system of claim 9, wherein the physical components are based on electrical components defined in the RF transmission system, the baseline RF model having an input and an output.

11. The plasma system of claim 10, wherein the electrical components of the RF transmission system include capacitors, inductors, or a combination thereof.

12. The plasma system of claim 9, wherein the physical components of the RF transmission system includes a first RF feed between the output of the RF generator, a match circuit, one or more RF feeds between an output of a match, and an electrostatic chuck of the plasma chamber, and said match circuit includes electrical components such one or more capacitors and one or more inductors.

13. A method for locating a fault in RF transmission systems, comprising:
characterizing a first RF transmission system having a plurality of physical stages by using a characterization recipe that is executed by processing a plurality of wafers within a processing chamber and measuring at least one parameter of each of the plurality of physical stages in the first RF transmission system during the processing of the plurality of wafers to produce a baseline RF model, the first RF transmission system being a golden RF transmission system identified to be operating properly;
selecting, from a second RF transmission system, a physical stage as an initial physical stage from a plurality of physical stages of the second RF transmission system, the plurality of physical stages of the second RF transmission system extending between an RF generator and extending to a chuck of a second processing chamber;
measuring an output of the initial physical stage of the second RF transmission system;
propagating the output measured from the initial physical stage of the second RF transmission system through the baseline RF model of the first RF transmission system, the propagating is configured to produce a resulting RF model for the second RF transmission system; and
identifying a point of deflection in the resulting RF model, the point of deflection is identified as a deviation from the baseline RF model, and the point in deflection in the resulting RF model identifies a physical fault stage among the plurality of physical stages of the second RF transmission system;
wherein the identified point of deflection is used to repair at least one component associated with the physical fault stage of the second RF transmission system of the second processing chamber.

14. The method of claim 13, wherein the physical stages are based on circuit components defined for the first RF transmission system and the baseline RF model is produced from said measuring of at least one parameter of each of the plurality of physical stages of the first RF transmission system, each of the plurality of physical stages of the first RF transmission system being physical attributes.

15. The method of claim 13, wherein each of the first RF transmission system and the second RF transmission system include,
an output of an RF generator;
an RF transmission line coupled to the RF generator;
an impedance matching circuit coupled to an output of the transmission line;
an RF tunnel coupled to an output of the impedance matching circuit; and
an RF strap for connecting the RF tunnel to an electrostatic chuck of a chamber.

16. The method of claim 15, wherein each of the output of the RF generator, the output of the RF transmission line, the output of the impedance matching circuit, an output of the RF tunnel and an output of the RF strap define specific ones of the plurality of physical stages, respectively, for said first and second RF transmission system.

17. The method of claim 16, wherein said initial physical stage is one of said specific ones of the plurality of physical stages of the second RF transmission system.

18. The method of claim 13, further comprising,
measuring an output of another physical stage of the second RF transmission system;
propagating the output measured from the other physical stage of the second RF transmission system through the baseline RF model of the first RF transmission system, the propagating is configured to produce another resulting RF model for the second RF transmission system; and identifying another point of deflection in the resulting RF model, the other point of deflection is identified as another deviation from the baseline RF model, and the other point in deflection in the other resulting RF model identifies another physical fault stage among the plurality of physical stages of the second RF transmission system.

19. The method of claim 13, further comprising,
measuring an output of one or more other physical stages of the second RF transmission system; and
repeating the propagating and the identifying to find physical fault stages in the second RF transmission system, the physical fault stages being identified for adjustment so that the second RF transmission system can be placed to operate within the baseline RF model.

20. The method of claim 13, wherein the baseline RF model is an RF model of the first RF transmission system generated when the first RF transmission system was known to be functioning properly.

21. The method of claim 13, wherein the plurality of physical stages of the second RF transmission system includes a first RF feed between the output of the RF generator, a match circuit, one or more RF feeds between an output of a match, and the chuck of the second plasma chamber, and said match circuit includes electrical components such one or more capacitors and one or more inductors.

* * * * *